United States Patent
Tokunaga et al.

(10) Patent No.: US 7,831,949 B2
(45) Date of Patent: Nov. 9, 2010

(54) METHOD OF DESIGNING SEMICONDUCTOR INTEGRATED CIRCUIT, DESIGNING APPARATUS, SEMICONDUCTOR INTEGRATED CIRCUIT SYSTEM, SEMICONDUCTOR INTEGRATED CIRCUIT MOUNTING SUBSTRATE, PACKAGE AND SEMICONDUCTOR INTEGRATED CIRCUIT

(75) Inventors: Shinya Tokunaga, Kyoto (JP); Mitsumi Ito, Kyoto (JP); Nobufusa Iwanishi, Osaka (JP); Koichi Seko, Osaka (JP); Hiroaki Suzuki, Hyogo (JP); Hiroyuki Tanaka, Kyoto (JP); Yuichi Nishimura, Hyogo (JP); Kazuhiko Fujimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 418 days.

(21) Appl. No.: 11/819,573

(22) Filed: Jun. 28, 2007

(65) Prior Publication Data

US 2008/0022252 A1    Jan. 24, 2008

(30) Foreign Application Priority Data

Jun. 29, 2006    (JP) .......................... P.2006-180387

(51) Int. Cl.
*G06F 17/50*    (2006.01)
(52) U.S. Cl. ............................................ 716/15; 716/1
(58) Field of Classification Search ........................ None
See application file for complete search history.

(56) References Cited

U.S. PATENT DOCUMENTS

| | | | |
|---|---|---|---|
| 6,429,051 B1 * | 8/2002 | Wood et al. | 438/128 |
| 6,501,166 B2 * | 12/2002 | Wood et al. | 257/691 |
| 6,875,920 B2 | 4/2005 | Nakamura et al. | |
| 6,938,231 B2 | 8/2005 | Yoshida et al. | |
| 7,528,473 B2 * | 5/2009 | Suwa et al. | 257/681 |

FOREIGN PATENT DOCUMENTS

JP    11-353339    12/1999

OTHER PUBLICATIONS

T. Mimura, et al., "High Density Packaging Technology", Matsushita Technical Journal, Feb. 2006, pp. 21-24, vol. 52 No. 1.

* cited by examiner

*Primary Examiner*—Leigh Marie Garbowski
(74) *Attorney, Agent, or Firm*—McDermott Will & Emery LLP

(57) ABSTRACT

To provide a method of designing a semiconductor integrated circuit with a high workability also in an increase in a scale of an LSI and an enhancement in an integration and designing a semiconductor integrated circuit system in which an unnecessary radiation is reduced and which is excellent in a heat characteristic, a reverse design flow to that in the conventional art is implemented, and a mounting substrate such as a printed-circuit board is first designed and a package substrate for mounting an LSI is designed based on a result of the design of the mounting substrate, and a layout design of the LSI to be mounted on the package substrate is then carried out.

41 Claims, 47 Drawing Sheets

FIG. 4(a)   CHIP-1

| padNo | Name | Dir |
|---|---|---|
| 1 | A | I |
| 2 | B | O |
| 3 | C | O |
| 4 | VDD | - |
| 5 | D | I |
| ... | | |

FIG. 4(b)   CHIP-2

| PadNo | Name | Dir |
|---|---|---|
| 1 | H | O |
| 2 | I | I |
| 3 | VSS | - |
| 4 | J | I |
| 5 | K | O |
| ... | | |

FIG. 4(c)   NET LIST

| Net | pad1 | | pad2 | |
|---|---|---|---|---|
| N1 | CHIP-1 | 1 | CHIP-2 | 1 |
| N2 | CHIP-1 | 2 | CHIP-2 | 2 |
| N3 | CHIP-1 | 3 | CHIP-2 | 4 |
| N4 | CHIP-1 | 5 | CHIP-2 | 5 |
| ... | | | | |

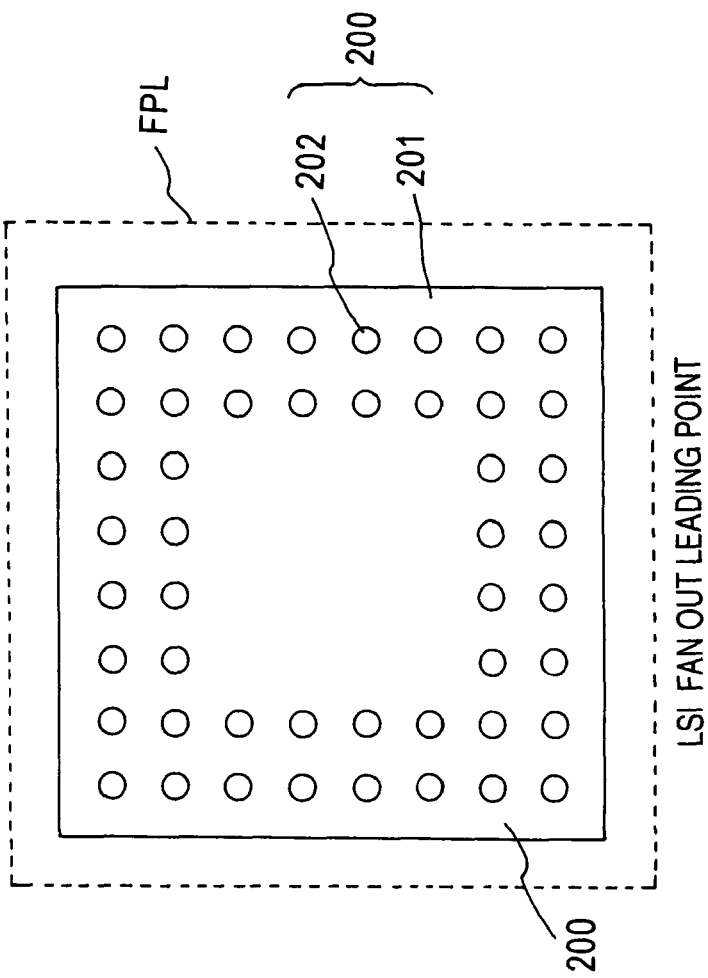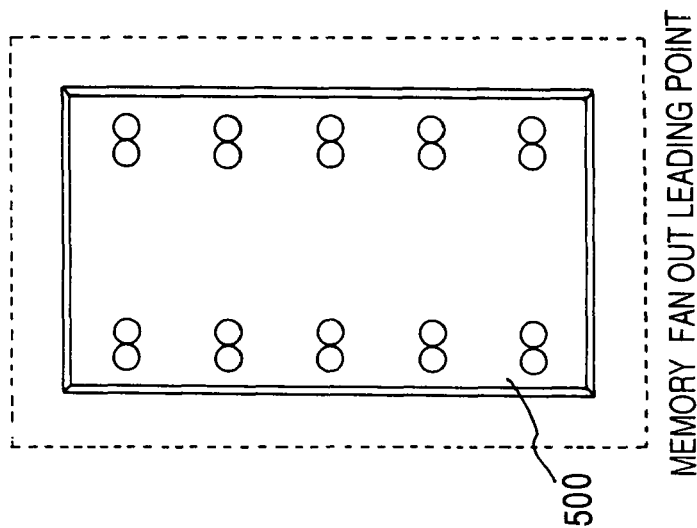

MEMORY FAN OUT LEADING POINT

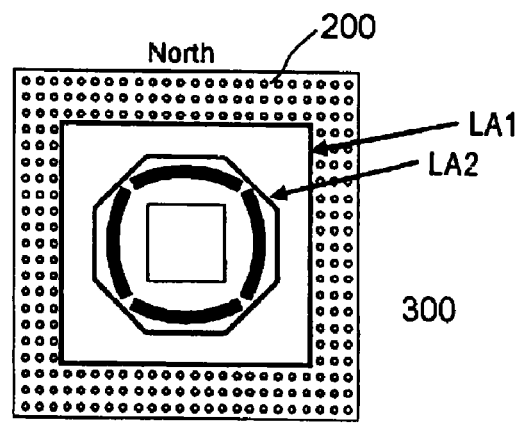
FIG. 22(a)
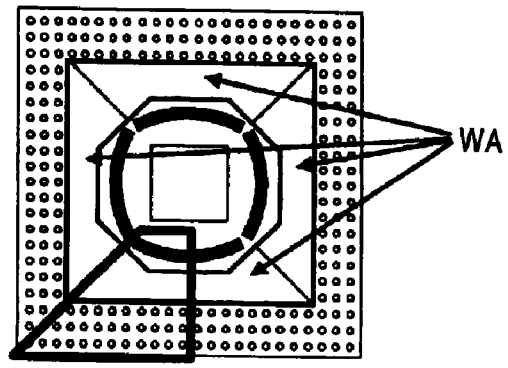
FIG. 22(b)
FIG. 23
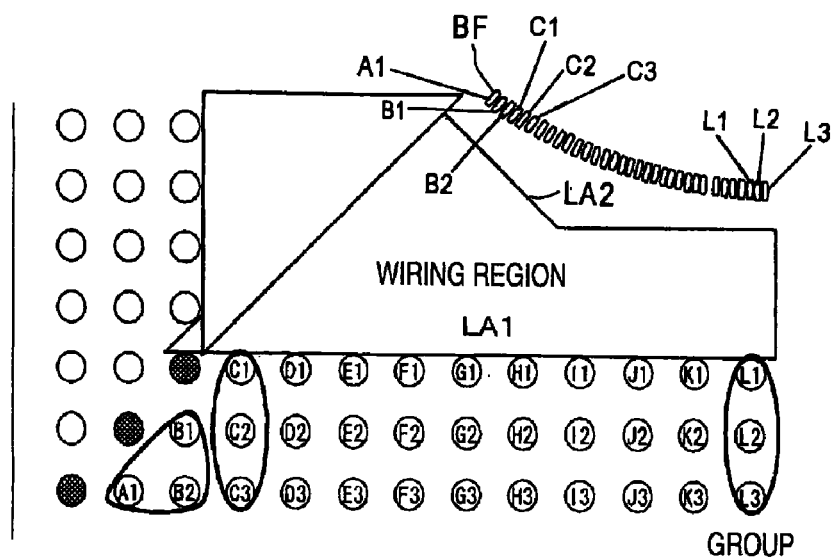

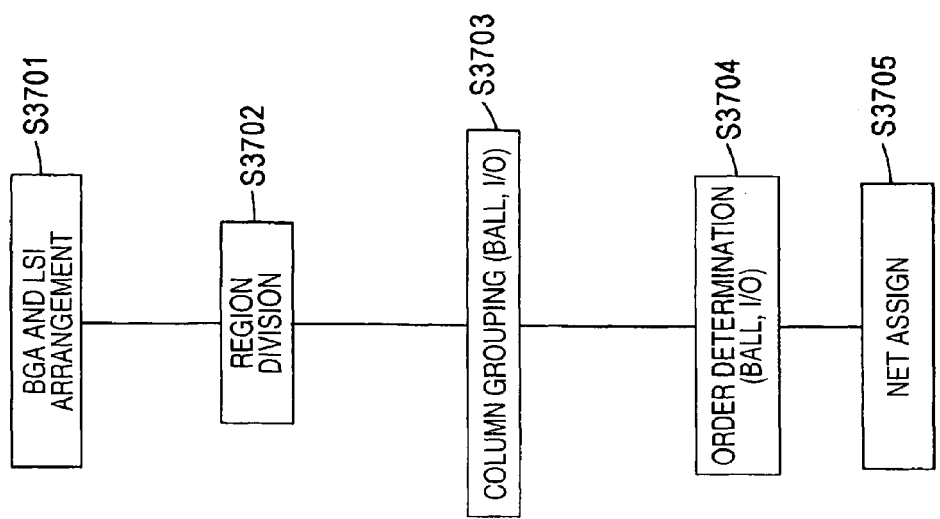
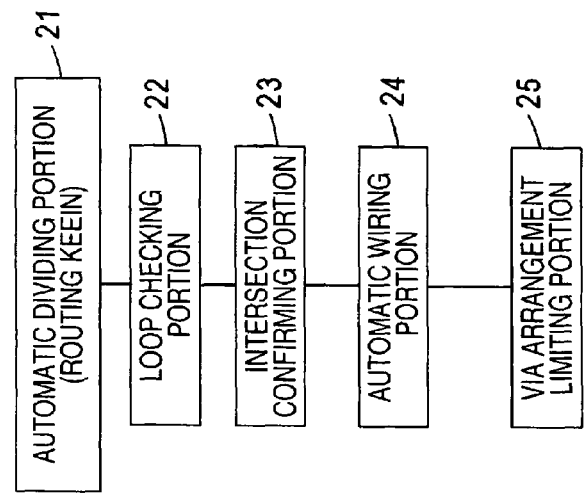

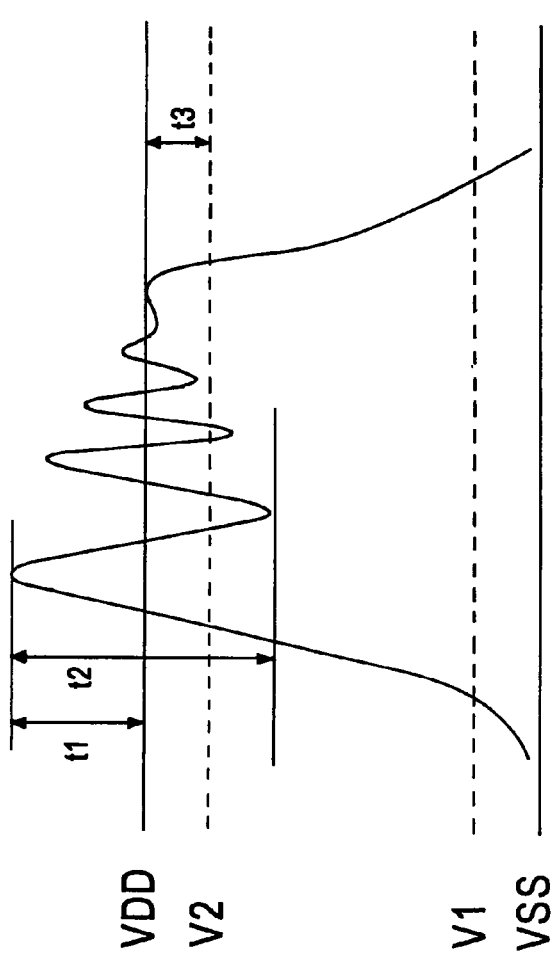
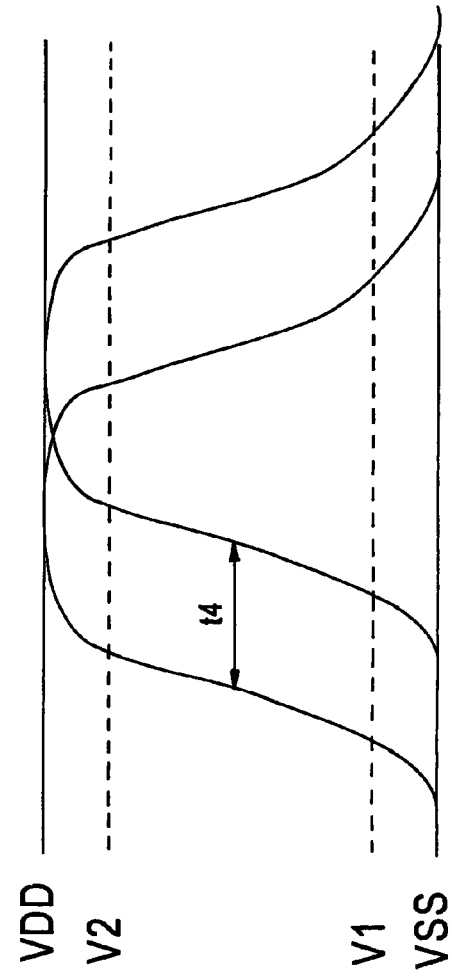
FIG. 51(a)
FIG. 51(b)

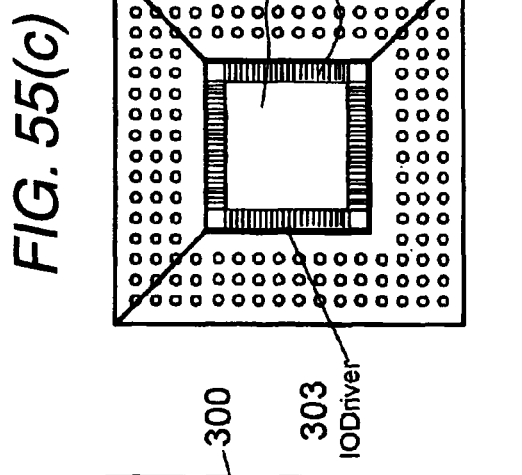
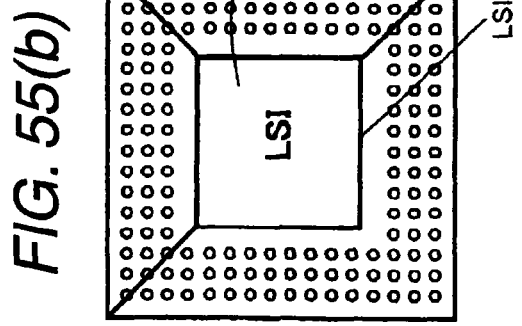
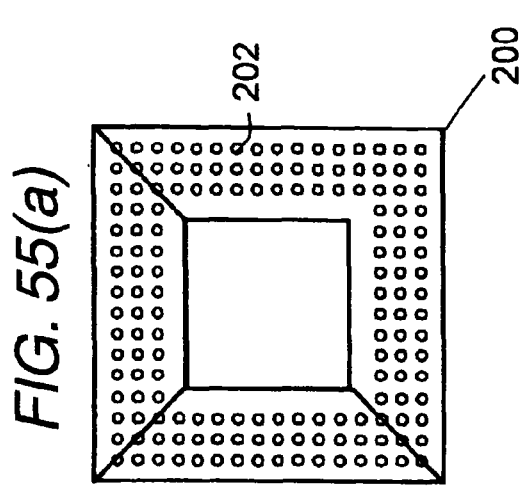
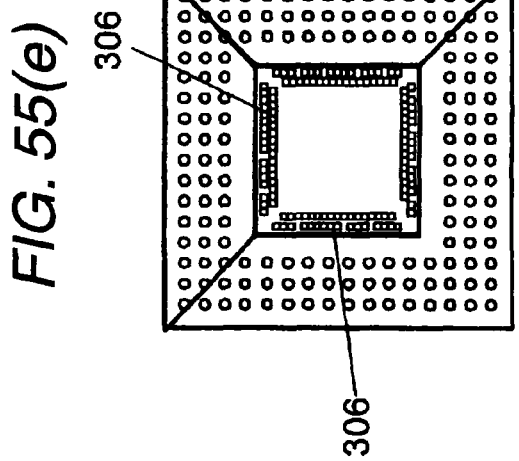
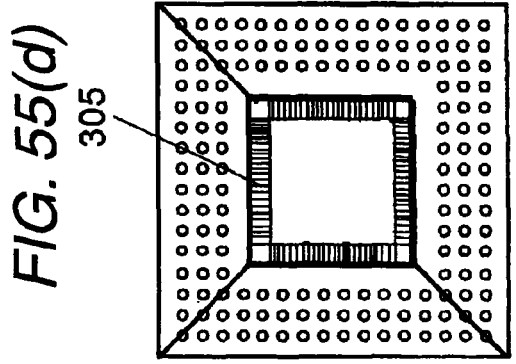

METHOD OF DESIGNING SEMICONDUCTOR INTEGRATED CIRCUIT, DESIGNING APPARATUS, SEMICONDUCTOR INTEGRATED CIRCUIT SYSTEM, SEMICONDUCTOR INTEGRATED CIRCUIT MOUNTING SUBSTRATE, PACKAGE AND SEMICONDUCTOR INTEGRATED CIRCUIT

BACKGROUND OF THE INVENTION

1. Field of the Invention

The present invention relates to a method of designing a semiconductor integrated circuit, a designing apparatus, a semiconductor integrated circuit system, a semiconductor integrated circuit mounting substrate, a package and a semiconductor integrated circuit, and more particularly to a method of designing a semiconductor integrated circuit system which designs a semiconductor integrated circuit and reduces an unnecessary radiation (EMI: Electromagnetic Interference), and furthermore, is excellent in a heat characteristic in consideration of a mounting state based on a result of a design of a mounting substrate constituting the semiconductor integrated circuit system.

2. Description of the Related Art

A semiconductor integrated circuit (LSI) has a utilization range enlarged to communicating apparatuses such as a cell phone, general domestic articles, toys and cars in addition to a computer. On the other hand, however, there is a problem in that an unnecessary radiation generated from these products causes a radio interference of a receiving device such as a television or a radio and a malfunction of other systems. A countermeasure for the whole products, for example, filtering or shielding is also taken against the problem. However, it is hard to take the countermeasure in respect of an increase in the number of components, an increase in a cost and the difficulty of a countermeasure to be taken against the product. In the situations, there has been greatly demanded a noise suppression of an LSI system including an LSI package and a mounting substrate mounting the LSI package.

Under the circumstances, the LSI system is positioned as a key device in each product and an increase in a scale and a speed of the LSI system has been required for maintaining a competitive power of the product. While a product cycle is shortened, it is necessary to automate an LSI system design in order to meet these requirements and various studies have been made.

Under present conditions, however, a design flow is usually determined, that is, an LSI is first designed and a package is designed corresponding to the LSI, and a mounting substrate for mounting the package is then designed. In other words, a layout design of the LSI is first carried out and the package is designed corresponding to the layout design of the LSI. Then, the LSI is disposed on the mounting substrate corresponding to an arrangement of an external connecting terminal of the package and a layout design of a wiring pattern to be connected to the external connecting terminal is carried out.

For example, as shown in FIG. 56, a step (S9001) of investigating a system and a specification is executed and an LSI is then designed based on the specification (S9004), and a step of designing a package (S9003) is thereafter executed corresponding to the layout design of the LSI. Subsequently, an arrangement of the LSI on the mounting substrate and a layout design of a wiring pattern to be connected to an external connecting terminal are executed corresponding to the arrangement of the external connecting terminal of the package (a design of the mounting substrate for mounting the package: S9002).

In the LSI design, there is no information about the design of the package and the mounting substrate. Therefore, a consideration cannot be taken and there is a drawback that an intersection of the wiring on the package substrate is caused and a wiring length is increased. For this reason, in some cases, it is necessary to carry out a feedback, that is, the package designing step (S9003) is executed and an input/output pad (I/O) is then disposed again (S9006), and the processing returns to the LSI designing step (S9004), or the mounting substrate designing step (S9002) is executed and the external connecting terminal of the package is then disposed again (S9007), and the processing returns to the package designing step (S9003).

Therefore, there has been proposed a substrate designing apparatus for analyzing a signal when carrying out a substrate layout design in order to decrease a retracing work such as a revision of a design (Patent Document 1).

Patent Document 1: JP-A-11-353339 Publication

However, an LSI design is also carried out corresponding to the internal condition of an LSI and an arrangement of an I/O terminal is also determined by the apparatus described in the Patent Document 1. In the LSI design, there is no layout information about a mounting substrate. For this reason, it is also hard to carry out a design without a feedback.

A scale and an integration of the LSI are continuously increased. There is a problem in that a circuit design of the LSI becomes complicated, and furthermore, the number of external connecting terminals is increased and it is hard to correspond to a change into a multibit with the increase in the scale and integration of the LSI.

Moreover, an arrangement of a signal wiring becomes complicated. For this reason, there is also a problem in that an unnecessary radiation (EMI) analysis and a thermal analysis become complicated, and it is hard to carry out a perfect automation in an optimization of the design, and a manual correction is required, resulting in an increase in a time required for a development.

SUMMARY OF THE INVENTION

In consideration of the actual conditions, it is an object of the invention to provide a semiconductor integrated circuit system which can design a semiconductor integrated circuit, a package and a mounting substrate with a high workability also in an increase in a scale and an integration of an LSI, can reduce an unnecessary radiation and is excellent in a heat characteristic.

Therefore, the invention is characterized in that a reverse design flow to that in the conventional art is implemented, and a mounting substrate such as a printed-circuit board is first designed and a package substrate mounting an LSI is designed based on a result of the design of the mounting substrate, and a layout design of the LSI to be mounted on the package substrate is then carried out.

For example, a position of an external connecting terminal of the package is investigated based on information about an arrangement of components on the mounting substrate, and an arrangement of an input/output terminal of the LSI is determined in consideration of the position of the external connecting terminal of the package substrate. More specifically, by optimizing the arrangement of the input/output terminal of the LSI based on information about the mounting substrate and the package substrate in place of the internal condition of the LSI, it is possible to execute a whole optimization of the mounting substrate, the package substrate and the LSI.

Moreover, an optimum arrangement of the mounting substrate and a signal wiring of the package substrate are also taken into consideration. Therefore, it is possible to eliminate a drawback such as an intersecting structure or an increase in a wiring length, thereby enhancing quality.

Furthermore, a complicated arrangement of the signal wiring is not generated. Therefore, it is possible to reduce a man-hour and to correspond to an automation.

More specifically, the invention provides a method of designing a semiconductor integrated circuit system comprising the steps of designing a mounting substrate constituting the system based on system specification information, designing a semiconductor integrated circuit package including a package substrate to be mounted on the mounting substrate based on a result of the design obtained at the step of designing a mounting substrate, and designing a semiconductor integrated circuit to be mounted on the semiconductor integrated circuit package in order to determine an I/O terminal position of the semiconductor integrated circuit based on a result-of the design obtained at the step of designing a semiconductor integrated circuit package.

According to the method, in the design of the semiconductor integrated circuit system, first of all, a mounting substrate such as a printed-circuit board is designed, and a design is carried out from a downstream side toward an upstream side, that is, toward the package substrate design and an LSI design therefrom. In the design of the mounting substrate, a rough position of a terminal array of the package is determined by setting, as input data, information such as a result of a component arrangement which is obtained based on the system specification information. Therefore, it is possible to suppress an intersection of a wiring and an increase in a wiring length. Also in an increase in a scale and a speed and a change into a multibit in the semiconductor integrated circuit system, it is possible to reduce the complicated arrangement of the signal wiring. Accordingly, it is possible to easily automate the wiring.

Moreover, the invention provides the method of designing a semiconductor integrated circuit system, wherein the semiconductor integrated circuit package includes a package substrate having a grid array terminal structure in which external connecting terminals are arranged like a grid.

Furthermore, the invention provides the method of designing a semiconductor integrated circuit system, wherein the mounting substrate designing step comprises the steps of dividing, into a plurality of regions, a region including the semiconductor integrated circuit to be a design target and a device which is previously designed therearound, and controlling a wiring in order to complete the wiring in the region.

According to the structure, the wiring is controlled in such a manner that the wiring is completed in the region. Therefore, it is possible to form a semiconductor integrated circuit system which can easily be automated, does not include an intersecting region and can carry out a high speed driving operation.

In addition, the invention provides a method of designing a semiconductor integrated circuit mounting substrate mounting a package substrate loading a semiconductor integrated circuit chip and constituting a desirable system, comprising the step of designing a semiconductor integrated circuit mounting substrate by setting a system specification as input data.

Moreover, the invention provides the method of designing a semiconductor integrated circuit mounting substrate, wherein a mounting substrate having a wiring pattern for connecting a semiconductor integrated circuit (chip) loaded on the package substrate is designed prior to a design of the semiconductor integrated circuit chip.

Furthermore, the invention provides the method of designing a semiconductor integrated circuit mounting substrate, wherein the step of designing a semiconductor integrated circuit mounting substrate determines a virtual wiring leading point in a position placed apart from an outer edge of the package substrate by a predetermined distance and carrying out a design in such a manner that the wiring pattern passes through the wiring leading point.

In addition, the invention provides the method of designing a semiconductor integrated circuit mounting substrate, wherein the step of designing a mounting substrate comprises the step of dividing a region including a semiconductor integrated circuit to be a design target device and a device which is previously designed therearound.

Moreover, the invention provides the method of designing a semiconductor integrated circuit mounting substrate, wherein the step of designing a mounting substrate comprises the step of designing the wiring leading point in such a manner that a line connecting an input/output pad of a semiconductor integrated circuit to be a design target device, an internal connecting terminal for a connection, to the input/output pad, of the package substrate to be connected to the input/output pad, an external connecting terminal to be connected to the mounting substrate of the package substrate, and the wiring leading point does not have an intersecting region.

Furthermore, the invention provides a method of designing a package substrate loading a semiconductor integrated circuit (chip) and constituting a desirable system on a semiconductor integrated circuit mounting substrate, wherein input data at the step of designing a package substrate include a design result of the step of designing a semiconductor integrated circuit mounting substrate.

In addition, the invention provides the method of designing a package substrate, wherein the step of designing a package substrate comprises the step of carrying out a design in such a manner that a wiring constituting a signal group corresponding to the component is arranged in a region divided depending on a position on the semiconductor integrated circuit mounting substrate in which a component is disposed.

By the structure, the wiring constituting the signal group corresponding to the component is disposed in the region divided depending on the position on the semiconductor integrated circuit mounting substrate in which the component is arranged. Therefore, a wiring length can be reduced and a speed can be increased.

Moreover, the invention provides the method of designing a package substrate, wherein the step of designing a package substrate comprises the step of constituting a package substrate which includes at least one power plane and in which the power plane is divided into a plurality of regions for each power unit in order to correspond to a power division on the mounting substrate.

Furthermore, the invention provides the method of designing a package substrate, wherein the step of designing a package substrate comprises the step of connecting, to a power plane, any of a plurality of conductor layers which is positioned on a surface layer mounting an LSI in such a manner that the conductor layer includes a power ring and a wiring in the package substrate does not have an intersecting region through the power ring.

In addition, the invention provides the method of designing a package substrate, wherein the step of designing a package substrate comprises the step of carrying out a design in such a manner that a wiring in the package substrate does not have an intersecting region based on connecting information from a semiconductor integrated circuit to be a target to a peripheral component of the semiconductor integrated circuit.

Moreover, the invention provides the method of designing a package substrate, wherein the step of designing a package substrate comprises the step of carrying out a design in order to divide a plane of the package substrate into N regions and to complete a signal wiring for each of the regions.

Furthermore, the invention provides the method of designing a package substrate, wherein the step of designing a package substrate comprises the step of carrying out a design in such a manner that an external connecting terminal of the package substrate constitutes a ball grid array (BGA) and an external connecting terminal forming plane is divided into N regions, and a signal wiring is completed for each of the regions.

In addition, the invention provides the method of designing a package substrate, wherein the step of designing a package substrate comprises the step of carrying out a design in such a manner that the external connecting terminal forming plane is divided into the N regions and the signal wiring is completed for each of the regions corresponding to an arrangement of a component on the semiconductor integrated circuit mounting substrate.

Moreover, the invention provides the method of designing a package substrate, wherein the N is four.

Furthermore, the invention provides the method of designing a package substrate, wherein the N is eight.

In addition, the invention provides the method of designing a package substrate, wherein the step of designing a package substrate comprises the step of carrying out a design in such a manner that grouping is performed corresponding to an array of the external connecting terminal and a signal wiring is adjacent every group.

More specifically, the signal group is divided into groups depending on the array of the external connecting terminal of the package substrate and the signal wiring is designed adjacently to each group. Consequently, it is possible to easily carry out a swap by only changing a connection in the group.

Moreover, the invention provides the method of designing a package substrate, wherein the step of designing a package substrate comprises the step of carrying out a design in such a manner that a line of the external connecting terminal is connected to an adjacent input/output pad of the semiconductor integrated circuit to be loaded on the package substrate.

Furthermore, the invention provides the method of designing a package substrate, comprising the step of carrying out a design in such a manner that the package substrate includes at least three conductor layers of a surface layer wiring, a power plane layer and a lowermost layer wiring, and the surface layer wiring and the lowermost layer wiring have a formation prohibiting region.

In addition, the invention provides the method of designing a package substrate, further comprising the step of carrying out a design in such a manner that the surface layer wiring and the lowermost layer wiring have a formation prohibiting region having a predetermined width from an end in the divided region.

Moreover, the invention provides a method of designing a semiconductor integrated circuit mounting a semiconductor integrated circuit chip on a package substrate and constituting a desirable system on a semiconductor integrated circuit mounting substrate, wherein the step of designing a semiconductor integrated circuit comprises the step of determining an input/output pad arrangement by setting, as input data, a result of the design obtained at the step of designing a semiconductor integrated circuit mounting substrate.

Furthermore, the invention provides the method of designing a semiconductor integrated circuit, wherein the step of designing a semiconductor integrated circuit comprises the step of carrying out a modification in consideration of an internal condition of an LSI after the step of determining an input/output pad arrangement, and the step of carrying out a modification in consideration of the internal condition of the LSI to be modified.

In addition, the invention provides the method of designing a semiconductor integrated circuit, further comprising the step of designing the arrangement of the input/output pad of the semiconductor integrated circuit corresponding to an arrangement of an external connecting terminal of the package substrate.

Moreover, the invention provides the method of designing a semiconductor integrated circuit, wherein the designing step comprises the step of carrying out a design in such a manner that a line of the external connecting terminal is connected to an adjacent input/output pad of the semiconductor integrated circuit.

Furthermore, the invention provides the method of designing a semiconductor integrated circuit, further comprising the step of designing an arrangement of the input/output pad of the semiconductor integrated circuit corresponding to an arrangement of a component of the semiconductor integrated circuit mounting substrate.

In addition, the invention provides the method of designing a semiconductor integrated circuit, wherein the designing step comprises the step of carrying out a design in such a manner that a wiring from the semiconductor integrated circuit mounting substrate to the input/output pad of the semiconductor integrated circuit does not have an intersecting region.

Moreover, the invention provides the method of designing a semiconductor integrated circuit, further comprising the step of carrying out a design in order to determine a driving capability of an input/output cell to be connected to the input/output pad of the semiconductor integrated circuit corresponding to an arrangement of a component—of the semiconductor—integrated circuit mounting substrate.

In the invention, furthermore, there are provided the steps of designing a mounting substrate constituting the system based on system specification information, designing a semiconductor integrated circuit package including a package substrate to be mounted on the mounting substrate based on a design result obtained at the step of designing a mounting substrate, and designing a semiconductor integrated circuit to be mounted on the semiconductor integrated circuit package in order to determine an I/O terminal position of the semiconductor integrated circuit based on a design result obtained at the step of designing a semiconductor integrated circuit package, wherein the step of designing a mounting substrate serves to carry out a design in consideration of a minimum semiconductor integrated circuit design restriction.

The invention provides an apparatus for designing a semiconductor integrated circuit system comprising a mounting substrate designing portion for designing a mounting substrate constituting the system based on system specification information, a package designing portion for designing a semiconductor integrated circuit package including a package substrate to be mounted on the mounting substrate based on a design result obtained by the mounting substrate designing portion, and a semiconductor integrated circuit designing portion for designing a semiconductor integrated circuit to be mounted on the semiconductor integrated circuit package in order to determine an I/O terminal position of the semiconductor integrated circuit based on a design result obtained by the package designing portion.

The invention provides the apparatus for designing a semiconductor integrated circuit system, wherein the semiconductor integrated circuit package includes a semiconductor integrated circuit package having a grid array terminal structure in which external connecting terminals are arranged like a grid.

Furthermore, the invention provides the apparatus for designing a semiconductor integrated circuit system, wherein the mounting substrate designating portion includes a region dividing portion for dividing, into a plurality of regions, a region including the semiconductor integrated circuit to be a design target and a device which is previously designed therearound, and a wiring control portion for controlling a wiring in such a manner that a wiring is completed in a region divided by the region dividing portion.

In addition, the invention provides an apparatus for designing a semiconductor integrated circuit mounting substrate mounting a package substrate loading a semiconductor integrated circuit and constituting a desirable system, comprising a mounting substrate designing portion for designing a semiconductor integrated circuit mounting substrate by setting a system specification as input data.

Moreover, the invention provides the apparatus for designing a semiconductor integrated circuit mounting substrate, wherein the mounting substrate designing portion includes a semiconductor integrated circuit mounting substrate constituted to use, as input data, system specification information which does not include design information of a semiconductor integrated circuit chip.

In the invention, furthermore, the mounting substrate designing portion includes a designing portion for determining a virtual wiring leading point in a position placed apart from an outer edge of the package substrate by a predetermined distance and carrying out a design in such a manner that the wiring pattern passes through the wiring leading point.

In addition, the invention provides the apparatus for designing a semiconductor integrated circuit mounting substrate, wherein the mounting substrate designing portion includes a dividing control portion for dividing a region including a semiconductor integrated circuit to be a design target device and a device which is previously designed therearound, and a control portion for carrying out a control to complete a wiring in the divided region.

Moreover, the invention provides the apparatus for designing a semiconductor integrated circuit mounting substrate, wherein the mounting substrate designing portion includes an intersecting control portion for designing a wiring leading point in such a manner that a line connecting an input/output pad of a semiconductor integrated circuit to be a design target device, an internal connecting terminal for a connection, to the input/output pad, of the package substrate to be connected to the input/output pad, an external connecting terminal to be connected to the mounting substrate of the package substrate, and the wiring leading point does not have an intersecting region.

In addition, the invention provides an apparatus for designing a package substrate loading a semiconductor integrated circuit chip and constituting a desirable system on a semiconductor integrated circuit mounting substrate, wherein input data of the package substrate designing apparatus include a design result of the semiconductor integrated circuit mounting substrate designing portion.

Moreover, the invention provides the apparatus for designing a package substrate, further comprising a dividing control portion for carrying out a division every signal group in such a manner that a wiring constituting a signal group corresponding to the component is disposed in a divided region depending on a position on the semiconductor integrated circuit mounting substrate in which a component is arranged.

Furthermore, the invention provides the apparatus for designing a package substrate, wherein the dividing control portion carries out a design to divide a plane of the package substrate into N regions and to complete a signal wiring for each of the regions.

In addition, the invention provides the apparatus for designing a package substrate, wherein the dividing control portion carries out a design in such a manner that an external connecting terminal of the package substrate constitutes a ball grid array, and an external connecting terminal forming plane is divided into N regions and a signal wiring is completed for each of the regions.

Moreover, the invention provides the apparatus for designing a package substrate, wherein the dividing control portion carries out a design to divide the external connecting terminal forming plane into the N regions and to complete the signal wiring for each of the regions corresponding to an arrangement of a component on the semiconductor integrated circuit mounting substrate.

Furthermore, the invention provides the apparatus for designing a package substrate, wherein the N is four.

In addition, the invention provides the apparatus for designing a package substrate, wherein the N is eight.

Moreover, the invention provides the apparatus for designing a package substrate, wherein the dividing control portion has such a structure that grouping is performed corresponding to an array of the external connecting terminal and a signal wiring is adjacent every group.

Furthermore, the invention provides the apparatus for designing a package substrate, wherein the dividing control portion has such a structure that a line of the external connecting terminal is connected to an adjacent input/output pad of the semiconductor integrated circuit to be loaded on the package substrate.

In addition, the invention provides the apparatus for designing a package substrate, wherein the package substrate includes at least one power plane and a power plane dividing portion for dividing the power plane into a plurality of regions for each power unit in order to correspond to a power division on the mounting substrate.

Moreover, the invention provides the apparatus for designing a package substrate, further comprising a power control portion in which any of the conductor layers which is positioned on a surface layer mounting an LSI includes a power ring and a wiring in the package substrate is connected to the power plane through the power ring so as not to have an intersecting region.

Furthermore, the invention provides the apparatus for designing a package substrate, wherein a connection is included in such a manner that a wiring in the package substrate does not have an intersecting region based on connecting information from a semiconductor integrated circuit to be a target to a peripheral component of the semiconductor integrated circuit.

In addition, the invention provides the apparatus for designing a package substrate, further comprising a dividing control portion for carrying out a design to divide a plane of the package substrate into four regions and to complete a signal wiring for each of the regions.

Moreover, the invention provides the apparatus for designing a package substrate, further comprising a dividing control portion for carrying out a design in such a manner that an external connecting terminal of the package substrate constitutes a ball grid array, an external connecting terminal forming plane is divided into four regions and a signal wiring is completed for each of the regions.

Furthermore, the invention provides the apparatus for designing a package substrate, further comprising a dividing control portion for carrying out a design to divide a plane of the package substrate into eight regions and to complete a signal wiring for each of the regions.

Moreover, the invention provides the apparatus for designing a package substrate, further comprising a dividing control portion for carrying out a design in such a manner that an external connecting terminal of the package substrate constitutes a ball grid array, an external connecting terminal forming plane is divided into eight regions and a signal wiring is completed for each of the regions.

Moreover, the invention provides the apparatus for designing a package substrate, further comprising a signal group dividing control portion for carrying out a design in such a manner that the signal group is divided every region.

Furthermore, the invention provides the apparatus for designing a package substrate, wherein the package substrate includes at least three conductor layers of a surface layer wiring, a power plane layer and a lowermost layer wiring, and the surface layer wiring and the lowermost layer wiring include a wiring control portion for carrying out a control to have a formation prohibiting region.

In addition, the invention provides the apparatus for designing a package substrate, wherein the wiring control portion serves to carry out a control in such a manner that the surface layer wiring and the lowermost layer wiring have a formation prohibiting region having a predetermined width from an end in the divided region.

Moreover, the invention provides an apparatus for designing a semiconductor integrated circuit mounting a semiconductor integrated circuit on a package substrate and constituting a desirable system on a semiconductor integrated circuit mounting substrate, comprising a data input portion for determining an input/output pad arrangement by setting a design result of a semiconductor integrated circuit mounting substrate as input data.

Furthermore, the invention provides the apparatus for designing a semiconductor integrated circuit, further comprising an internal condition considering portion for determining an input/output pad arrangement by setting the design result of the semiconductor integrated circuit mounting substrate as input data and carrying out a modification in consideration of an internal condition of an LSI, and a correcting portion for correcting the input/output pad arrangement by setting an output of the modifying portion as input data.

In addition, the invention provides the apparatus for designing a semiconductor integrated circuit, further comprising an input/output pad arranging portion for designing the arrangement of the input/output pad of the semiconductor integrated circuit corresponding to an arrangement of an external connecting terminal of the package substrate.

Moreover, the invention provides the apparatus for designing a semiconductor integrated circuit, further comprising an input/output pad arranging portion for designing the arrangement of the input/output pad of the semiconductor integrated circuit corresponding to an arrangement of a component of the semiconductor integrated circuit mounting substrate.

Furthermore, the invention provides the apparatus for designing a semiconductor integrated circuit, further comprising an input/output cell designing portion for determining a driving capability of an input/output cell to be connected to the input/output pad of the semiconductor integrated circuit corresponding to an arrangement of a component of the semiconductor integrated circuit mounting substrate.

In addition, the invention provides an apparatus for designing a semiconductor integrated circuit system comprising a mounting substrate designing portion for designing a mounting substrate constituting the system based on system specification information, a package designing portion for designing a semiconductor integrated circuit (LSI) package including a package substrate to be mounted on the mounting substrate based on a design result obtained by the mounting substrate designing portion, and a semiconductor integrated circuit designing portion for designing a semiconductor integrated circuit to be mounted on the semiconductor integrated circuit package in order to determine an I/O terminal position of the semiconductor integrated circuit based on a design result obtained by the semiconductor integrated circuit package designing portion, wherein the mounting substrate designing portion has such a structure as to carry out a design in consideration of a minimum semiconductor integrated circuit design restriction.

Moreover, the invention provides a semiconductor integrated circuit system in which a semiconductor integrated circuit mounted on a package substrate is loaded on a mounting substrate having a wiring formed thereon together with an electronic component and a circuit connection is thus carried out, wherein an external connecting terminal of the package substrate to be connected to a wiring on the mounting substrate from the wiring and a conductive path reaching an input/output pad of the semiconductor integrated circuit through the wiring of the package substrate are constituted so as not to have an intersecting region.

In the invention, furthermore, a wiring on the mounting substrate is straight and parallel in such a manner that almost mutual intervals are almost constant in a region having a predetermined width from an outer edge of the package substrate of the semiconductor integrated circuit, and is disposed irregularly on an outside of the region.

In addition, the invention provides a semiconductor integrated circuit mounting substrate comprising a wiring pattern mounting and connecting, together with an electronic component, a semiconductor integrated circuit loaded on a package substrate, wherein the wiring pattern passes through a wiring leading point formed virtually in a position placed apart from an outer edge of the package substrate by a predetermined distance.

Moreover, the invention provides the semiconductor integrated circuit mounting substrate, wherein the wiring pattern is disposed in divided regions formed by dividing a region including a semiconductor integrated circuit to be a design target device and a device which is previously designed therearound, respectively.

Furthermore, the invention provides the semiconductor integrated circuit mounting substrate, wherein a wiring connected is carried out in such a manner that a line connecting an input/output pad of a semiconductor integrated circuit to be a design target device, an internal connecting terminal for a connection, to the input/output pad, of the package substrate to be connected to the input/output pad, an external connecting terminal to be connected to the mounting substrate of the package substrate, and the wiring leading point does not have an intersecting region.

In addition, the invention provides a package substrate mounting a semiconductor integrated circuit, connected to a semiconductor integrated circuit mounting substrate including a wiring pattern together with an electronic component, and constituting a semiconductor integrated circuit system, wherein a wiring constituting a signal group corresponding to the component is arranged in a region divided depending on a position on the semiconductor integrated circuit mounting substrate in which a component is disposed.

Moreover, the invention provides the package substrate, wherein the package substrate includes at least one power plane and the power plane is divided into a plurality of regions for each power unit in order to correspond to a power division on the mounting substrate.

Furthermore, the invention provides the package substrate, wherein the package substrate includes a plurality of conductor layers, and any of the conductor layers which is positioned on a surface layer mounting an LSI includes a power ring and a wiring in the package substrate is connected to the power plane through the power ring so as not to have an intersecting region In addition, the invention provides the package substrate, wherein the package substrate has such a structure that a wiring in the package substrate does not have an intersecting region based on connecting information from a semiconductor integrated circuit to be a target to a peripheral component of the semiconductor integrated circuit.

Moreover, the invention provides the package substrate, wherein a plane of the package substrate is divided into N regions and a signal wiring is formed to be completed for each of the regions.

Furthermore, the invention provides the package substrate, wherein an external connecting terminal of the package substrate constitutes a ball grid array, and an external connecting terminal forming plane is divided into N regions and a signal wiring is completed for each of the regions.

In addition, the invention provides the package substrate, wherein the N is four.

Moreover, the invention provides the package substrate, wherein the N is eight.

Furthermore, the invention provides the package substrate, wherein the package substrate is designed in such a manner that grouping is performed corresponding to an array of the external connecting terminal and a signal wiring is adjacent in each group.

By the structure, it is possible to easily implement a replacement of the terminal in the group, that is, a swap thereof.

In addition, the invention provides the package substrate, wherein the package substrate is designed in such a manner that a line of the external connecting terminal is connected to an adjacent input/output pad of the semiconductor integrated circuit to be loaded on the package substrate.

Moreover, the invention provides the package substrate, wherein the package substrate includes at least three conductor layers of a surface layer wiring, a power plane layer and a lowermost layer wiring, and the surface layer wiring and the lowermost layer wiring are formed to keep away from a region having a predetermined width from an end of the divided region, and the power plane layer maintains a current path in the region having the predetermined width from the end in the divided region.

Furthermore, the invention provides the package substrate, wherein the lowermost layer wiring constitutes a ball to be an external connecting terminal and the surface layer wiring is provided with a bond finger including a bond portion formed like a band along a peripheral edge of the semiconductor integrated circuit and a finger portion extended to a position placed just above the external connecting terminal to be connected from the bond portion, and a tip of the bond finger is connected to the corresponding external connecting terminal through a via formed thereon.

In addition, the invention provides the package substrate, wherein the bond finger is formed in two lines and a direction of the extension of the finger portion is set apart from the bond portion, and the external connecting terminal and the semiconductor integrated circuit are connected to each other through a detour using the lowermost layer wiring.

Moreover, the invention provides a semiconductor integrated circuit mounted on a package substrate and constituting a desirable system on a semiconductor integrated circuit mounting substrate, wherein the input/output pad is arranged every group so as to be disposed closest to an external connecting terminal of the package substrate, and at least two input/output pads which are juxtaposed are arranged to be connected to the external connecting terminal juxtaposed in an orthogonal direction to a direction of the juxtaposition.

In the invention, the grouping is carried out by using, as the signal group, two concepts having the signal group corresponding to the component on the semiconductor integrated circuit mounting substrate and the signal group corresponding to the external connecting terminal array of the package. The former is the signal group for a circuit connection and the latter is the grouping in accordance with the physical array of the external connecting terminal, and they are to be considered as independent events, respectively. While the former is a comparatively large division, the latter is a division into small groups, for example, three or four lines.

According to the structure, the semiconductor integrated circuit is designed to have the input/output terminal corresponding to the semiconductor integrated circuit mounting substrate and the package (the package substrate) in consideration of an unnecessary radiating characteristic and a heat characteristic of the semiconductor integrated circuit including the semiconductor integrated circuit mounting substrate and the package (the package substrate). Therefore, it is possible to provide a semiconductor integrated circuit system in which a speed of the design can be increased and the unnecessary radiating characteristic and the heat characteristic are excellent.

BRIEF DESCRIPTION OF THE DRAWINGS

FIG. 4 is a diagram showing a net list and a terminal table of the semiconductor integrated circuit system according to the first embodiment of the invention, FIG. 7 is an explanatory view showing the fan out according to the first embodiment of the invention, FIG. 22 is an explanatory view showing a method of designing a package according to a fourth embodiment of the invention, FIG. 23 is an explanatory view showing a method of designing a package according to a fifth embodiment of the invention, FIG. 37 is an explanatory diagram showing a method of designing a package according to a seventh embodiment of the invention, FIG. 51 is an explanatory chart showing the method of designing an LSI according to the fifteenth embodiment of the invention, FIG. 55 is an explanatory view showing the method of designing an LSI according to the seventeenth embodiment of the invention.

DESCRIPTION OF THE PREFERRED EMBODIMENTS

Embodiments according to the invention will be described below in detail with reference to the drawings.

The invention serves to implement a completely reverse design flow to a conventional design flow and to provide a semiconductor integrated circuit system in which a mounting substrate such as a printed wiring board is first designed, a package substrate mounting an LSI is designed based on a result of the design of the mounting substrate and a layout design of the LSI to be mounted on the package substrate is then carried out to wholly optimize the printed wiring board, the package and the LSI which act as the mounting substrate, and countermeasures to be taken against an unnecessary radiation and a heat are excellent.

First Embodiment

Prior to explanation of the embodiments according to the invention, description will be first given to a concept of the invention.

Figure 1:
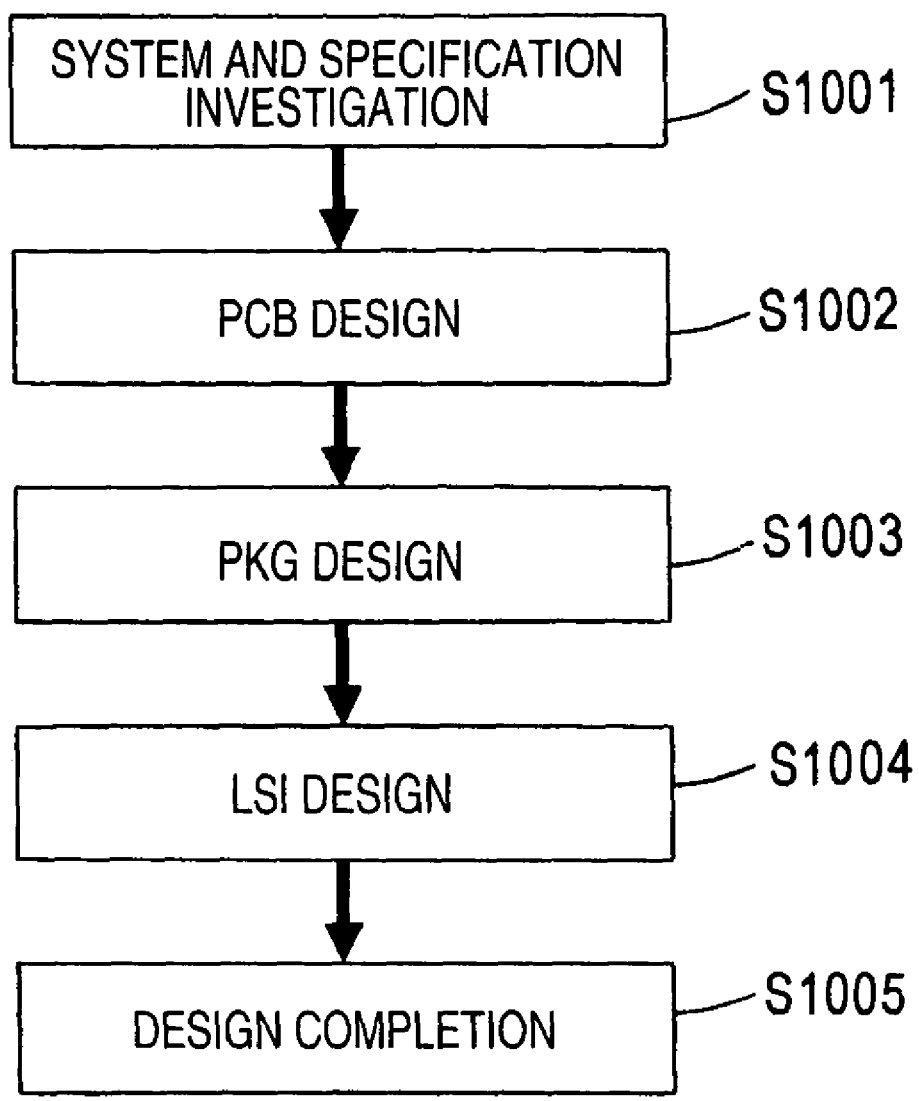
FIG. 1 is a flowchart showing a method of designing a semiconductor integrated circuit system according to a first embodiment of the invention.
Figure 2:
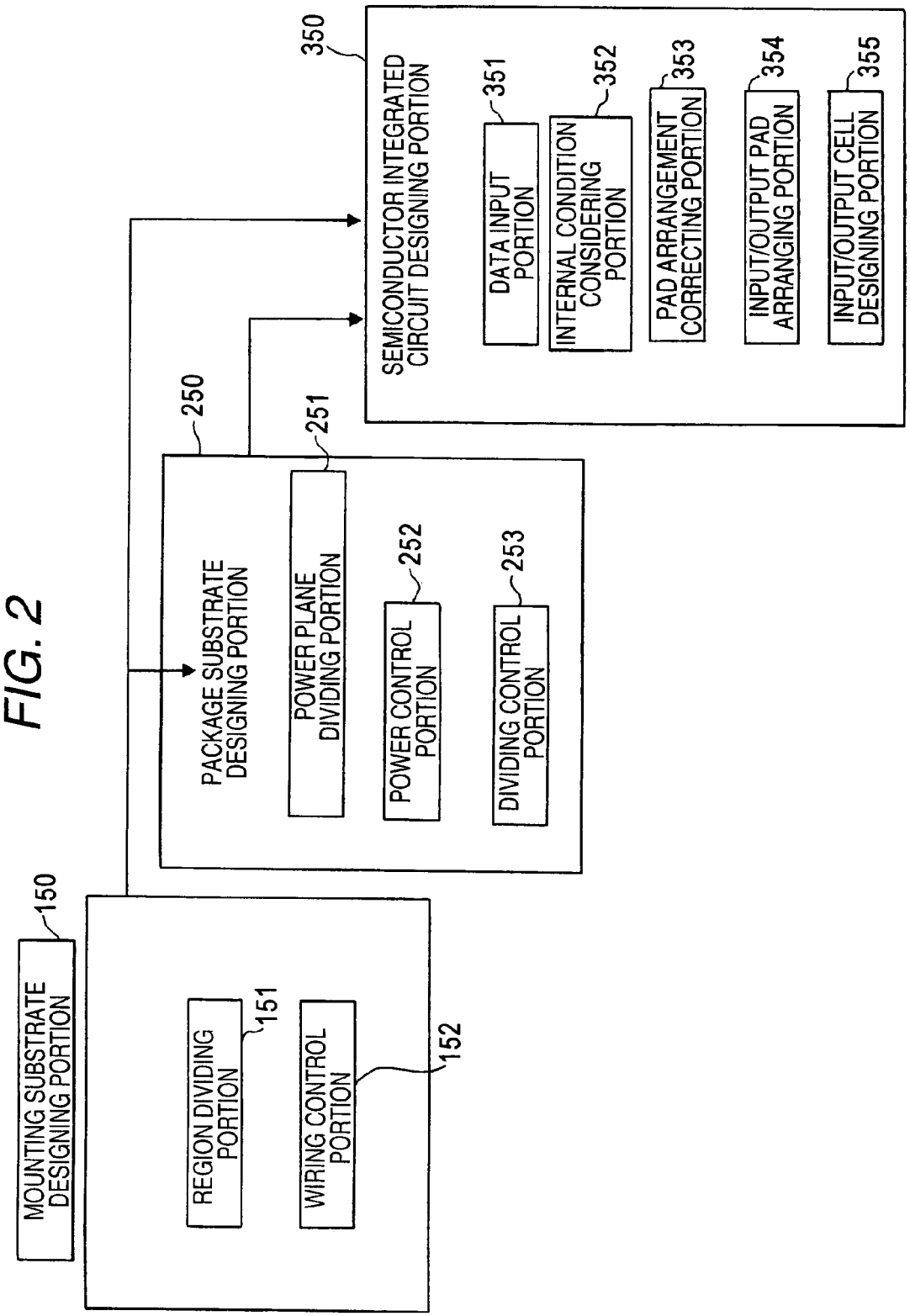
FIG. 2 is a diagram showing an apparatus for designing a semiconductor integrated circuit system according to the first embodiment of the invention.

FIG. 1 is an explanatory diagram showing a design flow and FIG. 2 shows an apparatus for designing a semiconductor integrated circuit system. In the embodiment, a system specification including, on a printed wiring board, a semiconductor integrated circuit (LSI) to be accommodated in a package and other electronic components such as a memory is investigated (system and specification investigation: Step 1001), the printed wiring board is designed based on information about a component arrangement on the printed wiring board (a design of the printed wiring board: Step 1002). Then, a position of a ball to be an external connecting terminal on a package substrate constituting a package is investigated based on the information about a component arrangement on the printed wiring board and the package is designed in consideration of a signal wiring of the package (a design of the package: Step 1003). Thereafter, an input/output arrangement of the LSI in which the signal wiring in the package is optimized is determined and an arrangement of an input/output terminal 301 of the LSI is determined (a design of the LSI: Step 1004).

More specifically, the arrangement of the input/output terminal of the LSI is optimized based on information about the printed wiring board and the package (the package substrate) in place of the internal condition of the LSI so that the whole semiconductor integrated circuit system comprising the printed wiring board, the package and the LSI is optimized.

Moreover, the optimum arrangement of a component and a wiring pattern including the LSI on the printed wiring board and the signal wiring in the package substrate constituting the package are also taken into consideration, and a problem such as an intersecting structure or an increase in a wiring length is eliminated and an optimization is carried out for an unnecessary radiation and heat for the whole system. Therefore, quality can be enhanced. Furthermore, a complicated arrangement of the signal wiring is not generated. Therefore, it is possible to reduce a man-hour, and furthermore, to correspond to an automation.

Next, the embodiment will be described in detail. The embodiment is executed by setting a system/specification investigation, that is, a component arrangement result as input data. As shown in the block diagram of FIG. 2, the apparatus for designing a semiconductor integrated circuit system to be used herein comprises a mounting substrate designing portion 150, a package substrate designing portion 250 for designing the package substrate based on the design result, and furthermore, a semiconductor integrated circuit designing portion 350 for designing a semiconductor integrated circuit based on a design result of the package substrate.

The mounting substrate designing portion 150 serves to design a semiconductor integrated circuit mounting substrate by setting a system specification as input data, and has such a structure as to comprise a region dividing portion 151 and a wiring control portion 152 and to carry out such a control as to investigate the specification of the semiconductor integrated circuit system, to divide the mounting substrate into a plurality of regions through the region dividing portion 151, and to complete a wiring for each of the regions through the wiring control portion 152.

The region dividing portion 151 divides, into a plurality of regions, a region including the semiconductor integrated circuit to be a design object and a device designed previously therearound. Moreover, the wiring control portion 152 controls the wiring in such a manner that the wiring is completed in the regions obtained by the division of the region dividing portion 151.

Moreover, the mounting substrate designing portion may be constituted to use, as input data, the system specification information which does not include the information about a design of a semiconductor integrated circuit chip. Consequently, it is possible to design the mounting substrate with priority without taking the information about the design of a semiconductor integrated circuit chip into consideration.

Furthermore, the mounting substrate designing portion 150 includes a designing portion for determining a virtual wiring leading point in a position placed apart from an outer edge of the package substrate by a predetermined distance and carrying out a design to cause the wiring pattern to pass through the wiring leading point.

In the invention, moreover, it is desirable that the mounting substrate designing portion 150 should include an intersecting control portion for designing the wiring leading point in such a manner that a line connecting an input/output pad of a semiconductor integrated circuit to be a design target device, an internal connecting terminal (a bonding point of a bond finger) for a connection, to the input/output pad, of the package substrate to be connected to the input/output pad, an external connecting terminal of the package substrate to be connected to the mounting substrate, and the wiring leading point does not have an intersecting region.

A ball grid array is used as the package, and there is used a package substrate having a multilayer wiring structure including a four-layer conductor layer having a surface layer wiring, a power plane, a ground plane, and a lowermost layer wiring on which a ball constituting an external connecting terminal is formed. A conductor layer positioned on a surface layer mounting the LSI thereon includes a power ring and is constituted to be connected to the power plane through the power ring in such a manner that the wiring in the package substrate does not have the intersecting region.

The package substrate designing portion 250 serves to investigate a type of the package to be applied and to design the package substrate in consideration of a result of the design of the mounting substrate, a specification of the system and a consumed power, and includes a power plane dividing portion 251, a power control portion 252 and a division control portion 253. The details will be described below. In the embodiment, the power plane is divided corresponding to a power potential, and furthermore, the region is also divided for each wiring layer and a control is carried out to complete a wiring in the region, and the wiring is provided so as not to have the intersecting region.

The input data of the package substrate designing apparatus 250 include at least the design result of the semiconductor integrated circuit mounting substrate designing portion 150. The dividing control portion 253 of the package substrate designing apparatus 250 carries out a division for each signal group and performs a control in such a manner that a wiring constituting a signal group corresponding to the component is provided in the divided region depending on a position of a component arrangement on the semiconductor integrated circuit mounting substrate.

Moreover, the power plane dividing portion 251 carries out a division into a plurality of regions for each power unit in such a manner that the power plane constituting the package substrate corresponds to a power division on the mounting substrate.

Furthermore, the dividing control portion 253 carries out a design in such a manner that the external connecting terminal of the package substrate constitutes the ball grid array, the external connecting terminal forming surface is divided into eight regions and a signal wiring is completed for each region. Moreover, the grouping is carried out corresponding to an array of the external connecting terminal, and the design is carried out in such a manner that the signal wirings are adjacent to each other every group. Furthermore, the package substrate designing portion may include a wiring control portion for carrying out a control in such a manner that the surface layer wiring and the lowermost layer wiring have a formation prohibiting region having a predetermined width from an end of the divided region, which is not shown.

Moreover, the semiconductor integrated circuit designing portion 350 serves to carry out a circuit design including an input/output pad over the design result of the mounting substrate and the design result of the package substrate in consideration of the internal condition and includes a data input portion 351, an internal condition considering portion 352, a pad arrangement correcting portion 353, an input/output pad arranging portion 354 and an input/output cell designing portion 355. The details will be described below, and the data input portion 351 determines an input/output pad arrangement by setting the design result of the semiconductor integrated circuit mounting substrate to be the input data. Moreover, the internal condition considering portion 352 carries out a correction in consideration of the internal condition of the LSI. The input/output pad arranging portion 354 designs the arrangement of the input/output pad of the semiconductor integrated circuit corresponding to the arrangement of the external connecting terminal on the package substrate and the arrangement of the component on the semiconductor integrated circuit mounting substrate. The input/output cell designing portion 355 determines a driving capability of an input/output cell to be connected to the input/output pad of the semiconductor integrated circuit corresponding to the arrangement of the component on the semiconductor integrated circuit mounting substrate.

Figure 3:
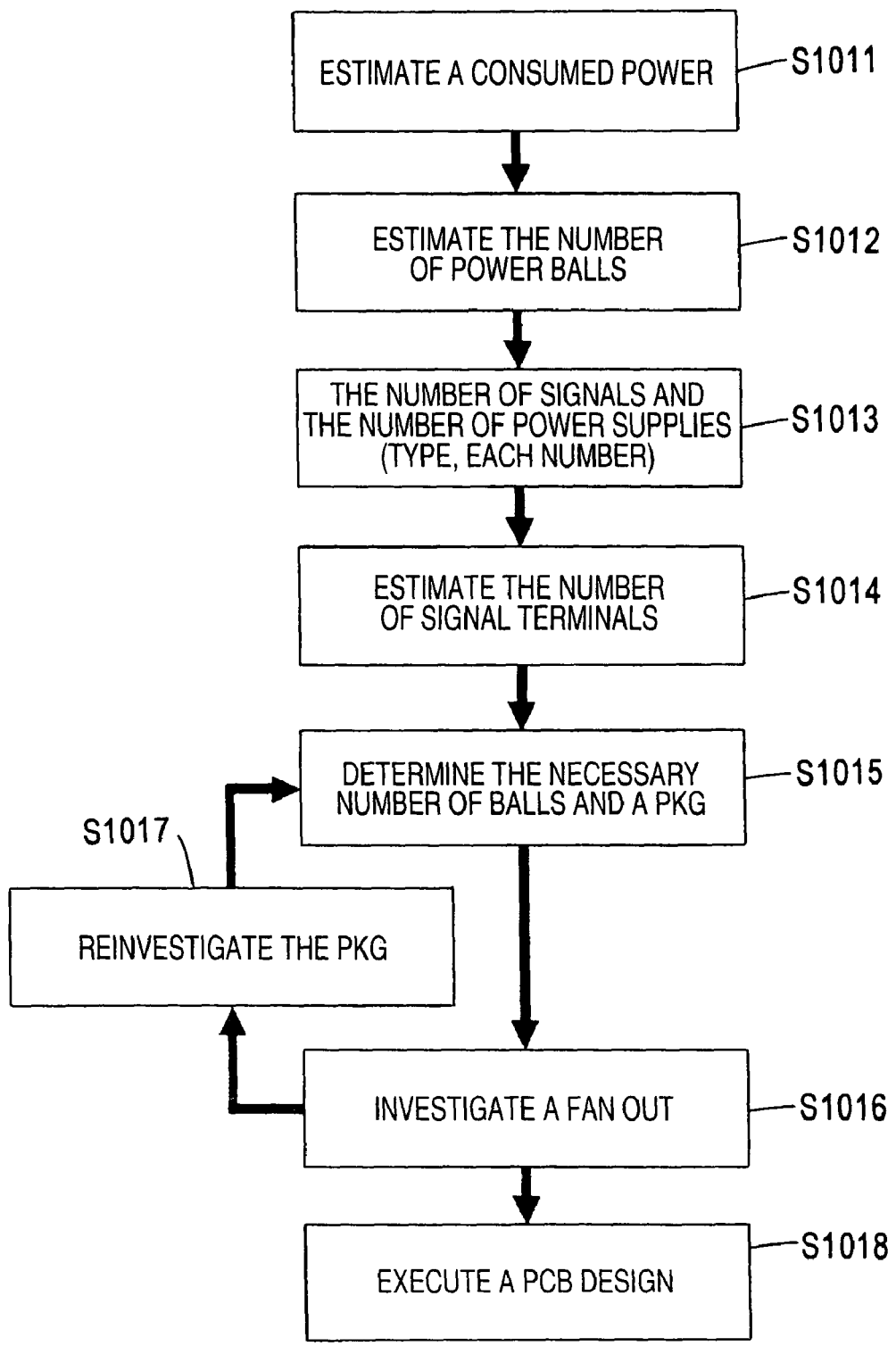
FIG. 3 is a flowchart showing the method of designing a semiconductor integrated circuit-system according to the first embodiment of the invention.

FIG. 3 is a flowchart showing, in detail, the system/specification investigating step 1001 to be executed prior to the printed wiring board designing step 1002 in the steps illustrated in FIG. 1.

First of all, a consumed power of a component to be arranged on a printed wiring board 100 such as an LSI or a memory is calculated from the system/specification (Step 1011). In that case, it is necessary to investigate any package to be used in relation to the LSI. For this reason, the following investigation is executed.

Then, the number of power balls is estimated based on the consumed power (Step 1012). In that case, this is obtained by a calculation based on a power value which can be supplied per ball constituting the external connecting terminal of the package. The power value executes the calculation for a power supply and a ground (GND) respectively.

Figure 5:
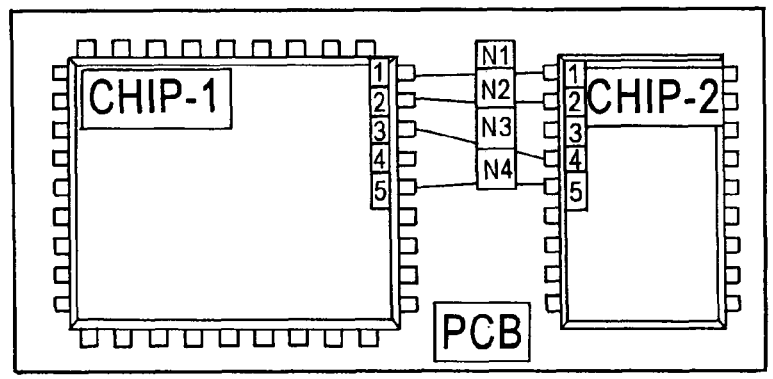
FIG. 5 is an explanatory view showing a connecting relationship of the semiconductor integrated circuit system according to the first embodiment of the invention.

Moreover, types of a signal and a power supply (grouping) and the number are investigated based on a terminal table of a system and a signal connection (a net list) as shown in FIGS. 4(*a*) to 4(*c*) and FIG. 5 on the basis of the system specification (Step 1013).

At the Step 1013, the grouping of the signal and the power supply and the number of power supplies-belonging to the group are made clear, thereby estimating the necessary number of terminals (Step 1014).

Thus, the investigation is carried out based on the consumed power of the component to be arranged on the printed wiring board in the system. As a result, the investigation is made based on the necessary number of power balls which is calculated, the net list of the system and the terminal table to calculate the number of the balls.

The necessary number of the balls and a package corresponding to the number of the balls are determined from the two types of results of investigations (Step 1015). For example, there is determined a use of a package utilizing a package substrate having a three-layer structure which includes an external connecting terminal constituting a ball grid array in which balls are arranged like a grid, for example.

When the package is determined, whether a fan out (leading) of each wiring can be executed through the package is investigated (Step 1016).

Referring to a wiring rule of a printed-wiring assembly (a width of a wiring, an interval, a size of a via or an interval) for a footprint of a package (a shape of the package, an arrangement of a pin and the number of pins) and a structure of a substrate layer (the number of sheets) in the case in which the printed wiring board is constituted by a multilayer substrate, the contents of the investigations to be carried out are selected and whether a necessary wiring can be led is confirmed.

If it is decided that the necessary wiring cannot be led, then, the processing returns to the investigation of the package and a reinvestigation (Step 1017) is executed.

If the necessary wiring can be led, the detailed design of the printed wiring board is started (Step 1018). (the processing proceeds to a next phase).

According to the method, the design is first carried out from a downstream side toward an upstream side, that is, from the printed wiring board to the package substrate design and the LSI design when the printed wiring board is to be designed in the design of the semiconductor integrated circuit system, and the schematic position of the terminal array of the package is determined by setting, as input data, the information about the component arrangement result obtained based on the system specification information in the design of the printed wiring board. Therefore, the restrictions of the package and the LSI are put with difficulties and it is possible to determine an arrangement of an input/output terminal or a layout of a wiring pattern which is ideal for the printed wiring board. Consequently, the wiring rule and the substrate layer structure in the printed wiring board can be investigated in a short turnaround time. In this connection, the input/output terminals of the package and the LSI have already been determined in the conventional design. For this reason, it is necessary to execute the design of the package again in order to carry out the reinvestigation. Depending on circumstances, there is a possibility that a change in the layout of the LSI might be required and a considerable time and man-hour might be necessary.

In addition to the functions and advantages, according to the invention, it is possible to suppress an intersection of a wiring and an increase in a wiring length and to reduce a complicated arrangement of a signal wiring also in an increase in a scale and a speed and a change into a multibit of the semiconductor integrated circuit system. Accordingly, it is easy to automate the wiring.

(Fan Out)

Next, the fan out explained in the Step 1016 of FIG. 3 will be described in detail.

At a conventional designing step, the fan out investigation is manually executed. In the embodiment, however, an automation is implemented.

Figure 6:
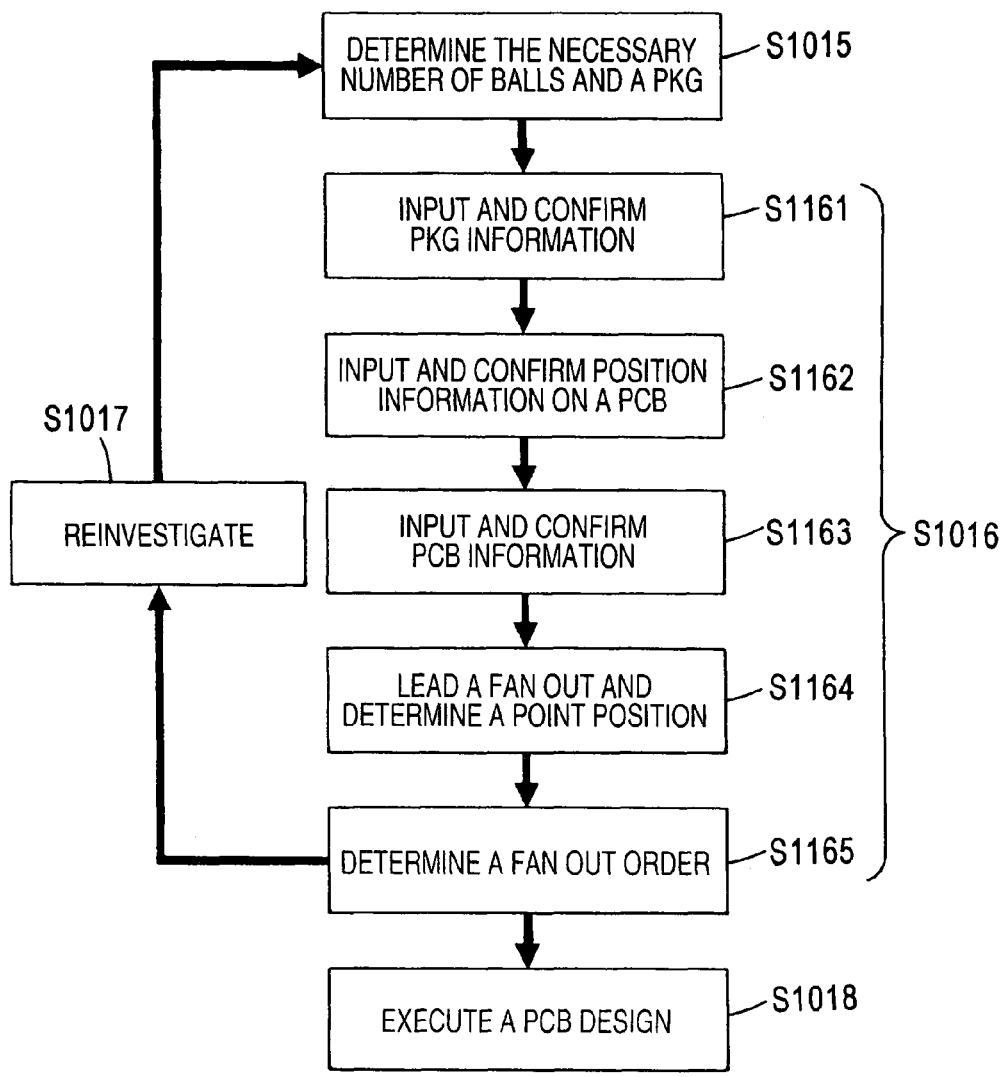
FIG. 6 is a flowchart showing a design of a fan out according to the first embodiment of the invention.

First of all, as shown in the flowchart of FIG. 6, the fan out (Step 1016) is carried out after the package determining step 1015. The input and confirmation of necessary information is first executed.

Firstly, the input of package information about an LSI and a memory which are to be used is confirmed (Step 1161). The reason is that a wiring leading method is varied depending on a shape of the package and the number of pins (the number of terminals and the number of power supplies).

Secondly, an input of information about a position of an arrangement on the printed wiring board is confirmed (Step 1162). This is carried out to investigate which terminal (group) of a power supply and a signal of the LSI is subjected to the fan out in any direction depending on the arranging state of components provided around the LSI. Herein, a ball on a close side to a related component is assigned to a signal and consideration is taken in order to prevent a wiring from being provided around and a wiring length from being increased.

Thirdly, an input of information about a printed wiring board to be used is confirmed (Step 1163). This is carried out because the number of wirings which can be led is varied depending on specifications such as a wiring rule of the printed wiring board and a structure of a substrate layer. It is possible to lead a larger number of wirings with smaller wiring width and pitch.

When the number of wiring layers is larger, moreover, more signal lines can be led. However, there are restrictions, for example, a cost is considerably increased and an actual manufacture is hard to perform. In consideration of these restrictions, it is necessary to determine a fan out position. For this reason, the input of these information is confirmed.

Fourthly, a fan out point position FPL is determined as shown in FIG. 7 (Step 1164). Herein, a necessary number of fan out points are set around a package 200 to be disposed. The number is prepared corresponding to the numbers of power supplies and signals of the package. A designer optionally sets a distance from the package. In case of a memory 500, when the fan out points are not uniformly disposed on four sides but are intensively disposed on a close surface to the LSI, it is possible to prevent the wraparound of the signal.

Figure 8B:
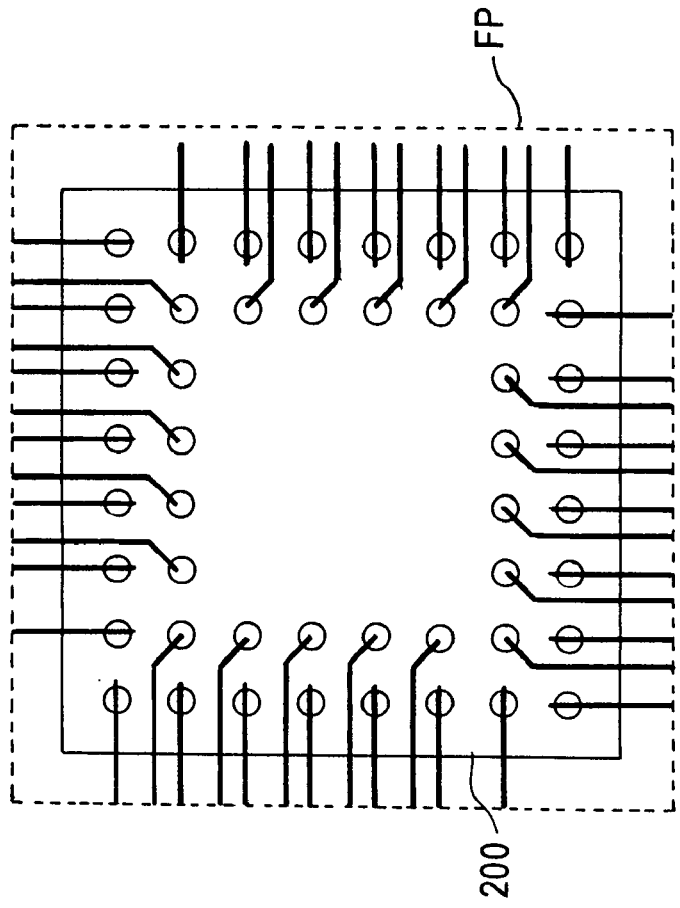
FIG. 8 is an explanatory view showing the fan out according to the first embodiment of the invention.
Figure 8A:
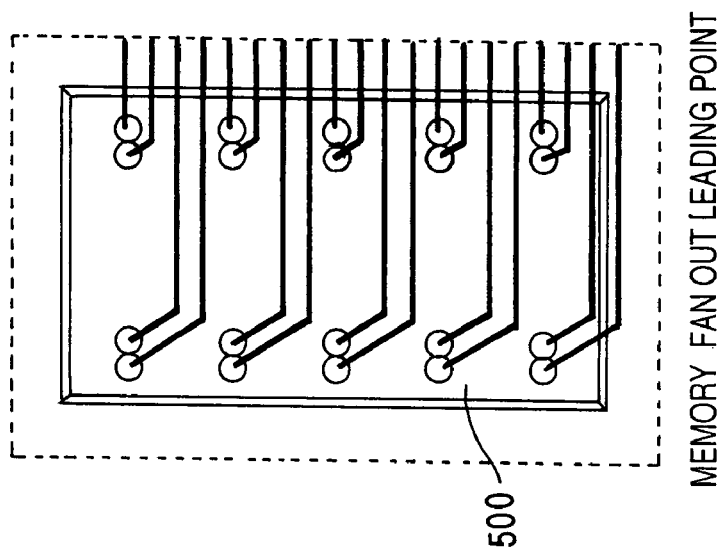

Fifthly, a fan out order is determined (Step 1165) and the fan out point is linked to a position of a ball to be an external connecting terminal. Herein, the setting of the fan out point is executed, and a wiring is then executed from the ball of the package to a fan out point FR The wiring is led in order so as not to have an intersecting region (see FIG. 8).

Thus, the position of the fan out point is determined, and the position and the position of the ball are connected sequentially so that a wiring pattern having no intersection can be designed by itself.

When the fan out order is thus determined and the investigation of the fan out (Step 1016 in FIG. 3) is ended, and the investigation of the design and specification of a system is completed, the printed wiring board is actually designed. Next, description will be given to a process for designing an actual printed wiring board.

Figure 9:
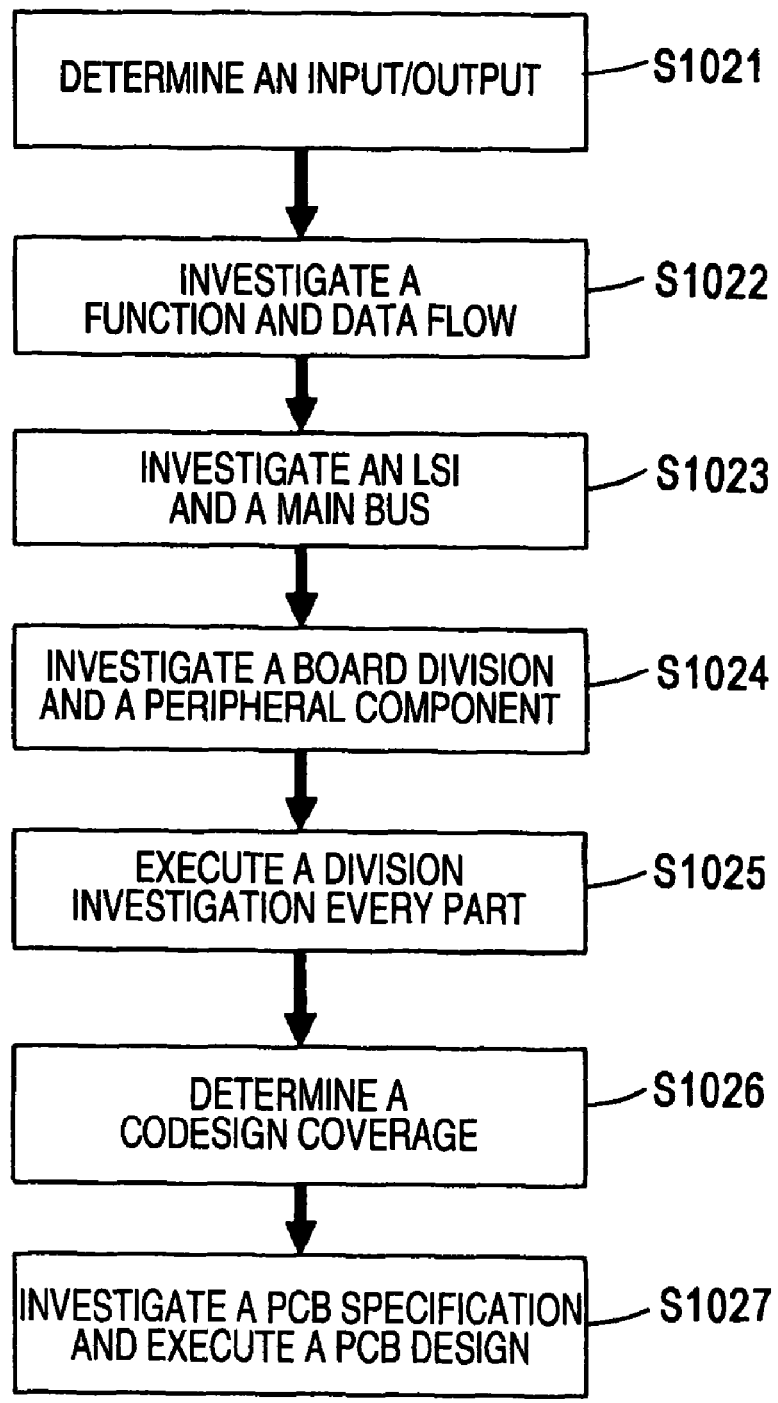
FIG. 9 is an explanatory diagram showing a method of designing a package substrate according to the first embodiment of the invention.
Figure 10A:
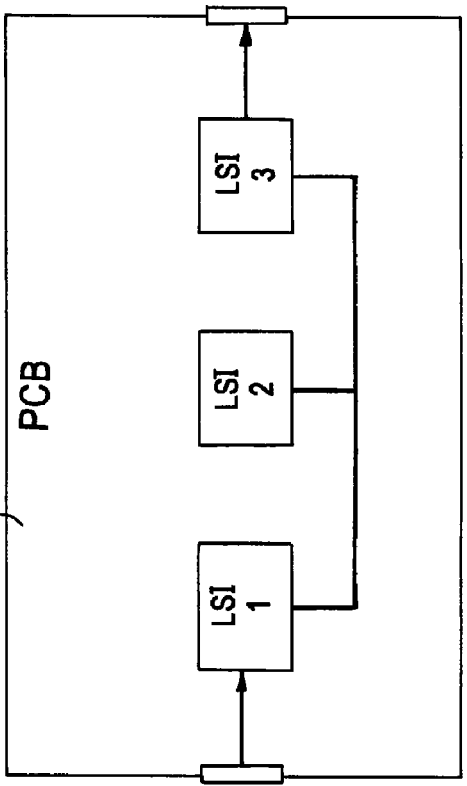
FIG. 10 is an explanatory diagram showing a method of designing a printed wiring board according to the first embodiment of the invention.
Figure 10C:
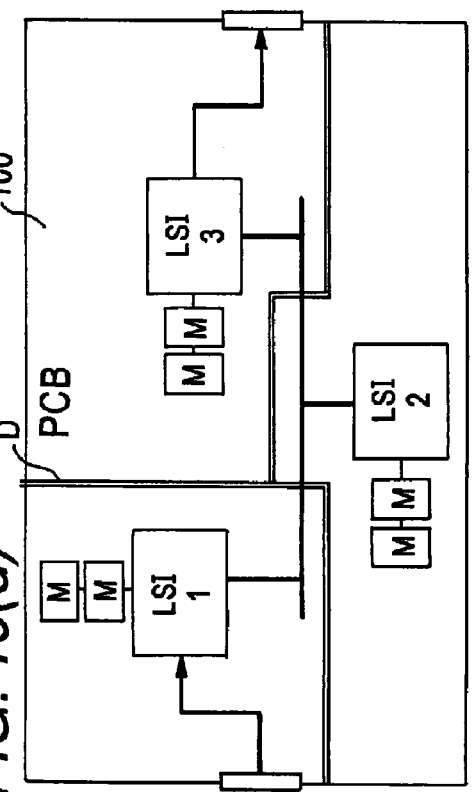
Figure 10B:
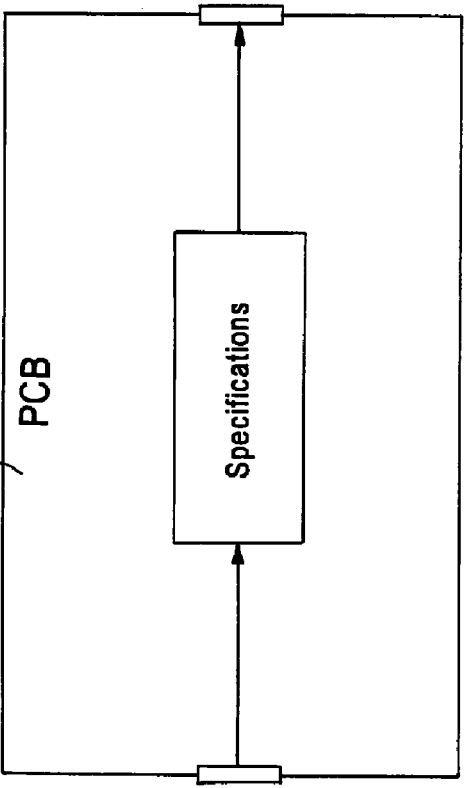
Figure 10D:
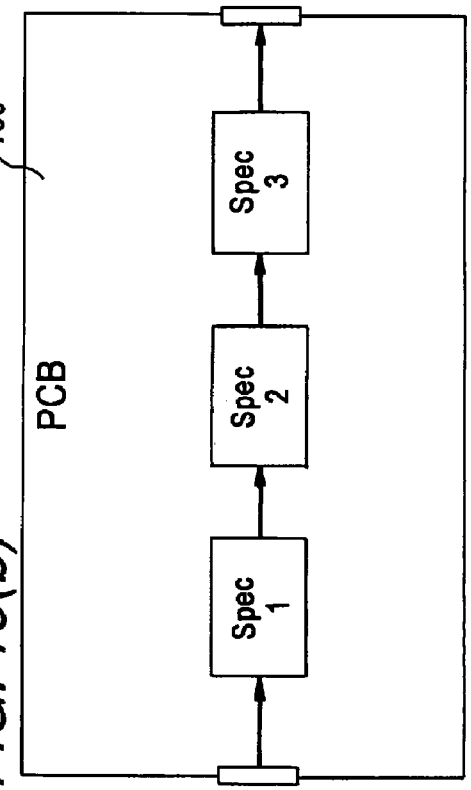
Figure 11C:
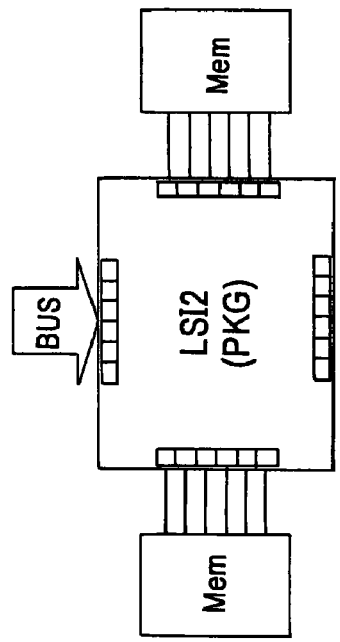
FIG. 11 is an explanatory diagram showing the method of designing a printed wiring board according to the first embodiment of the invention.
Figure 11D:
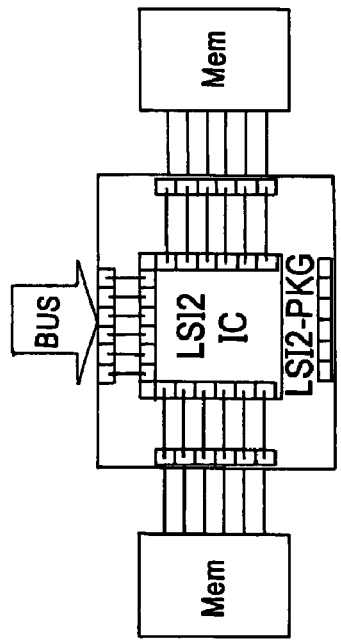
Figure 11A:
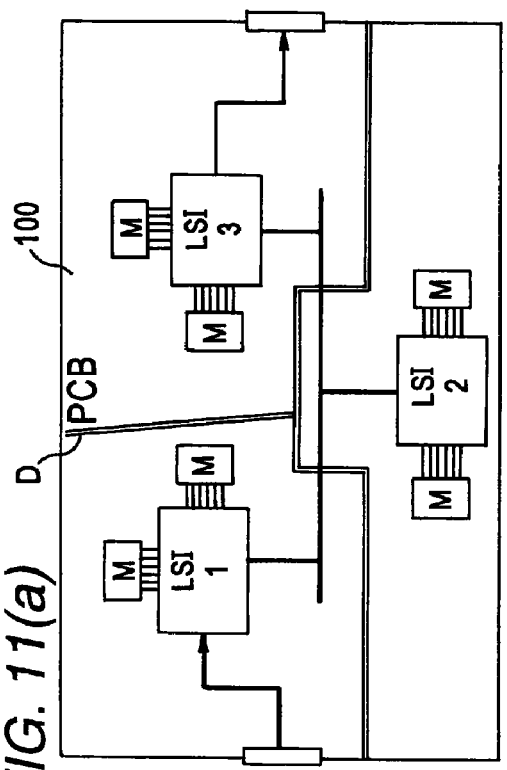
Figure 11B:
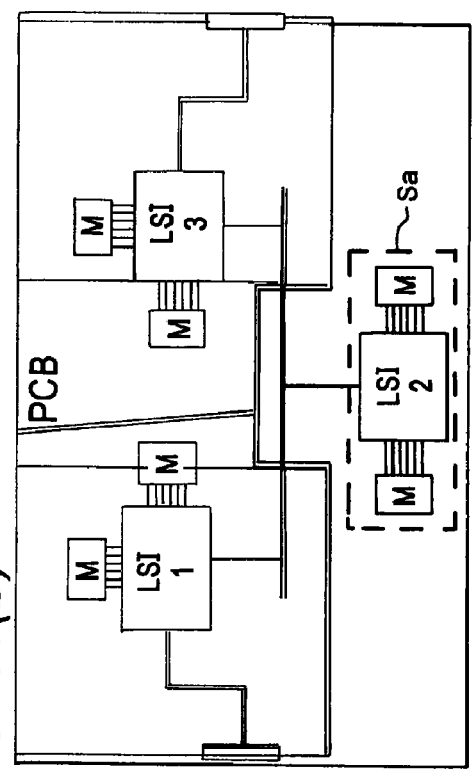

In the design of the printed wiring board, a flowchart in FIG. 9 is executed.

First of all, the investigation of a schematic specification of the whole printed wiring board is executed. The detailed specification has not been determined yet. As the whole printed wiring board, therefore, a clarification is first executed for input and output data as shown in FIG. 10(*a*), and an input portion I and an output portion O are determined (an input/output determining step 1021). Moreover, a necessary schematic specification for a signal processing is determined.

As shown in FIG. 10(*b*), subsequently, a function data flow is investigated (Step 1022). More specifically, when the schematic specification of input and output signals is determined at the input/output determining step 1021, there is executed an investigation whether the specification is satisfied with such a structure and order or not. Then, a reduction is executed over each specification constituting the printed wiring board based on the schematic specification.

As shown in FIG. 10(*c*), thereafter, the LSI and a main bus are investigated (Step 1023). In other words, a bus is formed from the input portion I to the output portion O through an LSI 1, an LSI 2 and an LSI 3 on the printed wiring board 100.

When respective specifications are fixed, furthermore, individual specifications are implemented with structures of the components (LSI 1, LSI 2 and LSI 3) and how to exchange data is investigated. Moreover, a transfer is clarified for a flow of data to be a basis of a signal processing.

As shown in FIG. 10(*d*), subsequently, the division of a board and the investigation of a peripheral component are carried out (Step 1024). When the individual specifications and the data transfer are clarified, the division of the board is executed. There will be supposed the case in which the division is mainly carried out for each of processing contents and a division into three parts is carried out through a boundary line D. The necessary LSI for the processing and necessary components are investigated. Herein, the LSI 1, the LSI 2 and the LSI 3 are connected and two memories M are connected to each of them.

Then, a dividing investigation is executed for each of the three parts obtained by the division through the boundary line D (Step 1025). More specifically, as shown in FIG. 11(*a*), an arrangement of the components for each part obtained by the division is investigated, and particularly, a region Sa in which an enhance design is regarded to be necessary is clarified.

As shown in FIG. 11(*b*), subsequently, a Codesign coverage is determined (Step 1026). For a portion such as a high speed interface (I/F) in which the Codesign is regarded to be required, an arrangement and a wiring are investigated, and a region is set within an optional range.

When the setting of the range is determined, thus, the processing proceeds to an investigating phase for a detailed specification as shown in FIGS. 11(*c*) and 11(*d*) (Step 1027).

The printed wiring board 100 is thus designed so that a wiring 101 is formed.

Figure 12:
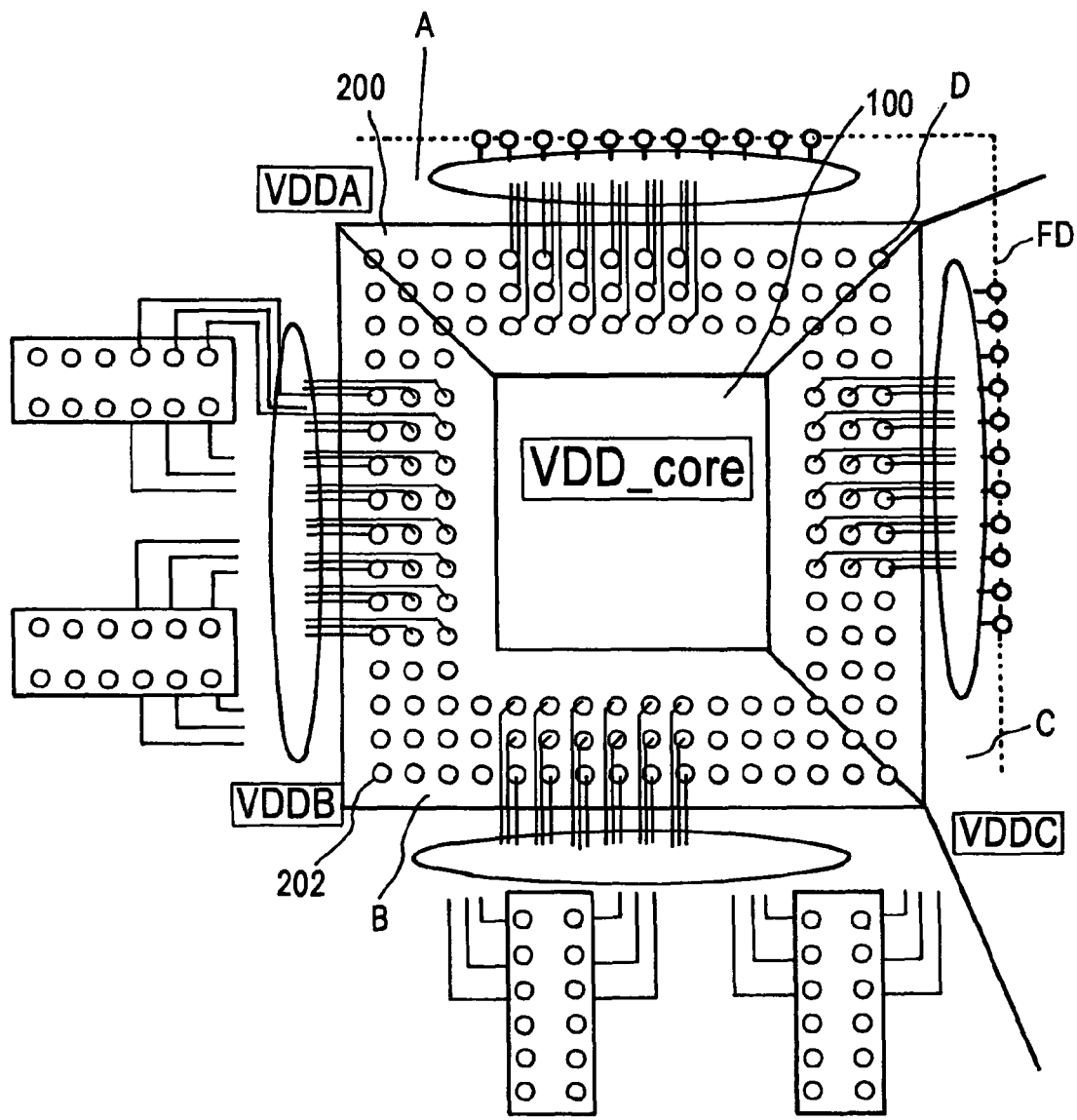
FIG. 12 is an explanatory view showing the method of designing a printed wiring board according to the first embodiment of the invention.
Figure 13:
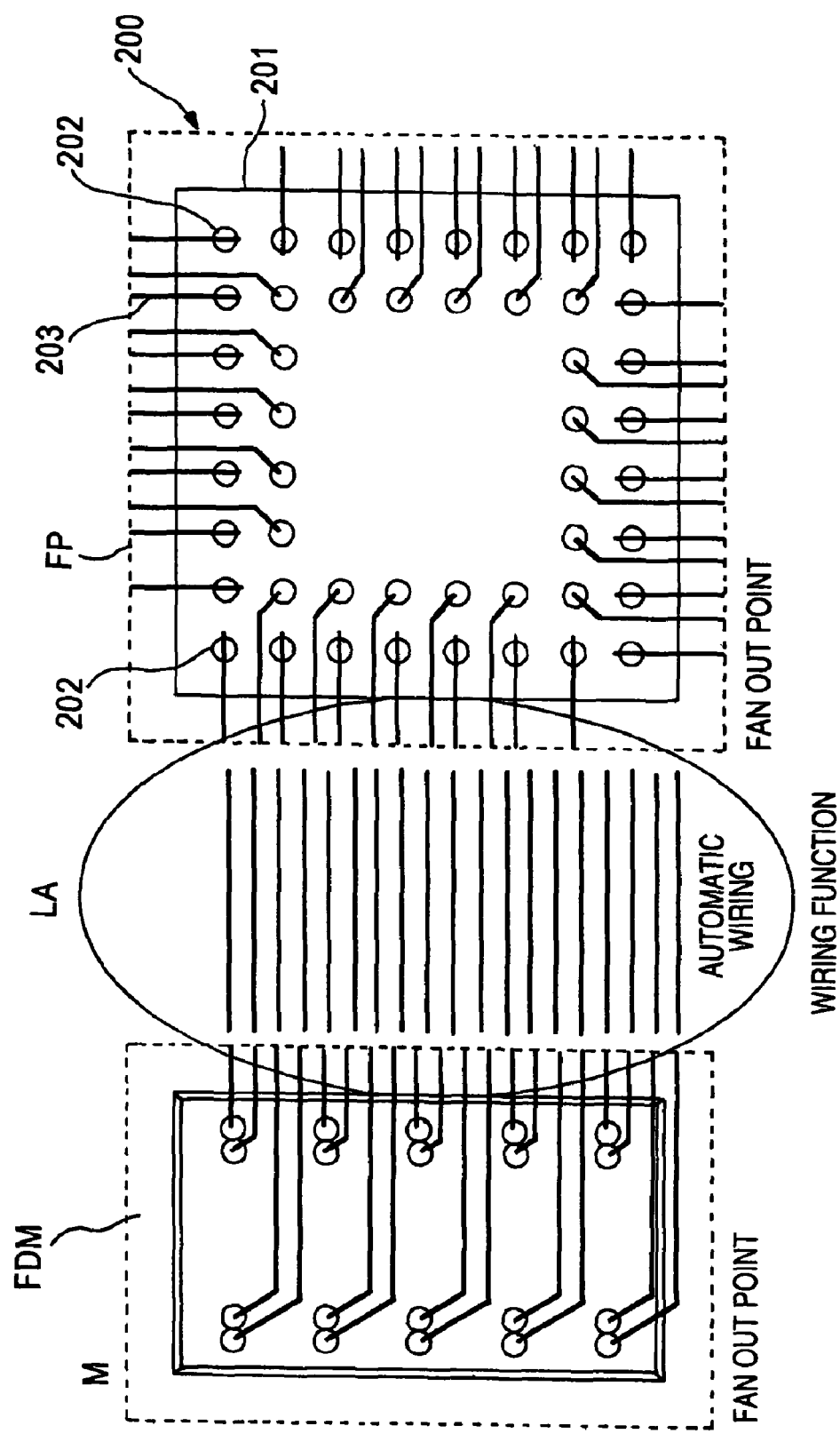
FIG. 13 is an explanatory view showing the designing method according to the first embodiment of the invention.

There will be considered the case in which a division into three regions A, B and C is carried out through the boundary line D, and three power planes of VDDA, VDDB and VDDC are assigned as shown in FIG. 12. A connection is sequentially carried out from a position of a ball 202 on the package substrate 200 toward the fan out point FP, and a wiring region LA having no intersection is obtained as shown in an enlarged view illustrating a main part in FIG. 13. In this example, it is apparent that a wiring 101 which passes through the fan out point FPM of the memory from the ball position of the package of the memory M and is almost parallel and regular from the semiconductor integrated circuit package fan out point FP to the ball position is formed.

Figure 14:
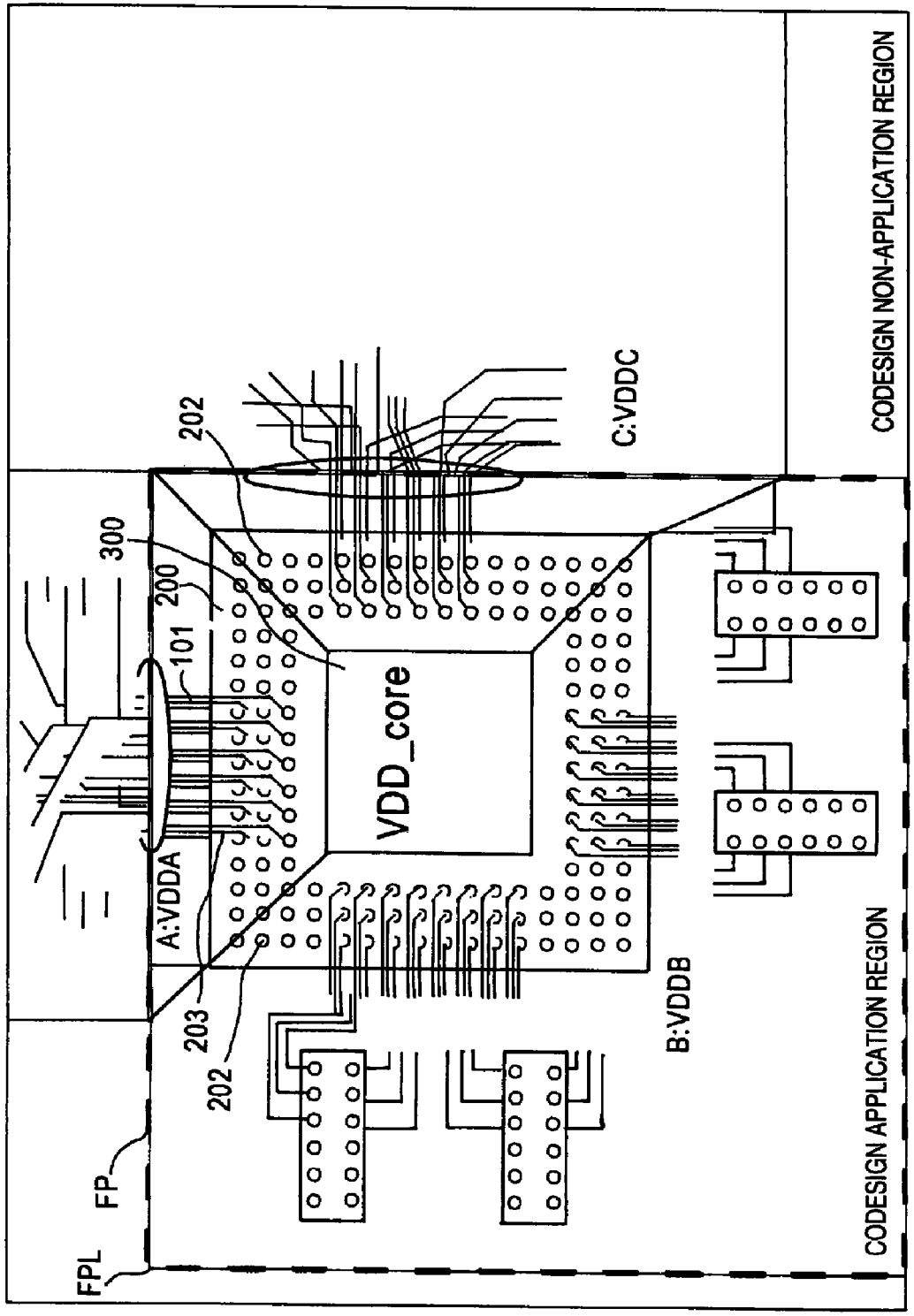
FIG. 14 is an explanatory view showing the designing method according to the first embodiment of the invention.
Figure 57:
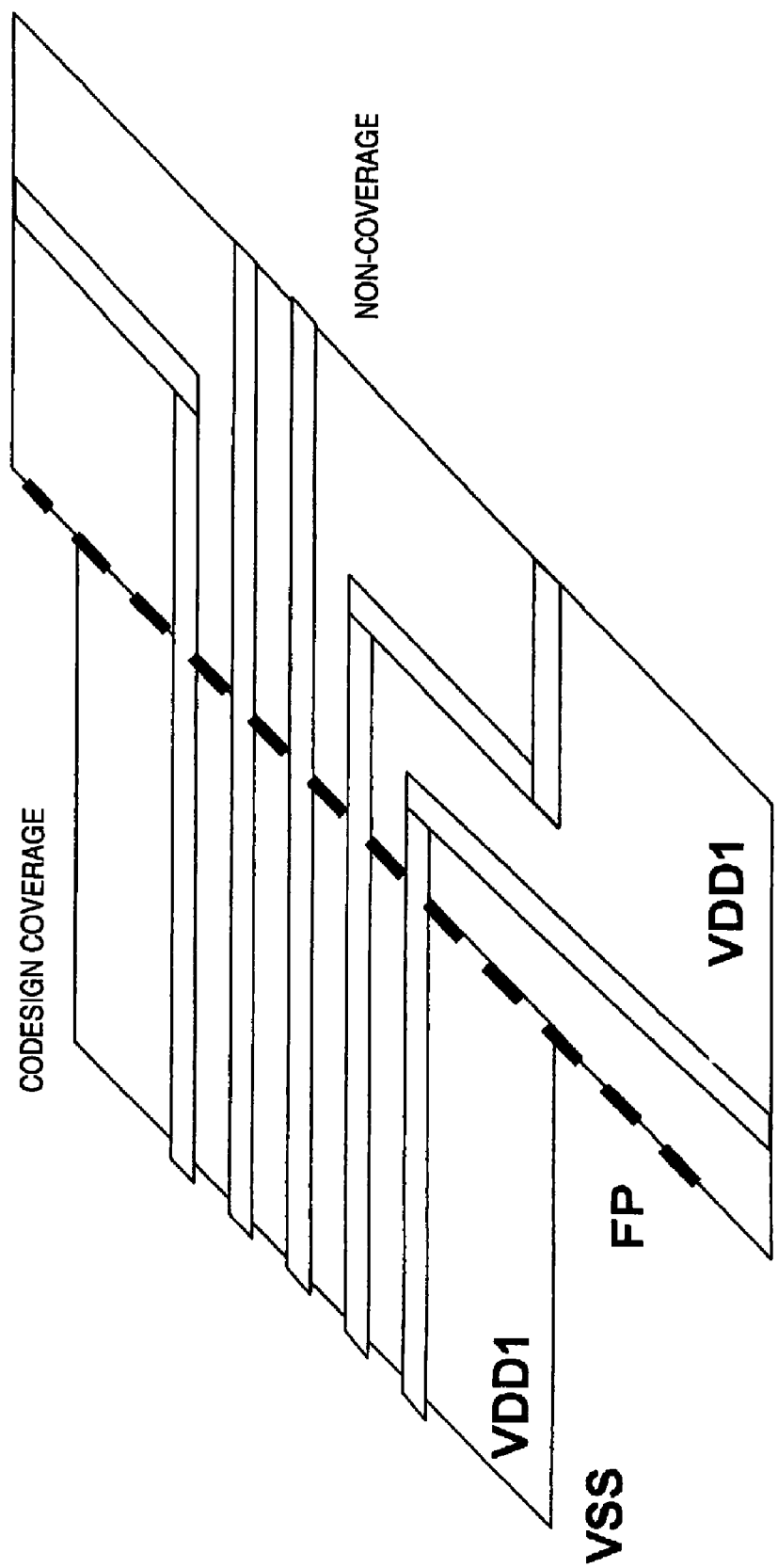
FIG. 57 is an enlarged view showing a main part in FIG. 14.

As shown in FIGS. 14 and 57, moreover, as in the wiring 101 on the printed wiring board around the semiconductor integrated circuit package 200, the wiring 101 is arranged well without an intersection up to the fan out point FP in a cowiring region. When the fan out point is exceeded, however, an array state is changed. FIG. 57 is an enlarged view showing a main part in FIG. 14. For example, a wiring pattern on a mounting substrate is led with a regularity from the position of the ball 202 of the BGA package 200 mounting a semiconductor integrated circuit (chip) 300 to a predetermined position. On the other hand, when the fan out point FP is exceeded, the regularity is changed. In other words, there is rarely a regularity. Herein, a line FPL connecting the fan out point FP takes a square shape.

The region subjected to the region division is connected to the power plane for each region.

According to the structure, a wiring constituting a signal group corresponding to the component is arranged in the region divided depending on the position in which the component is arranged on the semiconductor integrated circuit mounting substrate. Therefore, a wiring length can be reduced and a speed can be increased. Accordingly, there is implemented a wiring design having no intersection which takes the mounting-substrate and the package substrate into consideration. Therefore, it is possible to provide a semiconductor integrated circuit system which can carry out a high speed driving operation and is excellent in an unnecessary radiant characteristic and a heat characteristic.

Second Embodiment

Next, description will be given to a method of designing a package according to a second embodiment of the invention.

For the package, there have been proposed various packages using a lead frame and a film carrier. Herein, there will be utilized a package having a ball grid array structure using a multilayered structure substrate as a package substrate and using a ball as an external connecting terminal.

While the method of designing a printed wiring board to mount a package substrate mounting a semiconductor integrated circuit chip has been described in the first embodiment, description will be given to a method of designing a package substrate to be used in the embodiment.

Figure 15:
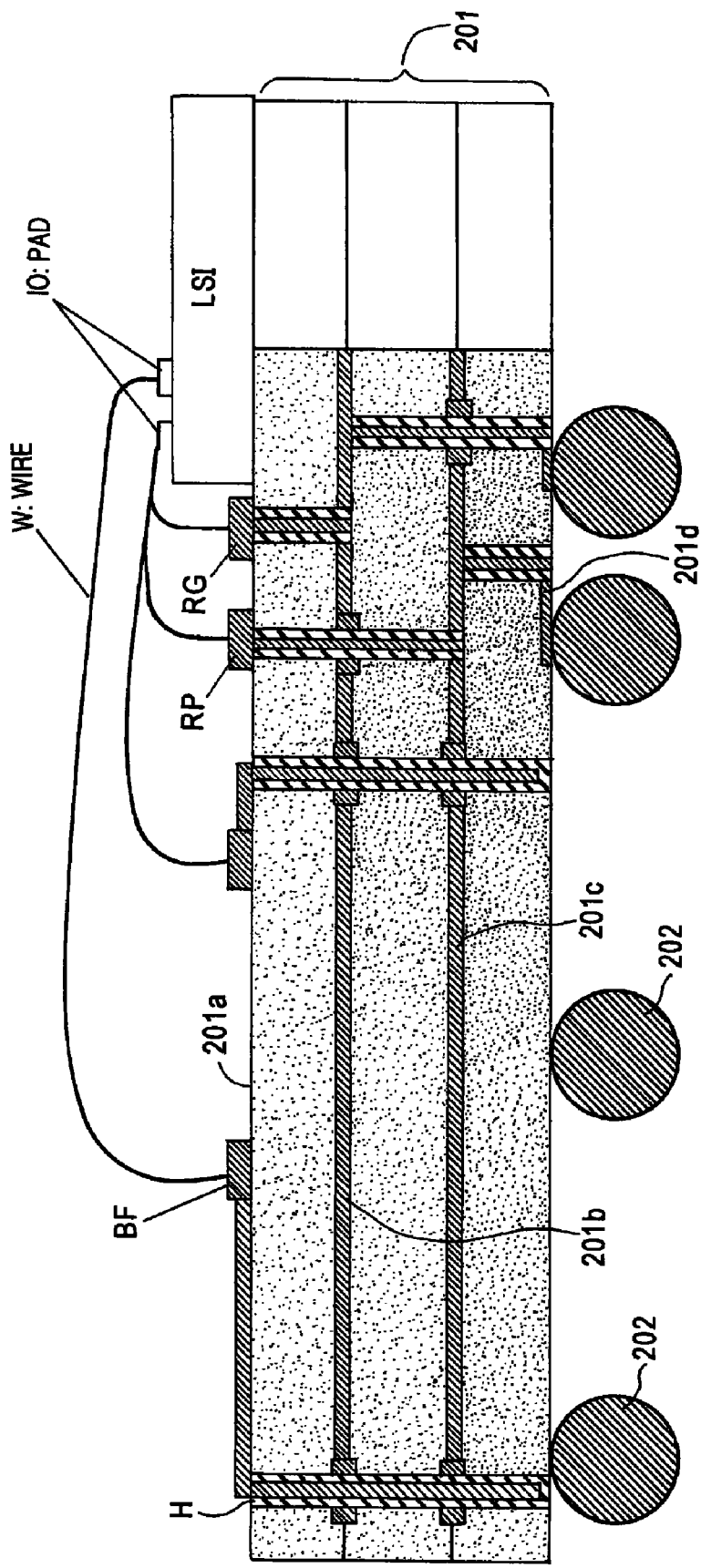
FIG. 15 is an explanatory view showing a designing method according to a second embodiment of the invention.

As shown in a schematic sectional view of FIG. 15, the package is constituted by a package substrate 201 having a four-layer structure including a surface layer 201a having a surface layer wiring, a power layer 201b constituting a power plane, a ground layer 201c constituting a ground plane, and a lowermost layer 201d having a lowermost layer wiring constituting a ball pad for forming a ball. A metal layer constituting the ground layer and the power layer in the package substrate 201 is formed by patterning a copper foil to have an occupation area which is equal to or greater than 80% of a substrate surface. These four layers, that is, the surface layer, the power layer, the ground layer and the lowermost layer are laminated through an insulating layer and are connected to respective terminals through an inner via H. A ball 202 is formed on the lowermost layer 201d to constitute an external connecting terminal and face mounting is carried out over a wiring pattern of a printed wiring board (100).

The embodiment is characterized in that the result of the design of the printed wiring board described in the first embodiment is used as input data to be used for designing a package substrate to mount an LSI chip when designing the package substrate, for example.

Figure 16:
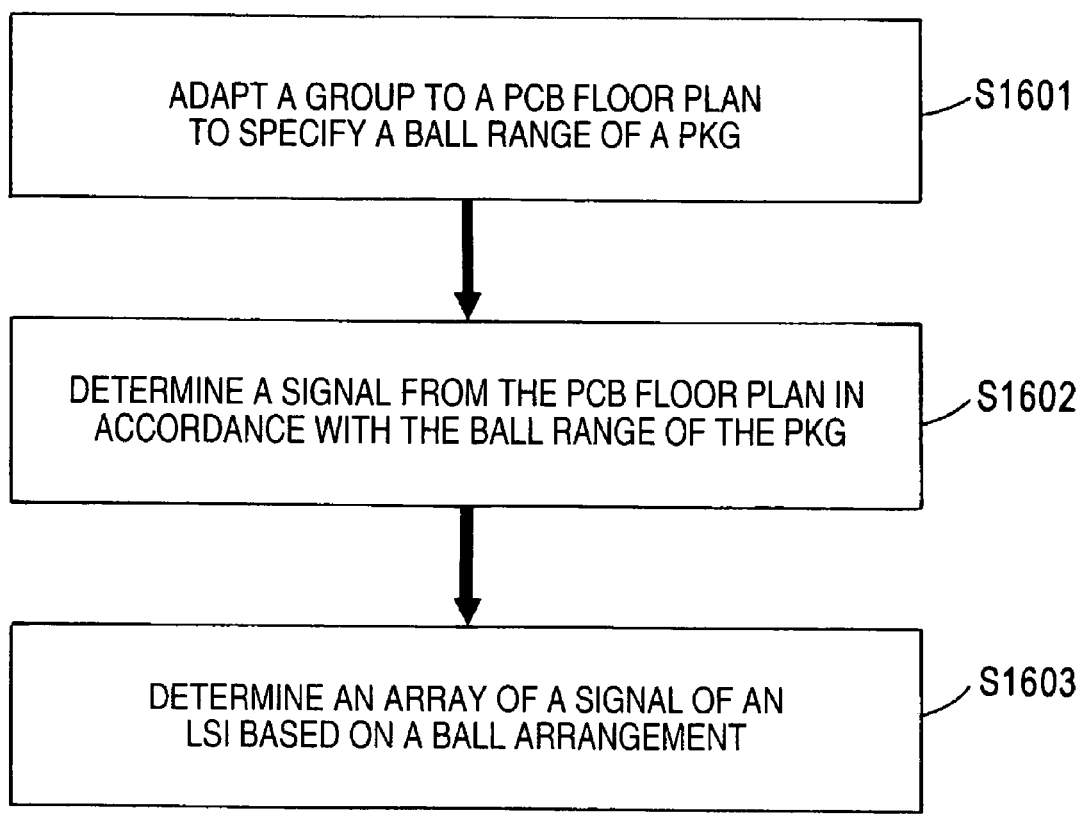
FIG. 16 is an explanatory diagram showing the designing method according to the second embodiment of the invention.

A flowchart for the method is shown in FIG. 16. First of all, a ball range of the package substrate is designated corresponding to a floor plan of a printed wiring board from a result of the design of the printed wiring board (Step 1601). In other words, for example, a forming range of the ball 202 is determined corresponding to a presence range of an inward end 302 of a wiring pattern 301 shown in FIG. 14.

Subsequently, a position of a signal line is determined from the floor plan of the printed wiring board corresponding to the forming range of the ball 202 on the package substrate (Step 1602).

Then, an array of a signal of the LSI is determined based on a ball arrangement (Step 1603).

According to the method, the signal arrangement of the package substrate is determined in consideration of the printed wiring board. Therefore, it is possible to implement a wiring which has no torsion and is excellent in an electrical characteristic.

Depending on a position on the printed wiring board in which a component is disposed, it is also possible to carry out grouping of the signal, thereby designing a package.

Figure 17:
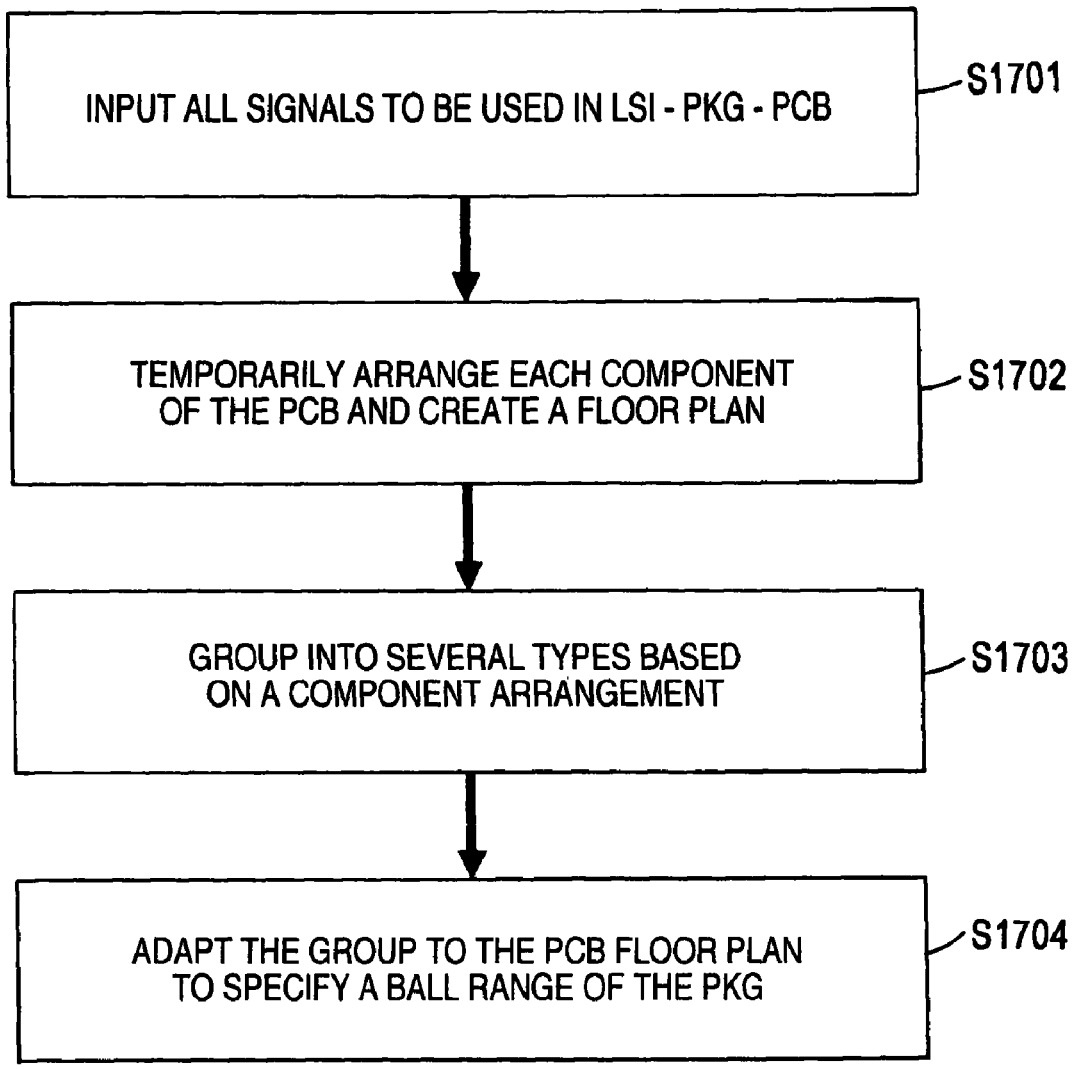
FIG. 17 is an explanatory diagram showing the designing method according to the second embodiment of the invention.

Next, FIG. 17 is a flowchart showing a method of determining an array of a signal using the grouping of the signal in the package.

First of all, all signals to be used in an LSI—package printed wiring board are input (Step 1701).

Subsequently, each component to be mounted on the printed wiring board is temporarily arranged to create a floor plan (Step 1702).

Based on the arrangement of the component, grouping into several types is carried out (Step 1703).

Then, the group is adapted to the floor plan of the printed wiring board to designate a ball arrangement range of the package (Step 1704).

According to the method, the signal grouping is carried out depending on the position on the printed wiring board in which the component is arranged. Therefore, it is possible to implement a wiring which has no torsion and is excellent in an electrical characteristic.

For example, in the package substrate 201 of the package shown in FIG. 14, a ball arrangement region BA is the ball arrangement range.

Figure 18:
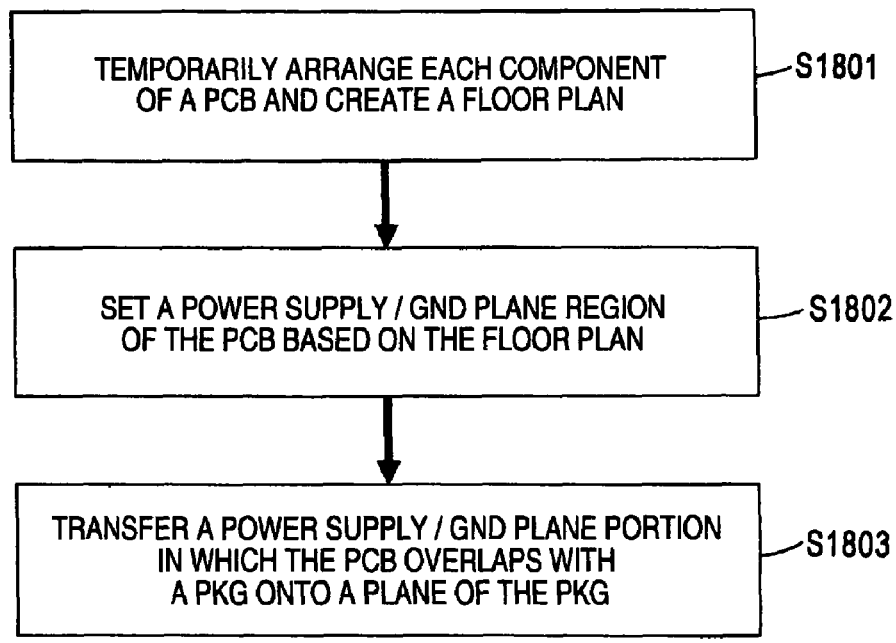
FIG. 18 is an explanatory diagram showing the designing method according to the second embodiment of the invention.

Next, description will be given to a method of executing the arrangement of the component in the package and a creation of a power plane depending on a power division. FIG. 18 is a flowchart and FIG. 19 is an explanatory view showing the same.

First of all, each component of the printed wiring board 100 is arranged to create a floor plan (Step 1801). Based on the floor plan, then, a power and ground plane region of the printed wiring board is set (Step 1802).

Figure 19:
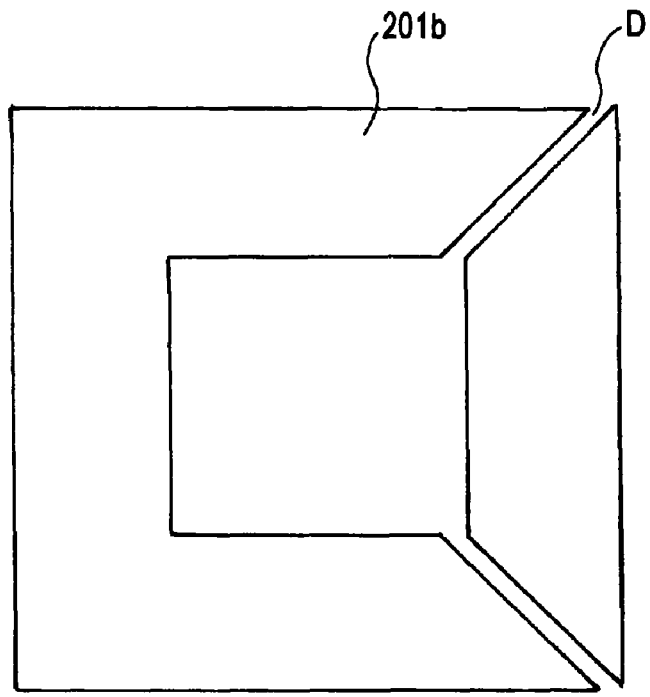
FIG. 19 is an explanatory view showing a method of designing a package according to the second embodiment of the invention.

Finally, a power and ground plane portion in which the printed wiring board 100 and the package substrate 201 overlap each other is transferred onto the plane of the package substrate to form a structure in which a power plane 201b is divided into three parts through a boundary line D as shown in FIG. 19 (Step 1803).

According to the structure, an easiness of a power design is enhanced. By the creation of the power plane depending on the power division, moreover, the easiness of the power design is enhanced. Furthermore, it is possible to reduce a power loss.

Thus, there is used the package substrate having the multilayer structure comprising a plurality of conductor layers including the power plane for each power unit in such a manner that the power plane corresponds to a region including the power plane on the mounting substrate. Therefore, a wiring can easily be carried out and a size can be reduced.

The design is carried out in such a manner that the conductor layer constituting the package substrate includes a power ring and a wiring in the package substrate has no intersecting region through the power ring. Consequently, a degree of freedom of the wiring can be enhanced more greatly and a parasitic capacitance can be reduced, and it is possible to obtain a package which has a small size and can carry out a high speed driving operation.

According to the method, moreover, the package substrate is designed after the design of the printed wiring board. Therefore, it is possible to carry out the design based on connecting information from a semiconductor integrated circuit to be a target to a peripheral component of the semiconductor integrated circuit so as not to have an intersecting region.

By avoiding the intersecting region, thus, it is also possible to take a countermeasure against a heat radiation as well as a noise.

Third Embodiment

Next, description will be given to a third embodiment according to the invention.

The method is characterized in that a plane of a package substrate is divided into four regions and a signal wiring is completed for each of the regions in a design of the package substrate.

Figure 20:
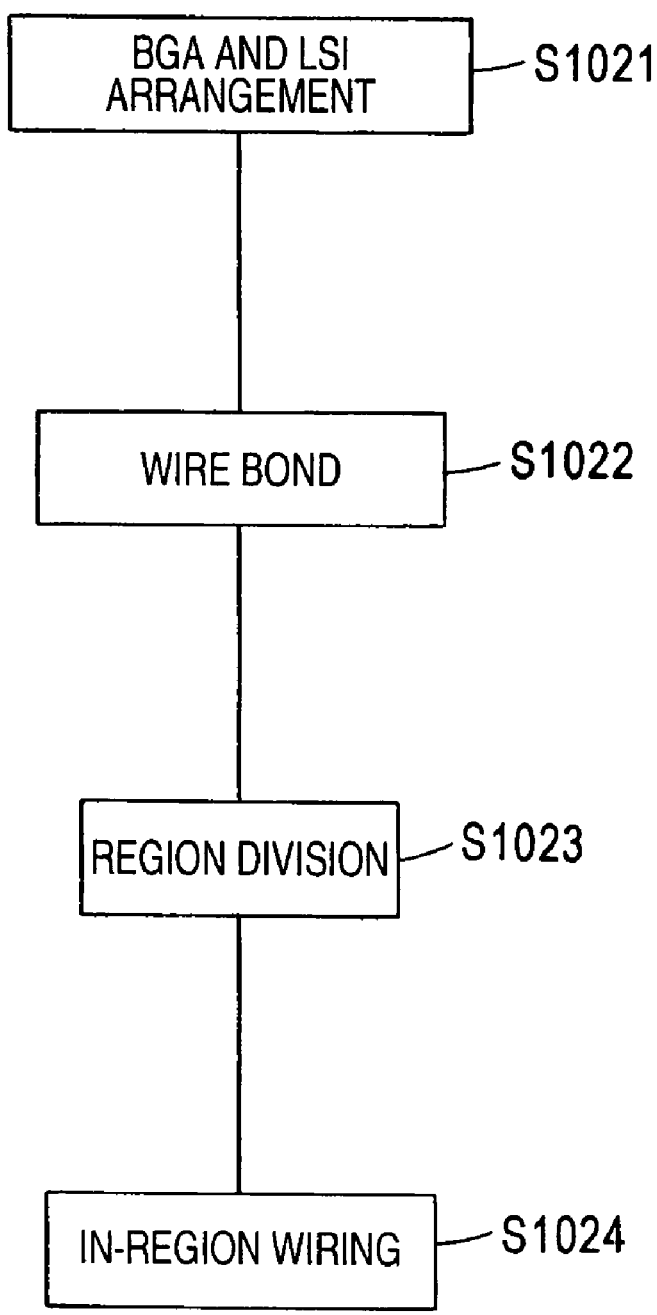
FIG. 20 is a flowchart showing a method of designing a package according to a third embodiment of the invention.
Figure 21A:
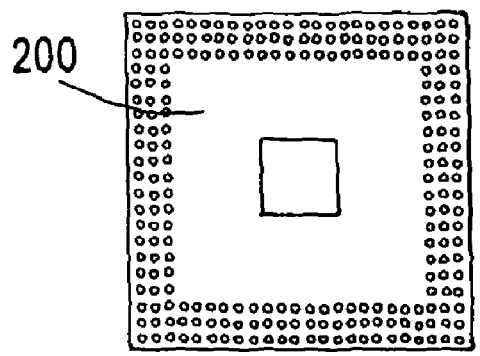
FIG. 21 is an explanatory view showing the designing method according to the third embodiment of the invention.
Figure 21B:
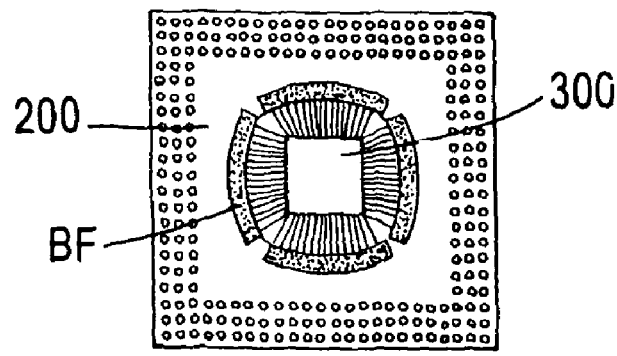
Figure 21C:
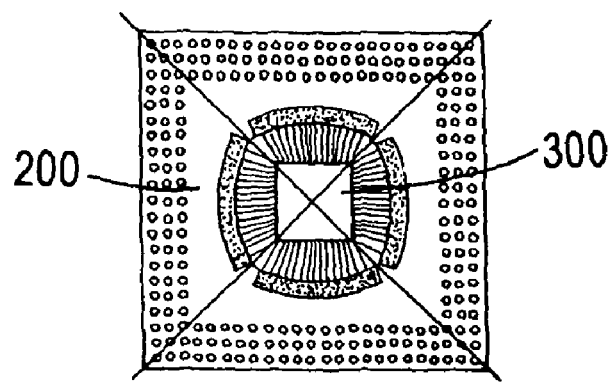
Figure 21D:
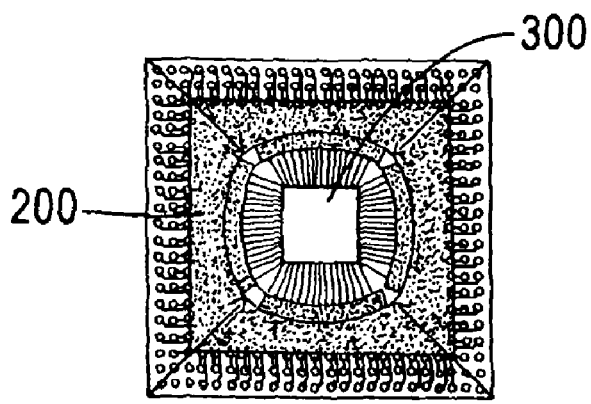

FIG. 20 is a flowchart showing a method of designing a package according to the embodiment, and particularly, a method of designing an in-region wiring thereof. FIG. 21 is an explanatory view showing the designing method.

In the method, first of all, a size, a shape and a ball arrangement of a ball (a ball grid array) to be an external connecting terminal of a package substrate 200 and a size and a pad arrangement of an LSI 300 are superposed as input information, and superposition data are output as shown in FIG. 21(*a*) (Step 1021).

Then, a thickness and a length of a wire W and a bond finger BF are set to be input information in addition to the superposition data, and the ball 202 and the pad of the LSI 300 are wired so as not to have an intersecting region, and design data subjected to the wiring as shown in FIG. 21(*b*) are output as output information (Step 1022).

Moreover, a region division is carried out by using, as the input information, design data subjected to the wiring and region dividing information (Step 1023). As shown in FIG. 21(*c*), a division into four parts is carried out along a diagonal line of the LSI. At the Step 1023, the design data subjected to the region division are output.

Furthermore, the design data subjected to the region division are used as the input information and the wiring is executed to be completed in the region as a wiring restriction (Step 1024). Thus, the wiring is sequentially executed for each region. As shown in FIG. 21(*d*), the wiring for all of the regions is completed.

By carrying out the wiring through a division every region, thus, it is possible to lessen data to interfere, thereby increasing a speed of a processing. Also in the case in which a correction is to be performed later, it is sufficient that only the inner part of the region is taken into consideration. Therefore, the correction processing can also be carried out easily.

While the region dividing step 1023 is executed after the connecting step 1022 through the wire bond in the embodiment, the region dividing step 1023 may be executed prior to the connecting step 1022 through the wire bond.

Fourth Embodiment

Next, description will be given to a fourth embodiment according to the invention.

While the plane of the package substrate is divided into four regions in the design of the package substrate and the signal wiring is completed for each region in the embodiment, the fourth embodiment is characterized in that the plane is divided into eight regions.

As shown in FIGS. 22(*a*) and 22(*b*), a ball 202 is disposed on a package substrate 201, and an LSI 300 is superposed thereon to form a square region on inner coordinates at an innermost periphery of a ball point, thereby creating an outermost circumferential frame LA1 of a wiring region. An innermost circumferential frame LA2 to be an octagonal region is created in order to surround a full bond finger BF. Then, a region between the outermost circumferential frame LA1 and the innermost circumferential frame LA2 is extracted by a logical operation and is set to be a wiring region WA. Thereafter, a region obtained by a division through a diagonal line is further divided into two parts and a one-eighth region is formed.

By the eight-division, it is possible to further simplify the wiring as compared with the case of the four-division.

Fifth Embodiment

Next, description will be given to a fifth embodiment according to the invention.

While the plane of the package substrate is divided into the four or eight regions in the design of the package substrate to complete the signal wiring every region in the third and fourth embodiments, description will be given to a design of a wiring pattern for connecting a ball 202 to a bond finger BF in the fifth embodiment. A package substrate 200 is constituted by four wiring layers including a surface layer wiring 201*a*, a power plane 201*b*, a ground plane 201*c* and a lowermost layer wiring 201*d* in the same manner as shown in FIG. 15, and a protruded portion is formed on the lowermost layer wiring 201*d* to constitute a ball 202 to be an external connecting terminal. The surface layer wiring 201*a* comprises a bond finger including a bond portion formed like a band along a peripheral edge of a semiconductor integrated circuit and a finger portion extended to a position placed just above the external connecting terminal 202 to be connected from the bond portion, and a tip of the bond finger is connected to the corresponding external connecting terminal 202 through a via formed on the finger.

The bond finger is implemented by the surface layer wiring 201*a*.

First of all, as shown in FIG. 23, the grouping of the ball 202 to be the external connecting terminal formed on the package substrate is carried out. The same group is formed every longitudinal line and numbering is carried out.

Also in the bonding finger, then, the numbering is carried out for each group element number of the ball 202. Since the ball has three lines, the bond finger is arranged to have elements every three lines, for example, C1, 2, 3, D1, 2, 3 . . . except for A1, B1 and B2 on an end.

Figure 24:
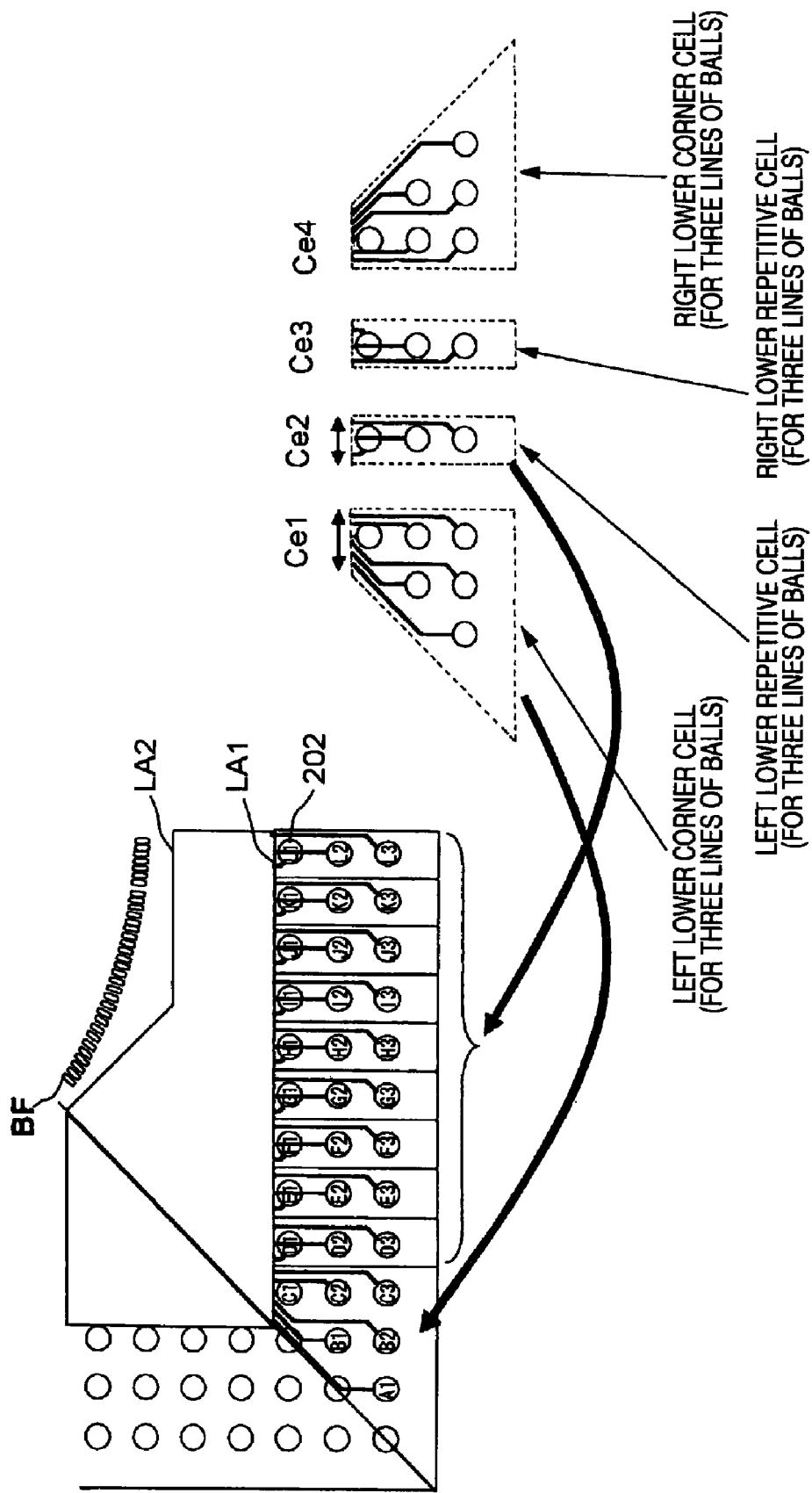
FIG. 24 is an explanatory view showing the method of designing a package according to the fifth embodiment of the invention.

As shown in FIG. 24, thereafter, a wiring cell prepared for each group is disposed. In other words, corresponding wiring cells Ce1 and Ce2 are prepared for a corner portion and a repeating portion. Two types are prepared every one-eighth division. However, corresponding wiring cells Ce3 and Ce4 which are inverted transversely on each side are prepared so that four types of wiring cells in total are prepared.

Figure 25:
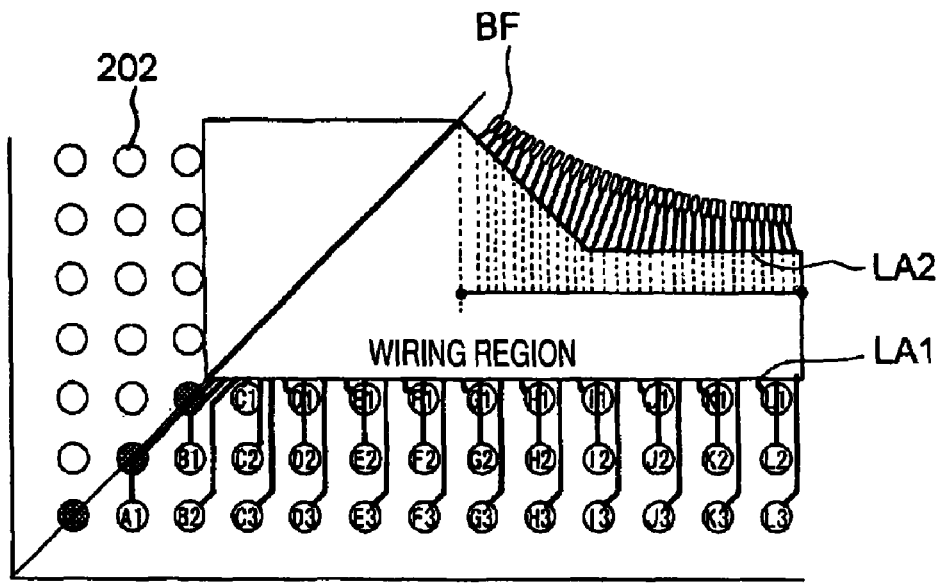
FIG. 25 is an explanatory view showing the method of designing a package according to the fifth embodiment of the invention.

Thus, the wiring cells Ce1, Ce2, Ce3 and Ce4 are arranged and a point on which a lead wire from the bond finger intersects an innermost circumferential frame LA2 is set to be a bond finger leading point, and a lead wire is provided in such a manner that an interval is uniform on a segment A as shown in FIG. 25.

Figure 26:
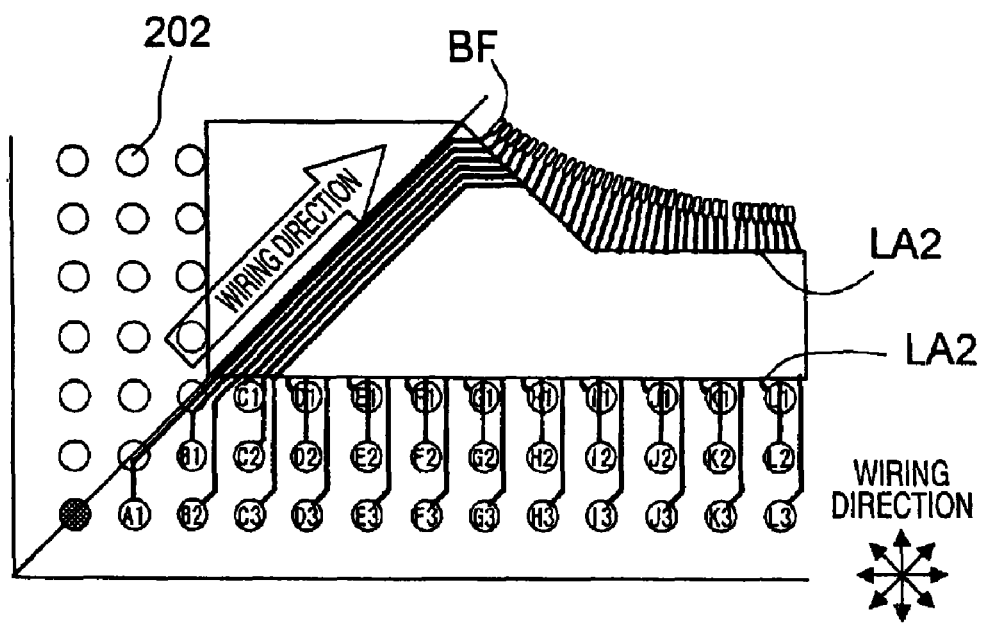
FIG. 26 is an explanatory view showing the method of designing a package according to the fifth embodiment of the invention.

As shown in FIG. 26, then, a ball leading point and a leading point from the bond finger, that is, the innermost circumferential frame LA2 and an outermost circumferential frame LA1 are wired. The wiring is started from the corner portion and a processing is carried out for each group. The wiring is executed like a grid with a wiring direction maintained from a wiring end of a group in which the leading has already been completed to an end in a wiring enable region. An oblique direction is set to be main. If impossible, the wiring is executed in an upward direction or a transverse direction.

Figure 27:
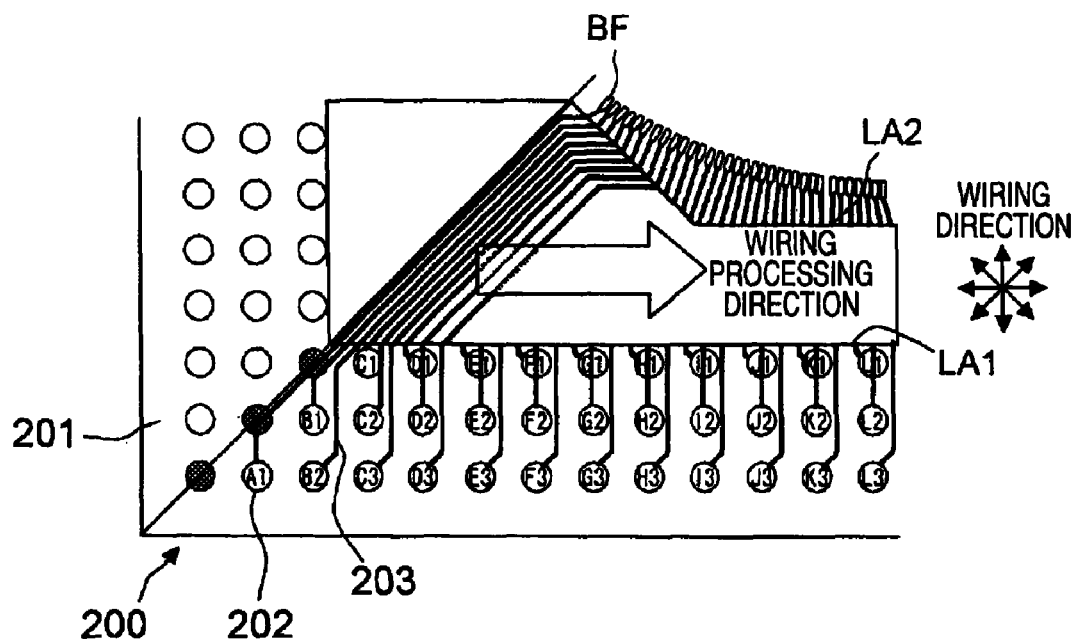
FIG. 27 is an explanatory view showing the method of designing a package according to the fifth embodiment of the invention.
Figure 28:
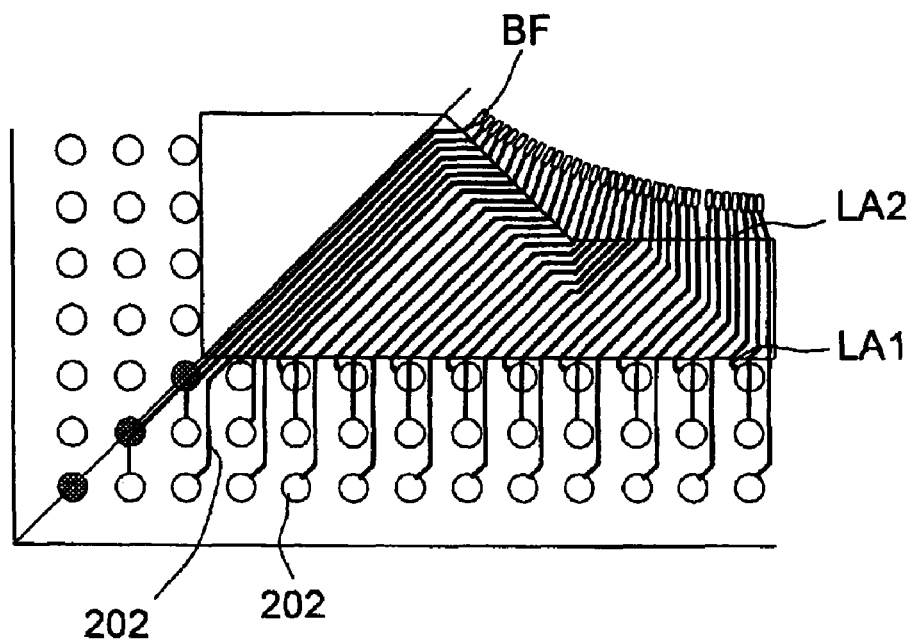
FIG. 28 is an explanatory view showing the method of designing a package according to the fifth embodiment of the invention.

Thus, the wiring is sequentially carried out as shown in FIG. 27 and the wiring is completed as shown in FIG. 28.

Figures 29A, 29B:
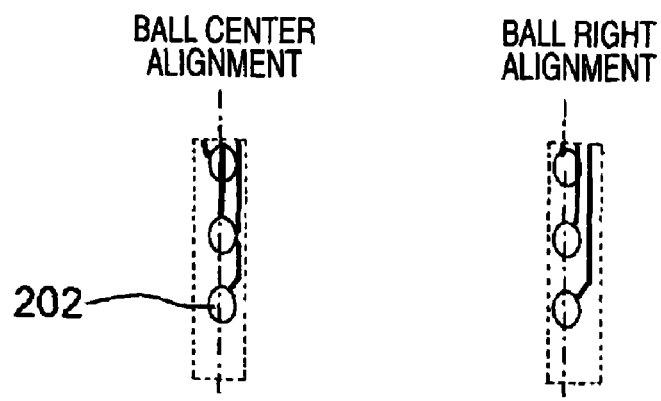
FIG. 29 is an explanatory view showing the method of designing a package according to the fifth embodiment of the invention.

For the balls in three lines, three wirings are required. As shown in FIGS. 29(a) and 29(b), it is possible to use the ball 202 which is aligned on a center with respect to a wiring 203 and the ball 202 which is aligned on a right side.

As a variant, in the case in which a direct wiring from the ball lead to the bond finger is carried out, the wiring is obtained as shown in FIG. 29.

According to the method, the grouping is carried out for each terminal to be connected in a divided region, corresponding terminals in the group are wired between the ball leading point and the leading point from the bond finger, that is, the innermost circumferential frame LA2 and the outermost circumferential frame LA1. Consequently, it is possible to easily implement a uniform wiring having no intersection. Thus, it is possible to form a package substrate which is excellent in an unnecessary radiant characteristic and a heat characteristic.

Sixth Embodiment

Next, description will be given to a sixth embodiment according to the invention.

In the fifth embodiment, the description has been given to the design of the wiring pattern of the surface layer wiring for the connection of the ball 202 to the bond finger BF in the design of the package substrate. In the sixth embodiment, with reference to FIGS. 30 to 35, description will be given to a design of a wiring pattern in which a bond finger is constituted in two lines, a surface layer wiring from the bond finger on an inside to a via is formed and a connection to the ball 202 is carried out through a lowermost layer wiring. FIG. 36 is a sectional explanatory view.

Figure 30:
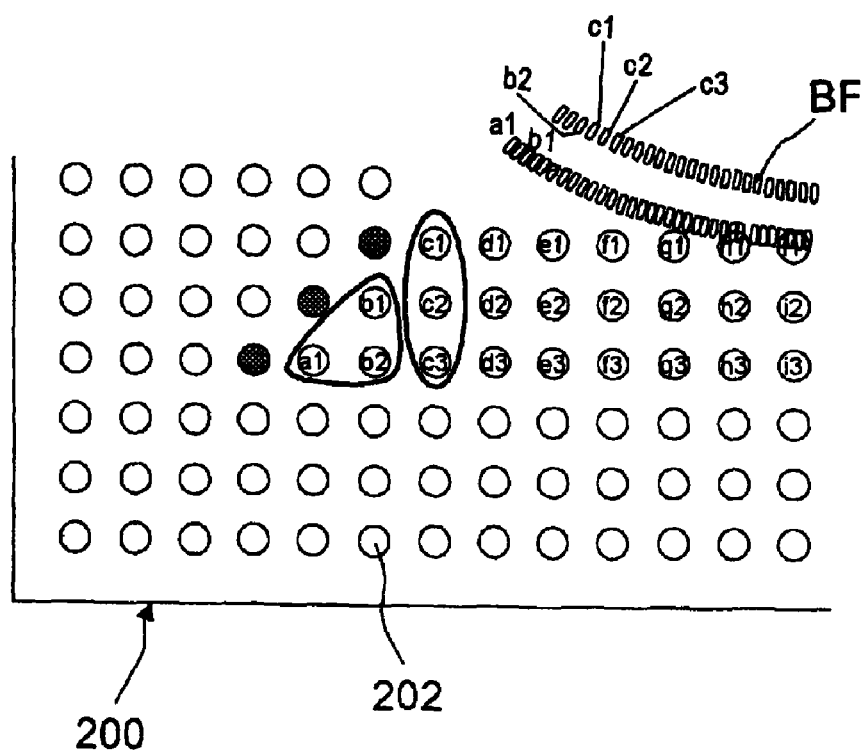
FIG. 30 is an explanatory view showing a method of designing a package according to a sixth embodiment of the invention.

First of all, as shown in FIG. 30, the grouping of the ball 202 to be an external connecting terminal formed on the package substrate is carried out. Numbering is carried out to set the same group every ball in three lines positioned on an inside of three lines of an outermost layer.

The bond finger is also disposed on the inside of A1, B1, B2, C1, 2, 3, D1, 2 and 3 shown in FIG. 23. The numbering is carried out each number of group elements of the ball 202 in each row. Since the balls are disposed in three columns, the bond finger is disposed in order to have elements every three columns in each row like c1, c2, c3, d1, d2, d3 except for a1, b1 and b2 on an end.

Figure 31:
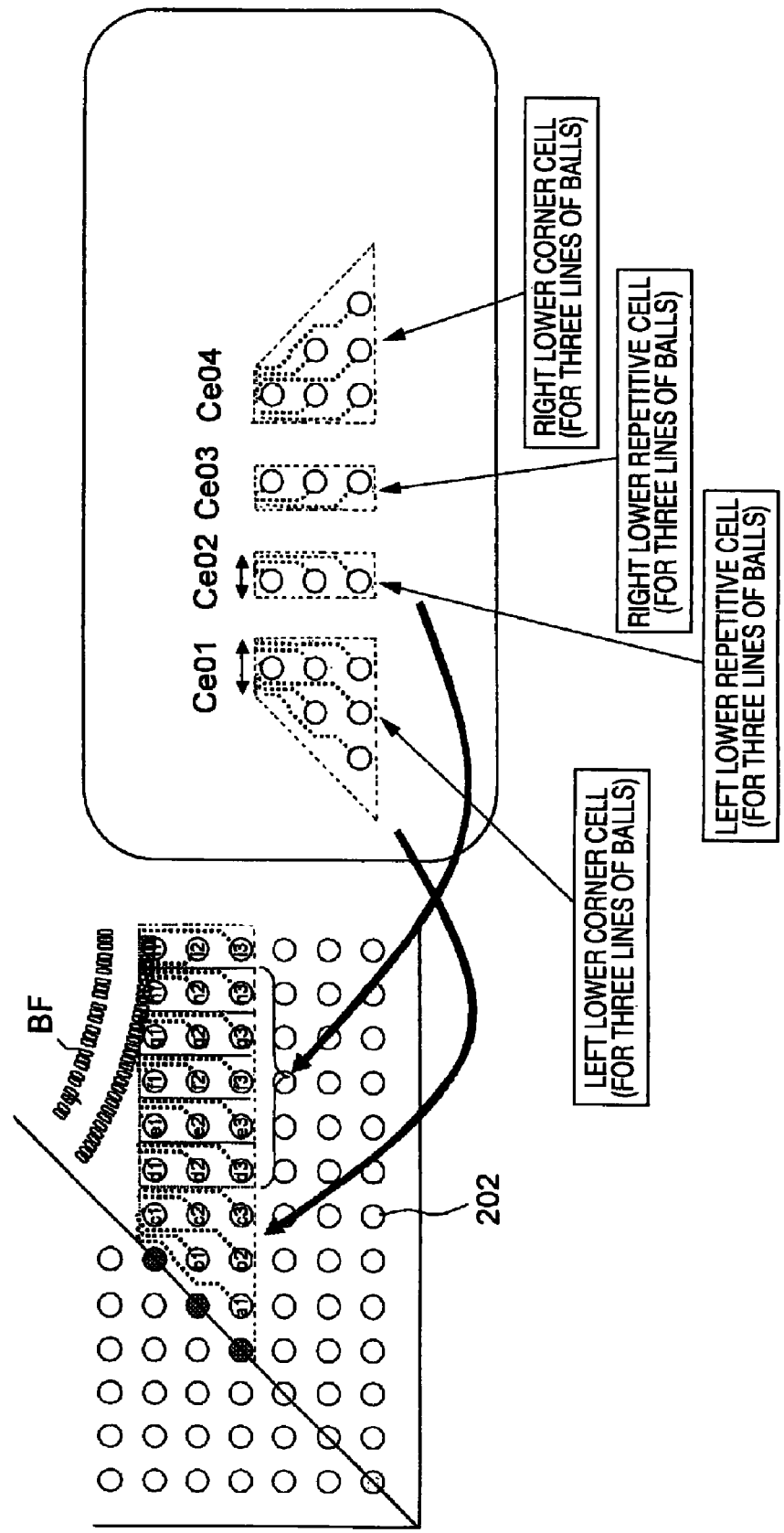
FIG. 31 is an explanatory view showing the method of designing a package according to the sixth embodiment of the invention.

As shown in FIG. 31, then, wiring cells prepared for each group are arranged. In other words, corresponding wiring cells Ce01 and Ce02 are prepared in a corner portion and a repeating portion. Although there are two types every division into eight parts, corresponding wiring cells C0e3 and Ce04 having sides inverted transversely are prepared and four types of wiring cells in total are prepared.

Figure 32:
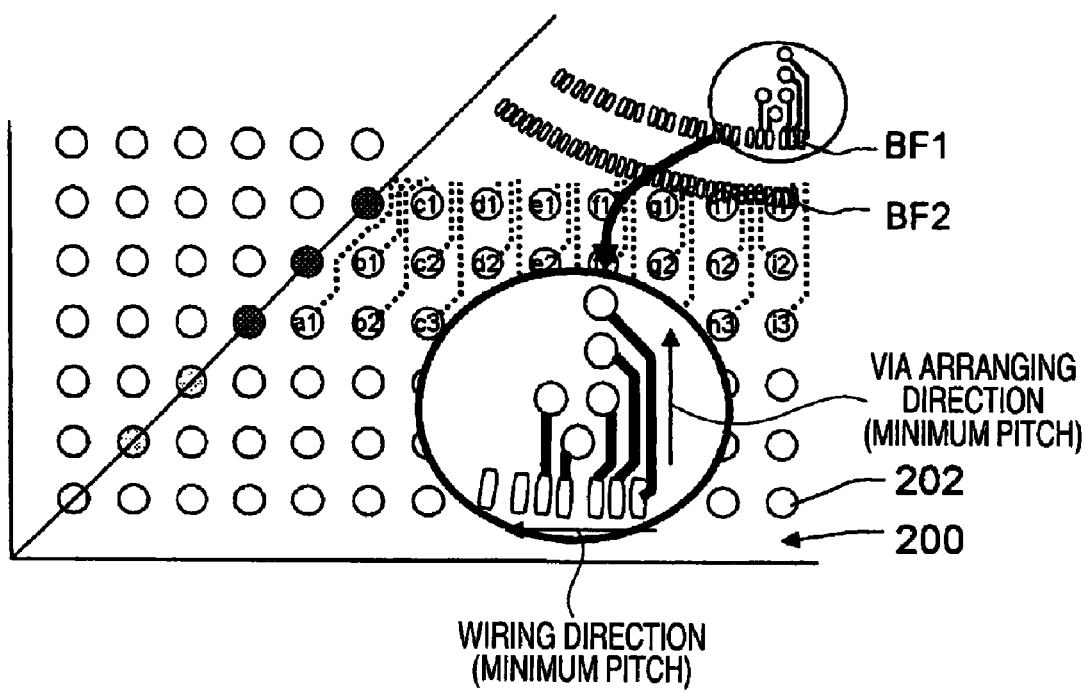
FIG. 32 is an explanatory view showing the method of designing a package according to the sixth embodiment of the invention.

As shown in FIG. 32, thus, the wiring cells Ce01, CE02, Ce03 and CE04 are arranged to form a surface layer wiring from the bond finger to the via. Herein, the wiring is carried out toward a right side to create the via. At this time, a minimum rule is applied to the wiring and a via pitch. The via is arranged in an upward direction, and an X-coordinate direction is shifted to a negative direction when the arrangement cannot be carried out. Thus, the arrangement in the upward direction from below is repeated.

Figure 33:
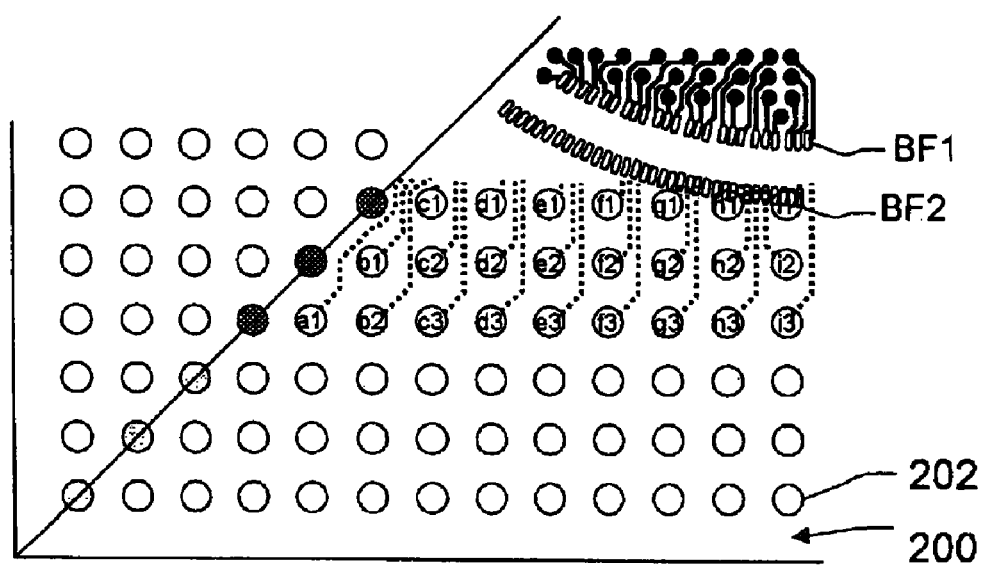
FIG. 33 is an explanatory view showing the method of designing a package according to the sixth embodiment of the invention.

Consequently, the surface layer wiring and the via are generated as shown in FIG. 33.

Figure 34:
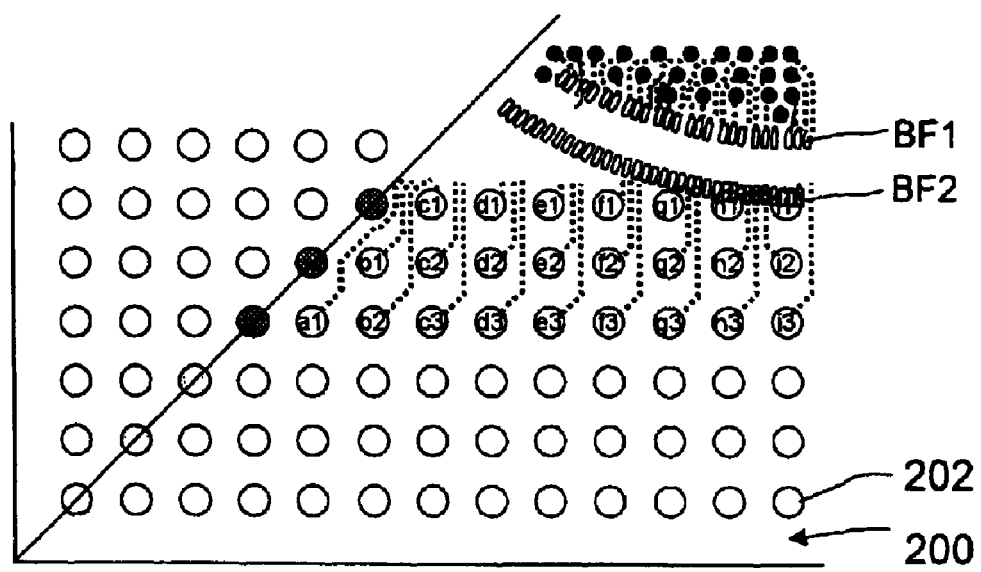
FIG. 34 is an explanatory view showing the method of designing a package according to the sixth embodiment of the invention.

A lowermost layer wiring is drawn to trace the surface layer wiring from the created via, and is led to a portion placed just below the bond finger as shown in FIG. 34.

Figure 35:
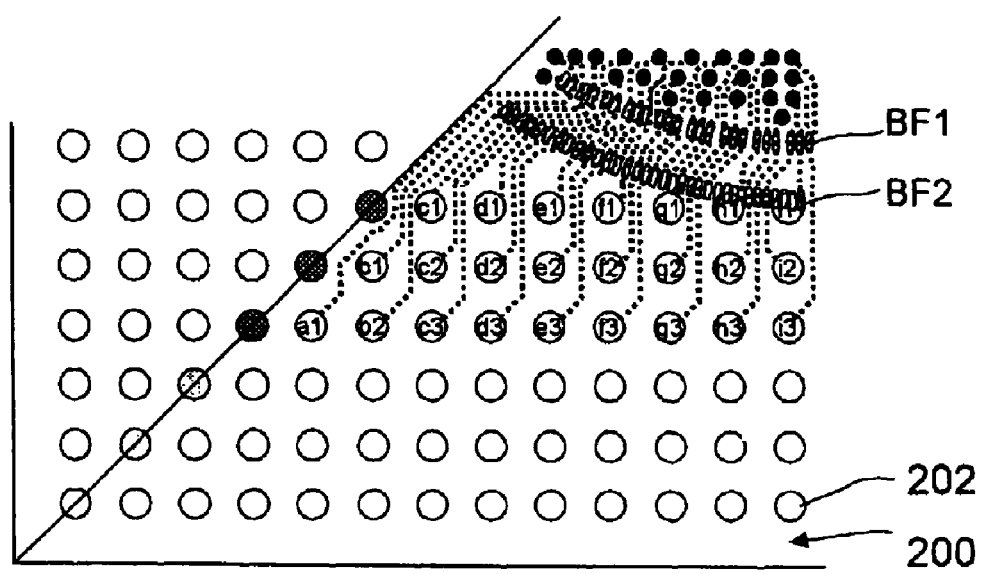
FIG. 35 is an explanatory view showing the method of designing a package according to the sixth embodiment of the invention.
Figure 36:
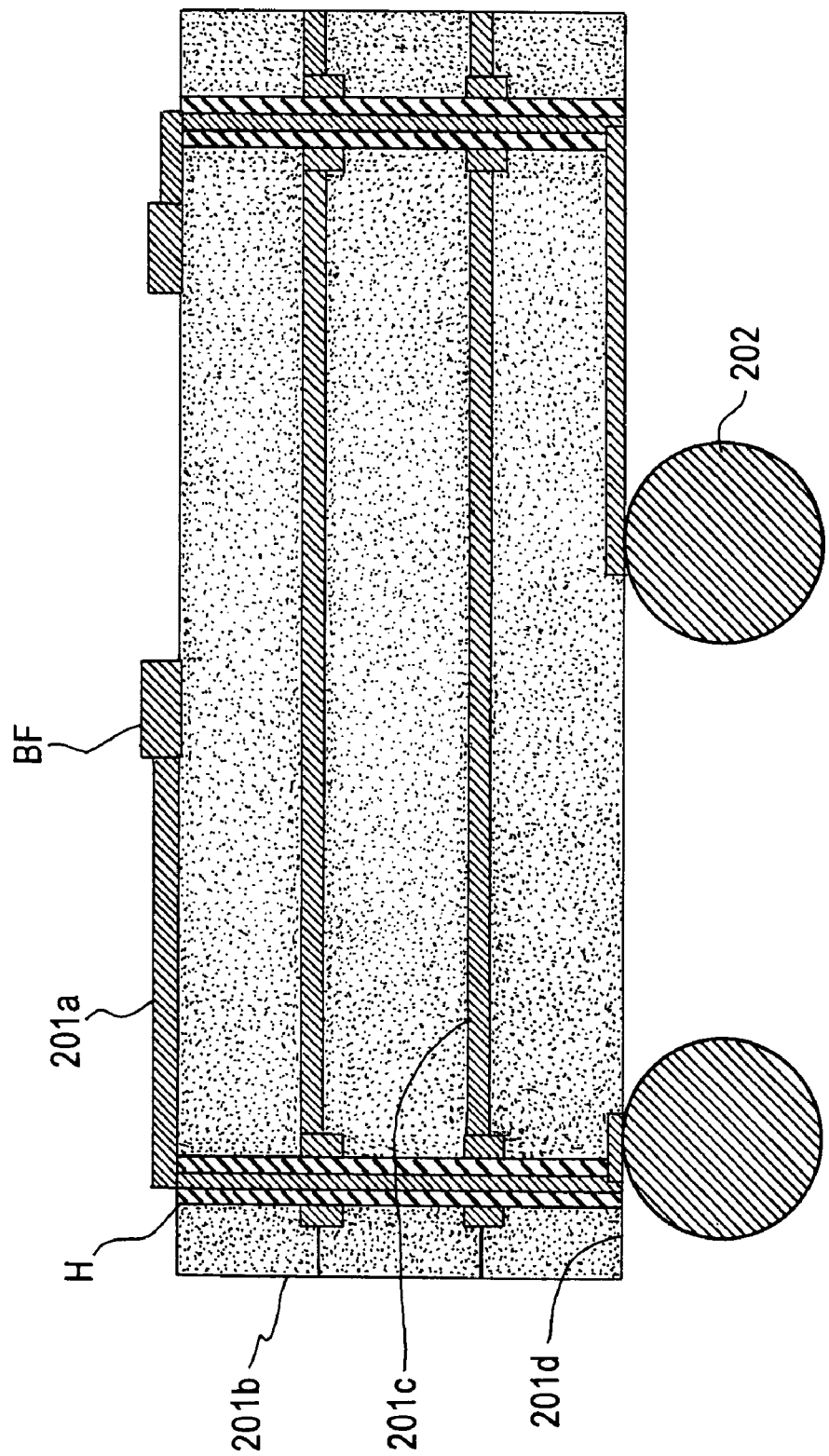
FIG. 36 is an explanatory sectional view showing the package according to the sixth embodiment of the invention.

Finally, the ball lead and the via are sequentially connected through a grid wiring so that a wiring shown in FIG. 35 is completed.

FIG. 36 shows an A-A section.

Thus, it is possible to efficiently form a package substrate having a high reliability also in an increase in the number of terminals.

Seventh Embodiment

Next, description will be given to a seventh embodiment according to the invention.

In the embodiment, description will be given to a net assignment in mounting of a wire bonding type. FIG. 37 is a flowchart and FIG. 38 shows a relationship between a package substrate 200 and an LSI 300.

Figure 38:
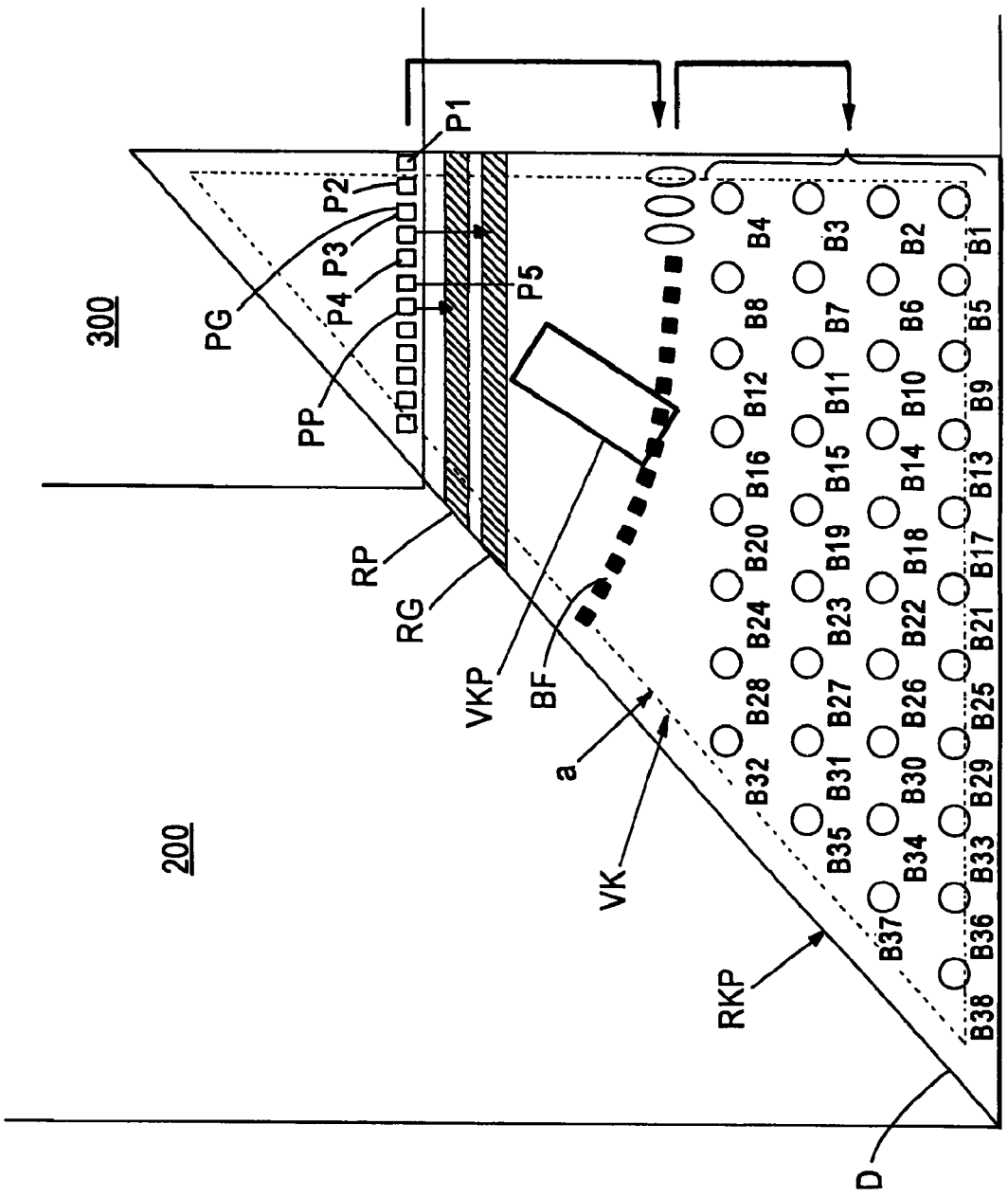
FIG. 38 is an explanatory view showing the method of designing a package according to the seventh embodiment of the invention.

Description will be given to a region division in which the package substrate 200 is divided into eight regions as shown in FIG. 38.

In the embodiment, as shown in FIG. 37(b), a designing apparatus 20 is previously provided with an automatic dividing portion (Routing keein) 21 for dividing a surface of a package substrate, a loop checking portion 22 for confirming whether a wiring for a connection of an input/output pad of an LSI to a ball is closed in a region, an intersection confirming portion 23 for confirming whether a wiring for a connection of the input/output pad of the LSI to the ball intersects each other in the region or not (a checking function in an arrangement of a bond finger and a wire), an automatic wiring portion 24 having an automatic wiring function, and a via arrangement limiting portion 25 having a function such as a via arrangement limiting function, and it is possible to easily carry out an automatic design at a high speed with a high precision.

First of all, a size, a shape and a ball arrangement of a ball 202 of a BGA in the package substrate 200, and a size of the LSI 300 and an arrangement of an I/O pad 302 are set to be input information, and related data of the BGA and LSI, that is, data obtained by superposing them are obtained (Step 3701).

The data are input as design data and region dividing information is obtained as output information in the automatic dividing portion 21 (Step 3702). Herein, it is checked whether the wiring is closed on a boundary of the region division in the loop checking portion 22 or not. If the wiring is not closed, the arrangement of the ball 202 and the I/O pad 302 is shifted.

By using the region dividing information, column grouping of the ball and the I/O pad is carried out by setting column grouping information as input information. Thus, design data subjected to the region division and the column grouping are obtained (Step 3703).

By using the region dividing information, the column grouping for the ball and the I/O pad is carried out by setting the column grouping information and I/O pad order defining information to be input information. Consequently, there are obtained design data subjected to the region division, the column grouping and order formation (Step 3704).

Furthermore, information for which the region division in a divided region, the column grouping and the I/O pad order are determined is set to be input information, and the ball and the input/output pad order are related for each column group in the divided region to carry out a connection through a bond finger BF. Then, the intersection confirming portion 23 confirms whether a wiring intersection is present or not. Although the same numbers are connected, I/O pads connected to a power ring 205 and a ground ring 206 are excluded. The power ring 205 and the ground ring 206 are directly subjected to wire bonding from power pads PP and PG. Thus, a net is propagated from a component having the net to a component having no net (a net assignment step 3705). The automatic wiring is carried out by using the automatic wiring portion 24 and the via arrangement limiting portion having the function of limiting the arrangement of a via. If one column is impossible for the bond finger on a rule basis, the number of stages is increased to carry out an automatic processing. In the automatic processing, a control is carried out based on an arrangement rule of the bond finger and that of the wire and a uniform arrangement is thus performed.

Consequently, it is possible to carry out a propagation to an optimum terminal in order to obtain information about a printed wiring board.

The wiring is carried out on a surface layer in principle. In the case in which the arrangement is hard to perform by only the surface layer, the wiring is carried out on the lowermost layer, that is, the ball forming layer as described above (see FIG. 32).

Figure 39:
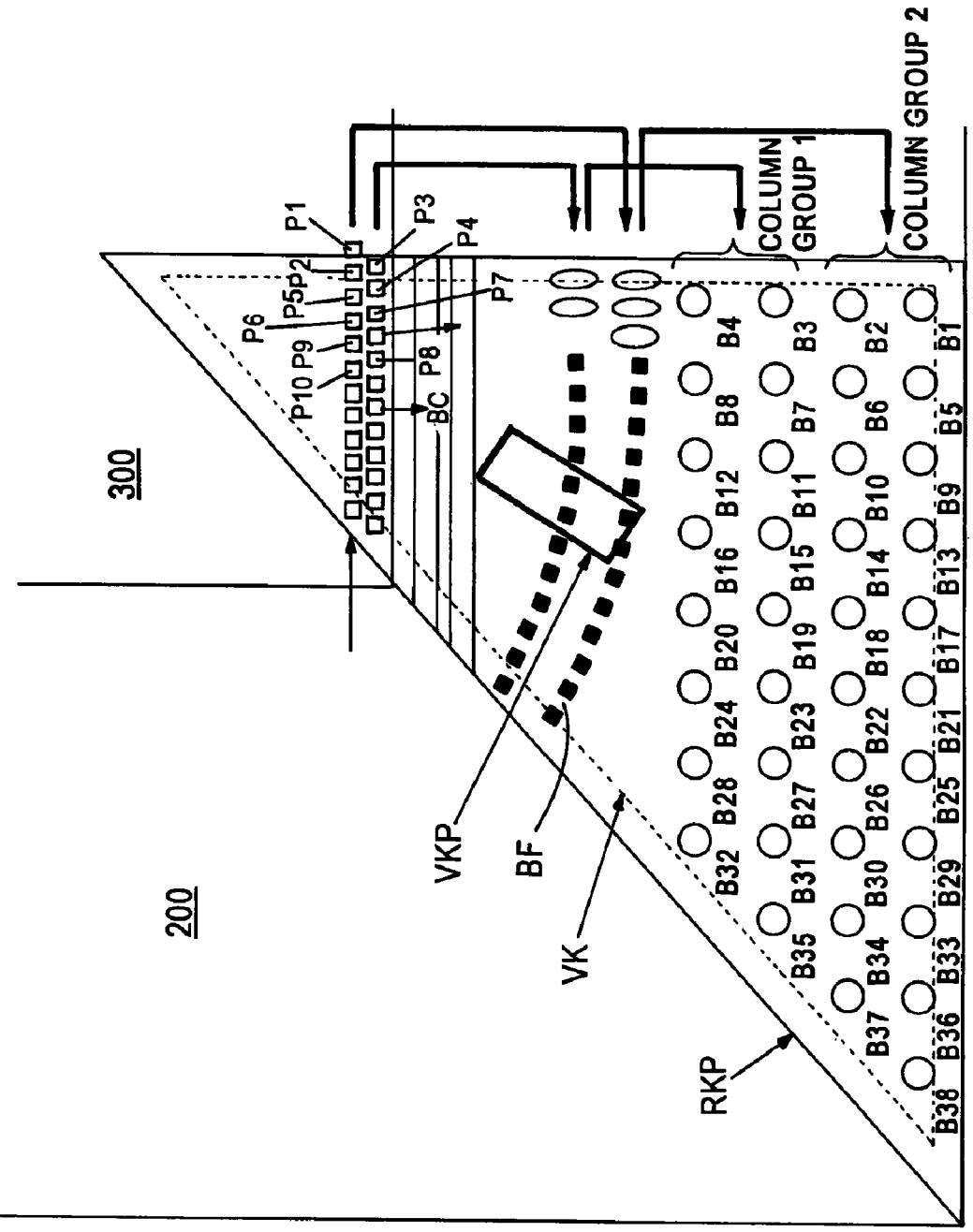
FIG. 39 is an explanatory view showing the method of designing a package according to the seventh embodiment of the invention.

This example is shown in FIG. 39. In the example of FIG. 39, a bond finger BF1 positioned on an inside of the package substrate is connected to an I/O pad P1 on an outside of the LSI 300, and furthermore, a bond finger BF2 positioned on an outside of the package substrate is connected to an I/O pad P2 on an inside of the LSI 300.

In the embodiment, moreover, a wiring forming region, that is, a region RKI in which the wiring is to be carried out is determined in consideration of a wiring role, and a wiring prohibiting region is formed in a region provided apart from a boundary line D of the region at a predetermined interval a. There is a region in which the via is not formed in a width of 2a obtained by adding the interval a between adjacent regions (Via keepin) in which vias are formed to the interval a. Consequently, a width of a power plane is maintained. When the via is formed, the power plane is removed around the region so that an area of the power plane is reduced and a current path becomes narrow or disconnected. By maintaining the region in which the via is not formed, thus, it is possible to ensure the current path. In other words, the current path in the power plane is maintained in a predetermined width and the power plane is effectively ensured, and furthermore, the power plane can be prevented from being a floating region.

Moreover, the automatic dividing portion (Routing keein) 21, the loop checking portion 22, the intersection confirming portion 23, the automatic wiring portion 24 and the via arrangement limiting portion 25 are previously provided in the designing apparatus 20. Therefore, an automatic wiring can be carried out very easily and it is possible to form a package substrate which is excellent in an unnecessary radiating characteristic and a heat characteristic.

Eighth Embodiment

Next, description will be given to an eighth embodiment according to the invention.

Figure 40:
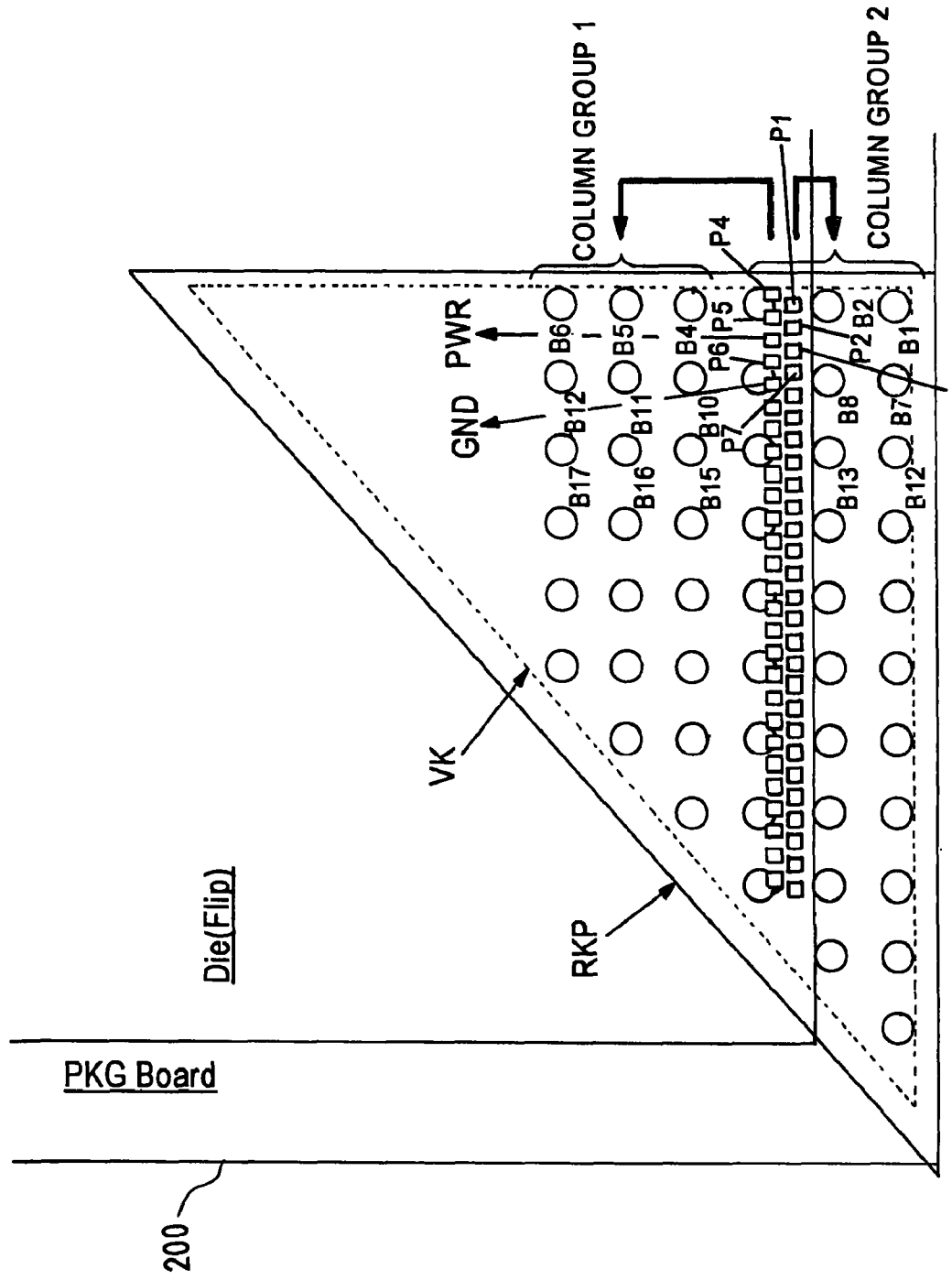
FIG. 40 is an explanatory view showing a method of designing a package according to an eighth embodiment of the invention.

In the embodiment, description will be given to a net assignment in mounting of a flip chip type. FIG. 40 shows a relationship between a package substrate 200 and an LSI 300F of the flip chip type.

Description will be given to the package substrate 200 divided into eight regions as shown in FIG. 40. The package substrate 200 has a four-layer structure including a surface layer wiring including a pad BP to be directly connected to the LSI 300F, a power plane, a ground plane and a lowermost layer wiring forming a ball 202.

FIG. 40 shows an arrangement of pads PP and PG of the LSI to be connected to the power plane and the ground plane of the package substrate 200, and pads PS 1 . . . PS 7 . . . for a connection to a signal line. The surface layer wiring of the package substrate 200 is also provided with a bonding pad BP corresponding to the pads PP and PG of the LSI and pads PS 1. PS 7

As shown in an arrow S1, balls 202-4, 5 and 6 on an inside are provided with a wiring pattern by using the surface layer wiring from the pads PSs 4, 5 and 6.

As shown in an arrow S2, moreover, balls 202-1, 2 and 7 on an outside are provided with a wiring pattern by using the lowermost layer wiring through a via (not shown) from the pads PSs 1, 2 and 7.

Since an actual design is carried out in the same manner as in the embodiments, description will be omitted. In an automatic wiring, the wiring is carried out on the surface layer and the lowermost layer in principle. The outside pad is subjected to a lowermost layer wiring through a via, and the inside pad is subjected to a surface layer wiring.

Thus, it is also possible to apply the invention to a package substrate of a flip chip type in addition to a package substrate of a wire bonding type.

Ninth Embodiment

Next, description will be given to a ninth embodiment according to the invention.

Figure 41:
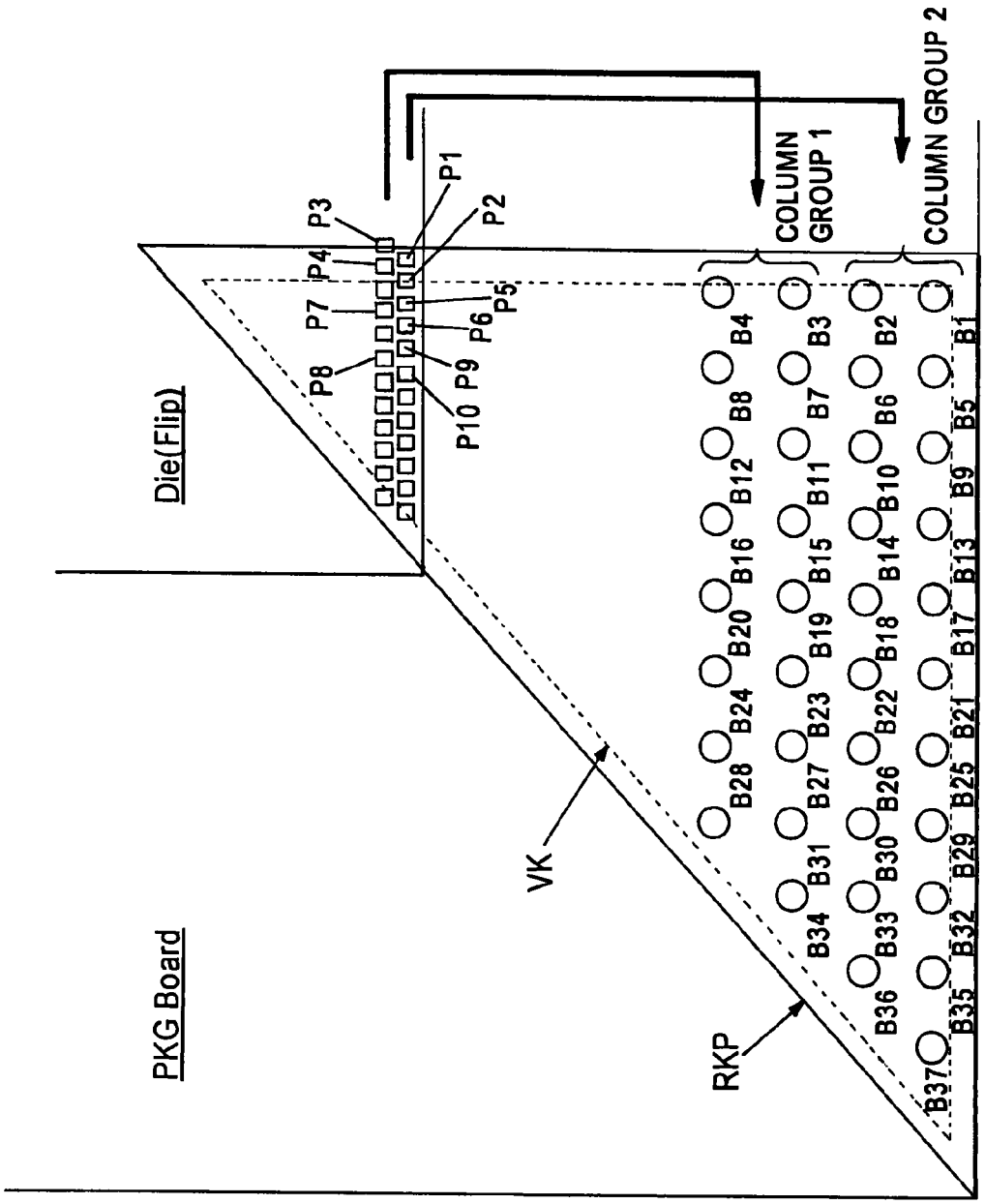
FIG. 41 is an explanatory view showing a method of designing a package according to a ninth embodiment of the invention.

In the embodiment, description will be given to a net assignment in mounting of a flip chip type in the same manner as in the eighth embodiment as shown in FIG. 41. However, the embodiment is different from the package substrate 200 shown in FIG. 40 in that an LSI 300F of a flip chip type is small and a ball is not disposed under the LSI 300F.

Description will be given to a package substrate 200 which is divided into eight regions as shown in FIG. 41. The package substrate 200 also has a four-layer structure including a surface layer wiring having a pad BP to be directly connected to the LSI 300F, a power plane, a ground plane and a lowermost layer wiring for forming a ball 202.

FIG. 41 shows an arrangement of pads PP and PG of the LSI which are to be connected to the power plane and the ground plane of the package substrate 200, and pads PS 1 . . . PS 7 . . . for a connection to a signal line. The bonding pad BP is also formed on the surface layer wiring of the package substrate 200 corresponding to the pads PP and PG of the LSI and the pads PS 1 ... PS 7 ....

As shown in an arrow S3, a wiring pattern is formed on balls 202-3, 4, 7 and 8 in two lines on an inside by using a surface layer wiring on the pads PSs 3, 4, 7 and 8 on an inside.

As shown in an arrow S4, moreover, a wiring pattern is formed by using a lowermost layer wiring through a via (not shown) from outside pads PSs 1, 2, 5, 6, 9 and 10 on an outside.

An actual design is carried out in the same manner as in the embodiments. Therefore, description will be omitted. In an automatic wiring, the wiring is performed on a surface layer and a lowermost layer in principle, and the lowermost layer wiring is carried out over the pad on the outside through a via and the surface layer wiring is carried out over the pad on the inside.

Also in the embodiments, thus, the package substrate is designed in such a manner that an external connecting terminal of the package substrate constituting a ball grid array divides a plane of the package substrate into eight regions and a signal wiring is completed for each of the regions. Therefore, it is possible to easily carry out a wiring with a high workability.

Tenth Embodiment

Next, description will be given to a tenth embodiment according to the invention.

Figure 42:
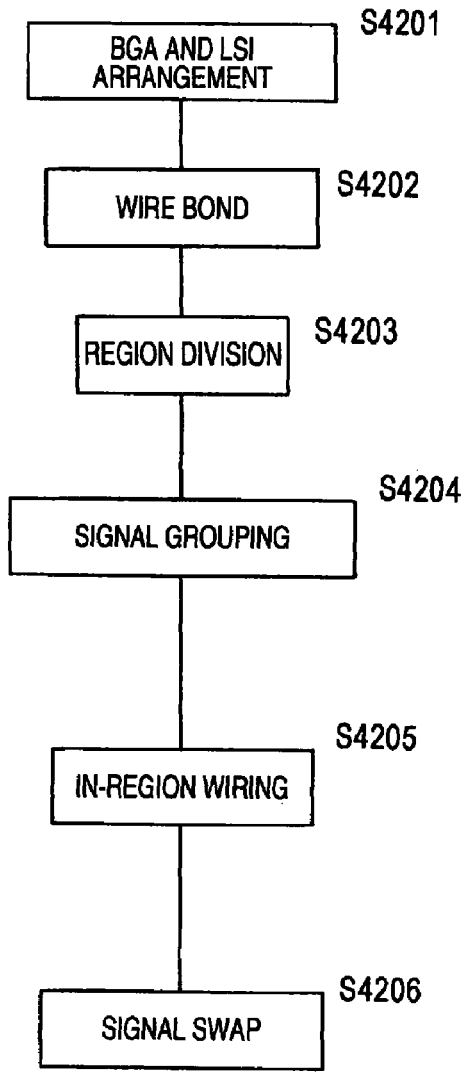
FIG. 42 is an explanatory diagram showing a method of designing a package according to a tenth embodiment of the invention.

In the embodiment, description will be given to grouping of a signal in a design of a package substrate and a swap of the signal as shown in FIG. 42.

First of all, a BGA and an LSI to be external connecting terminals are arranged (S4201), and a schematic design for wire bonding (S4202), a region division (S4203), signal grouping (S4204) and an in-region wiring (S4204) are carried out.

In the grouping, three trains of bond fingers and three vertical trains of balls are grouped as shown in FIGS. 23 to 28 in the fifth embodiment.

Then, the swap of the signal is carried out if necessary (S4205).

More specifically, there is employed a structure in which bonding portions of the bond fingers are arranged adjacently to the vertical train of the BGAs.

By changing the arrangement of three bonding portions in these groups in a correction as described above, consequently, it is possible to easily carry out the correction.

Figure 43:
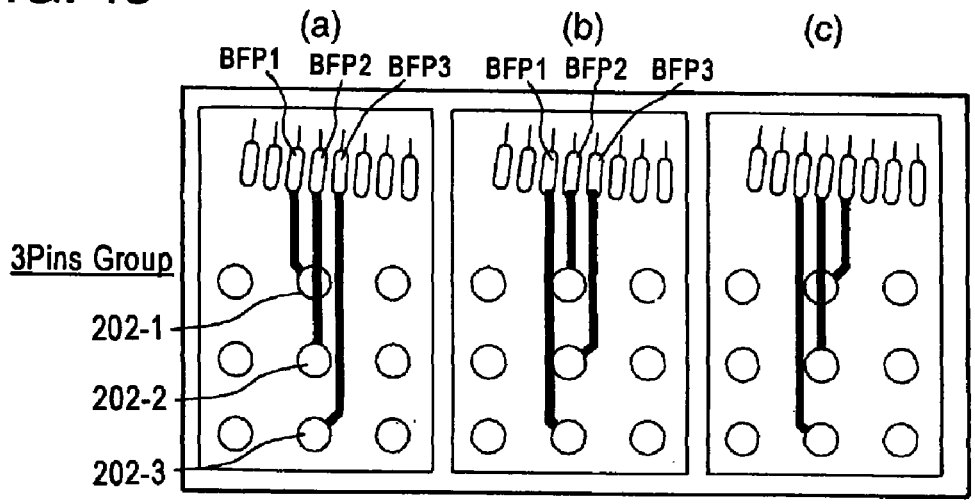
FIG. 43 is an explanatory view showing the method of designing a package according to the tenth embodiment of the invention.

In other words, in the case in which bond fingers BFs 1, 2 and 3 formed by the surface layer wiring of the package substrate and balls 202-1, 2 and 3 formed by the lowermost layer wiring of the package substrate are sequentially connected to each other as shown in FIG. 43(*a*), it is possible to carry out the correction to connect the bond fingers BFs 1, 2 and 3 to the balls 202-3, 1 and 2 formed by the lowermost layer wiring of the package substrate by only changing a wiring corresponding to the finger as shown in FIG. 43(*b*).

In the case in which the bond fingers BFs 1, 2 and 3 formed by the surface layer wiring of the package substrate and the balls 202-1, 2 and 3 formed by the lowermost layer wiring of the package substrate are sequentially connected to each other as shown in FIG. 43(*a*), moreover, it is possible to carry out the correction in order to connect the bond fingers BFs 1, 2 and 3 and the balls 202-3, 2 and 1 formed by the lowermost layer wiring of the package substrate to each other by only changing the wiring corresponding to the finger so as to be inverted as shown in FIG. 43(*c*).

Thus, it is possible to easily carry out a correction and a change by performing grouping for each bond finger having three fingers. Accordingly, an automatic wiring can also be carried out easily. In the case in which a connection between the groups is to be executed, a countermeasure can also be taken by utilizing another layer to carry out the wiring or swapping an input/output terminal of the LSI.

More specifically, in a package substrate of a BGA type, a lowermost layer wiring constitutes a ball to be an external connecting terminal, and a surface layer wiring is provided with a bond finger including a bond portion formed like a band along a peripheral edge of the semiconductor integrated circuit and a finger portion extended to a position placed just above the external connecting terminal to be connected from the bond portion. A tip of the bond finger is connected to a corresponding external connecting terminal through a via and three tips are grouped. By regulating the arrangement of the finger for the bond portion, consequently, it is possible to swap an output terminal well.

Eleventh Embodiment

Next, description will be given to an eleventh embodiment according to the invention.

Figure 44:
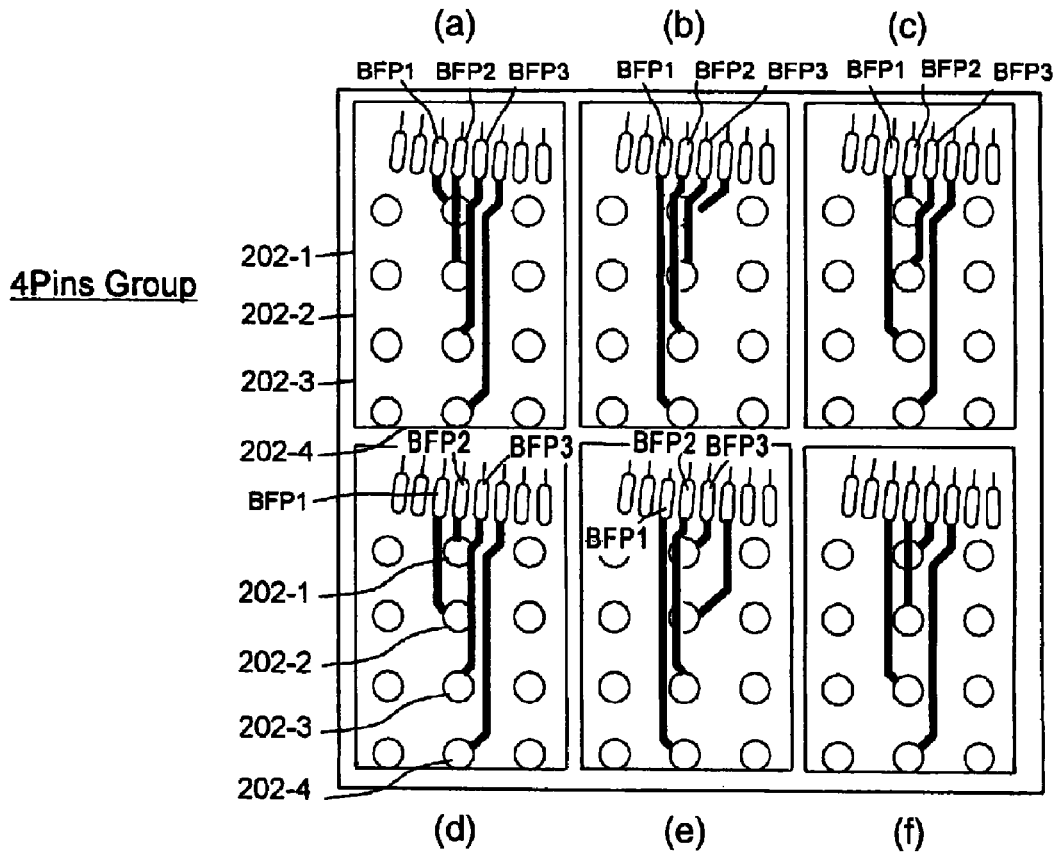
FIG. 44 is an explanatory view showing a method of designing a package according to an eleventh embodiment of the invention.

In the embodiment, description will be given to a swap of a signal in the case in which grouping is carried out every four signals as shown in FIG. 44.

In the embodiment, in the case in which bond fingers BFs 1, 2, 3 and 4 formed by a surface layer wiring of a package substrate and balls 202-1, 2, 3 and 4 formed by a lowermost layer wiring of the package substrate are sequentially connected to each other as shown in FIG. 44(*a*), it is possible to carry out a correction to connect the bond fingers BFs 1, 2, 3 and 4 to the balls 202-3, 1, 2 and 4 formed by the lowermost layer wiring of the package substrate by only changing a wiring corresponding to the finger as shown in FIG. 44(*b*).

In the case in which the bond fingers BFs 1, 2, 3 and 4 formed by the surface layer wiring of the package substrate and the balls 202-1, 2, 3 and 4 formed by the lowermost layer wiring of the package substrate are sequentially connected to each other as shown in FIG. 44(*a*), moreover, it is also possible to carry out a correction to connect the bond fingers BFs 1, 2, 3 and 4 and the balls 202-3, 1 2 and 4 formed by the lowermost layer wiring of the package substrate by only changing the wiring corresponding to the finger so as to invert three fingers in the same manner as in the tenth embodiment as shown in FIG. 44(*c*).

FIGS. 44(*d*) to 44(*f*) are the same.

Thus, it is possible to easily carry out the correction and change by performing grouping for each bond finger having four fingers. Accordingly, an automatic wiring can also be carried out easily. In the case in which the connection between the groups is executed, it is preferable to utilize another layer to carry out a wiring or to swap an input/output terminal of an LSI.

Twelfth Embodiment

Next, description will be given to a twelfth embodiment according to the invention.

Figure 45:
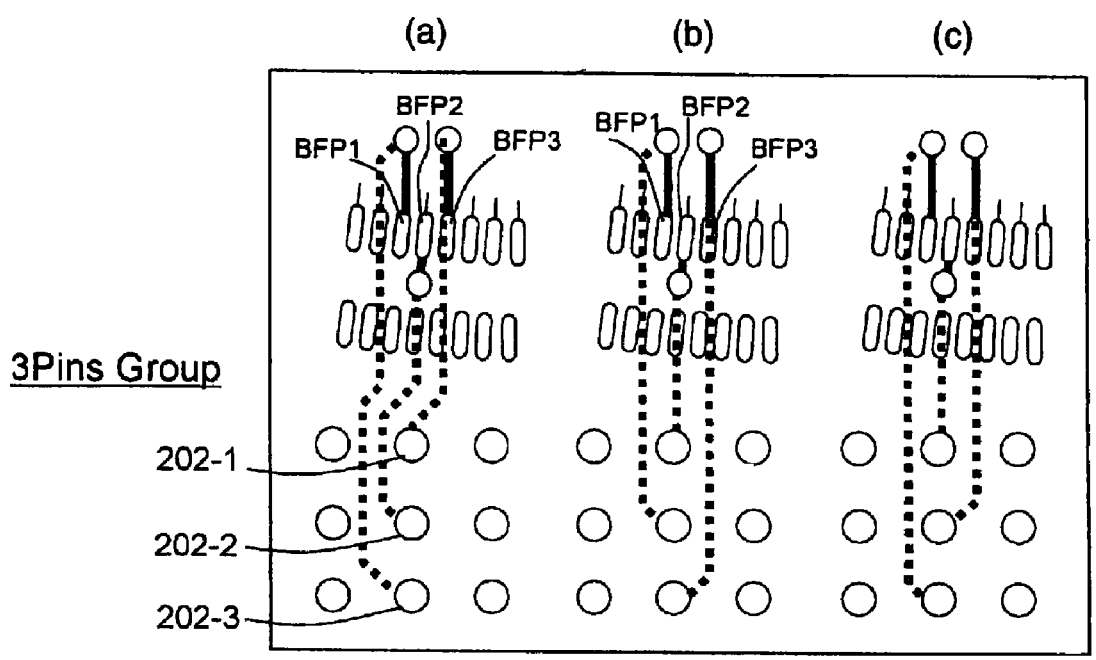
FIG. 45 is an explanatory view showing a method of designing a package according to a twelfth embodiment of the invention.

In the embodiment, as shown in FIGS. 45(*a*) to 45(*c*), there is employed a structure in which bond fingers BFs 11, 12 and 13 on an inside are completed with a lowermost layer wiring to be the same layer as a ball and are connected to three trains of balls by using a surface layer wiring.

Since the embodiment is the same as the embodiments 10 and 11 in principle, description will be omitted. By carrying out grouping with a relationship of three trains of bond fingers and three vertical trains of balls, it is possible to carry out a physical connection even if a net is swapped in each group.

More specifically, according to the structure, a signal group is divided corresponding to an arrangement of an external connecting terminal (a ball) and a bonding pad of a bond finger and input/output terminals of a semiconductor integrated circuit chip to be connected thereto for each group are arranged. Therefore, it is possible to easily carry out a swap by only changing an extending destination of the finger.

Thirteenth Embodiment

Next, description will be given to a thirteenth embodiment according to the invention.

Figure 46:
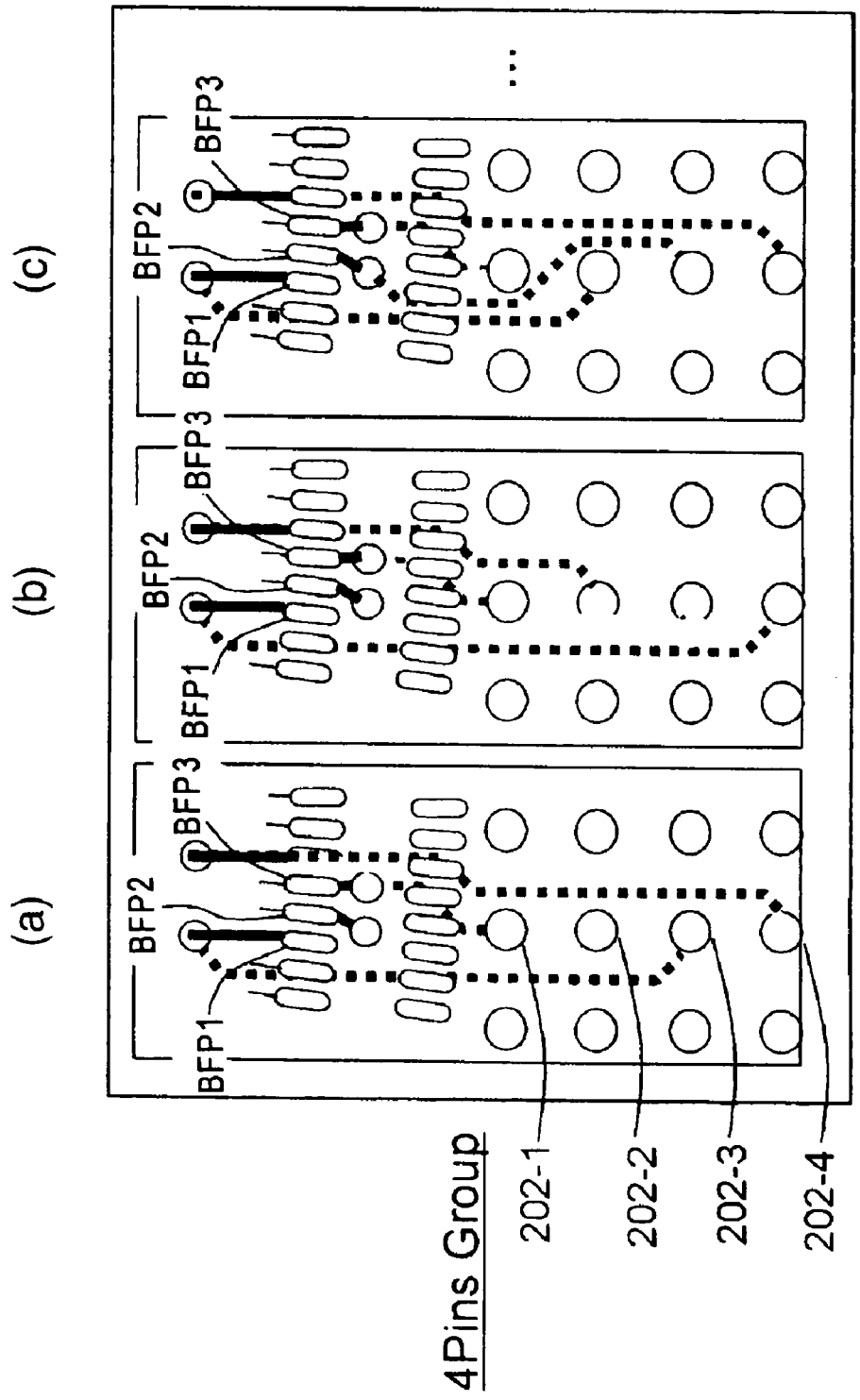
FIG. 46 is an explanatory view showing a method of designing a package according to a thirteenth embodiment of the invention.

In the embodiment, as shown in FIGS. 46(a) to 46(c), there is employed a structure in which bond fingers BFs 11, 12, 13 and 14 on an inside are completed with a lowermost layer wiring to be the same layer as a ball and are connected to four trains of balls by using a surface layer wiring.

By carrying out grouping with a relationship of four trains of bond fingers which are transversely adjacent to each other and four vertical adjacent trains of balls, it is possible to carry out a physical connection even if a net is swapped in each group.

According to the structure, a lowermost layer wiring is used so that a degree of freedom of a wiring can be increased and a swap can easily be carried out.

Fourteenth Embodiment

Next, description will be given to a fourteenth embodiment according to the invention.

In the embodiment, description will be given to a swap on an outside of a group with reference to FIGS. 47(a) to 47(c).

Referring to a bond finger BF and a ball 202, if the bond finger BF which is adjacent in a transverse direction and a vertical train of balls are grouped and a wiring region 211 for each group can be defined as shown, it is possible to previously investigate the swap of the ball.

Figure 47:
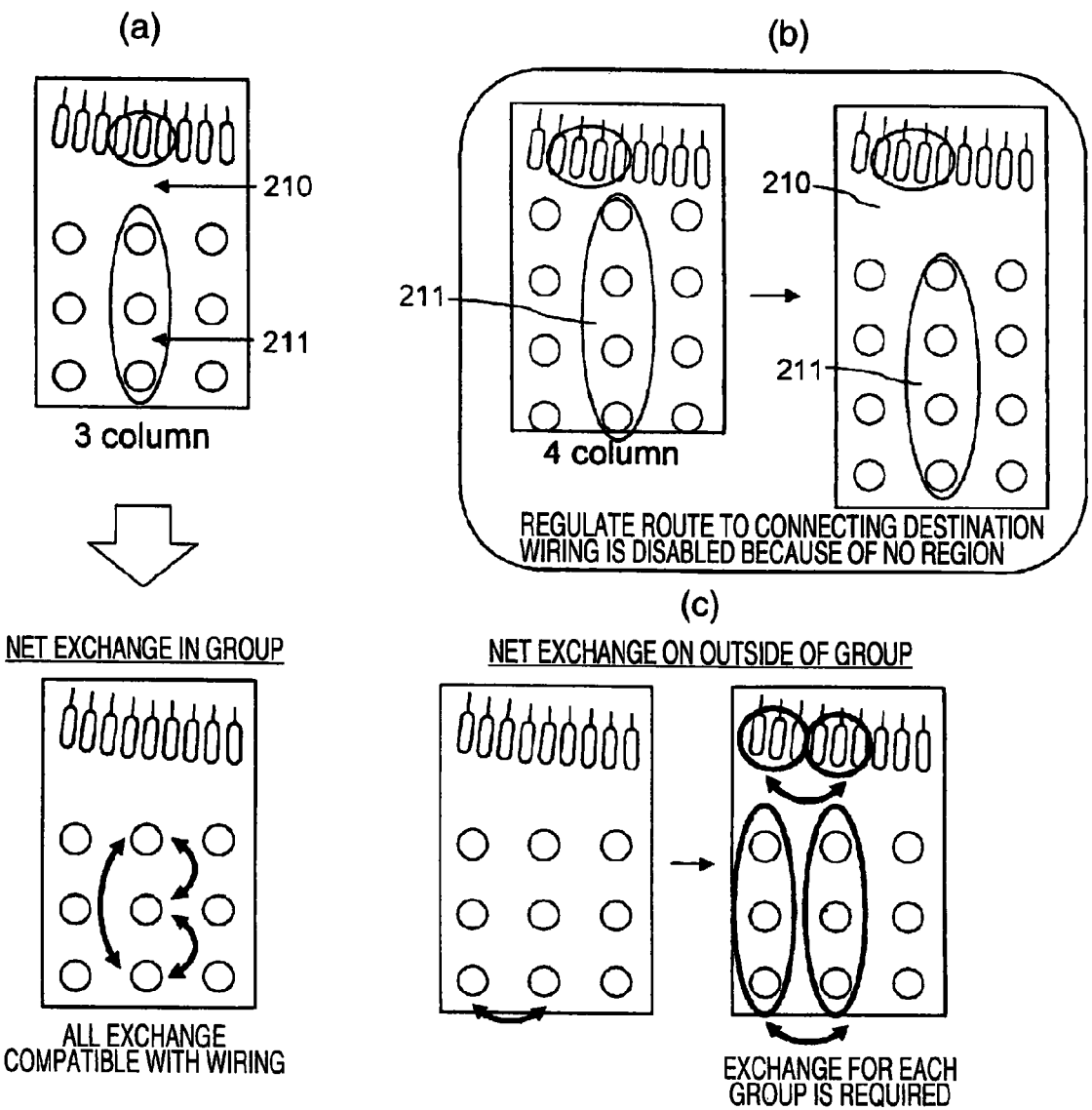
FIG. 47 is an explanatory view showing a method of designing a package according to a fourteenth embodiment of the invention.

As shown in FIGS. 47(a) and 47(b), a connecting destination route regulating region 210 is disposed so that a wiring can be bent and a swap between the groups can be carried out.

Moreover, it is hard to carry out a net exchange on the outside of the group as shown in FIG. 47(c).

By using a part of a power plane, furthermore, it is possible to carry out the swap.

In case of a bond finger on an inside, moreover, it is possible to utilize a surface layer wiring and a lowermost layer wiring. In some cases, therefore, the swap can be carried out.

Fifteenth Embodiment

Next, description will be given to a fifteenth embodiment according to the invention.

A design of an LSI will be described below.

In the embodiment, in the design of the LSI, there are provided a step of determining an input/output pad arrangement by setting, as input data, a result of a design obtained at a step of designing a semiconductor integrated circuit mounting substrate, a step of then carrying out a modification in consideration of an internal condition of the LSI, and a correcting step of correcting the input/output pad arrangement by setting, as input data, an output at the step of carrying out a modification.

Figure 48:
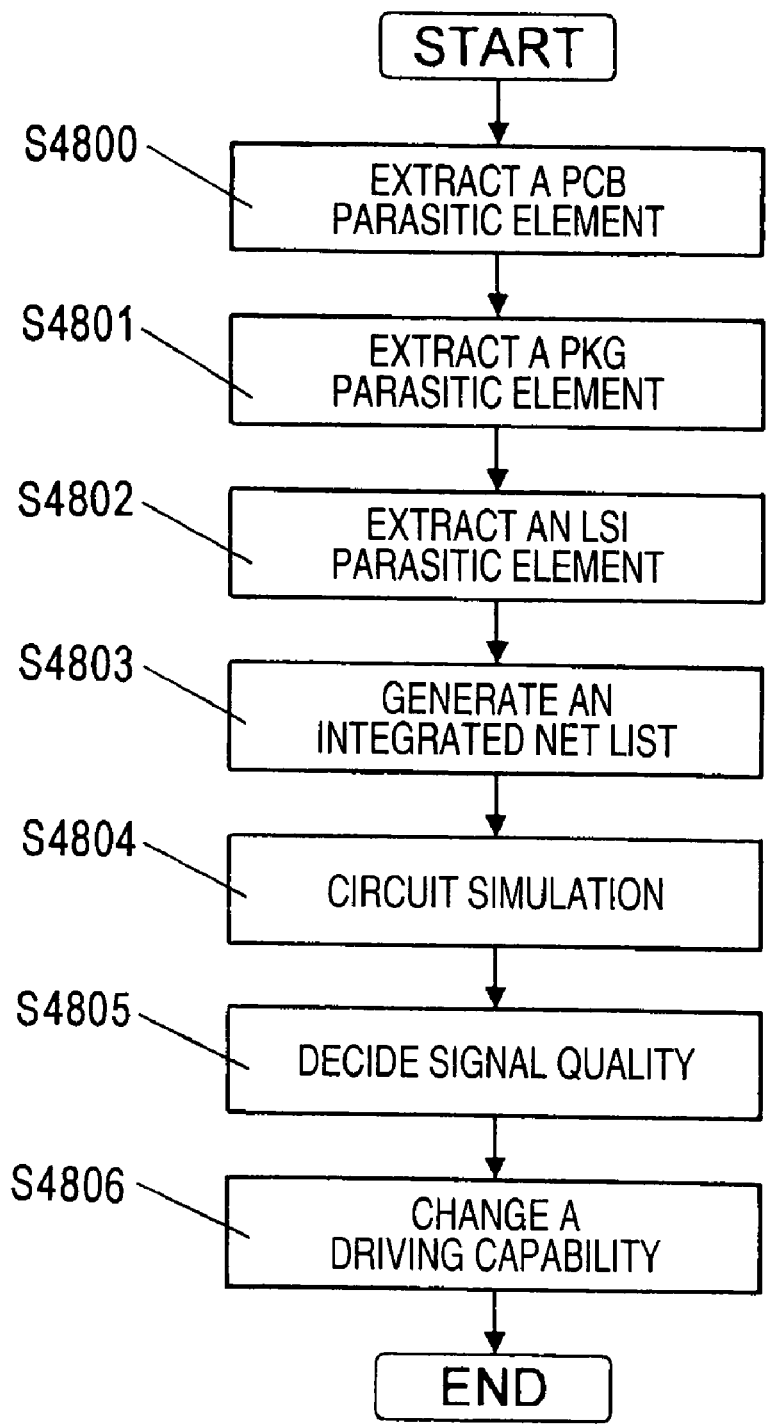
FIG. 48 is an explanatory diagram showing a method of designing an LSI according to a fifteenth embodiment of the invention.

FIG. 48 is a flowchart showing a method of designing the LSI.

Herein, input data are PCB driven designed data. At a "PCB parasitic element extracting step" S4800, the PCB design data are set as input information to extract parasitic passive elements such as inductance L, resistance R, capacitance C and mutual inductance K of a PCB wiring and a component such as a discrete or a memory.

At a "PKG parasitic element extracting step" S4801, package (PKG) design data are set as an input to extract a PKG wiring and LRCK of a bonding wire (in case of a wire bonding type).

At an "LSI parasitic element extracting step" S4802, then, an IO cell, a pad, a decoupling capacitive cell are extracted and LRCK of a power network for supplying a power to the IO cell is extracted.

At an "integrated net list generating step" S4803, furthermore, information extracted at the PCB/PKG/LSI parasitic element extracting step is set as an input to connect the PCB and the PKG, and the PKG and the LSI to each other. At the same time, terminal setting, an input signal waveform and a signal measuring point for an enable signal of the IO cell are specified. The signal measuring point specifies to measure an output terminal of the IO cell, a BALL of the PKG and a signal waveform in a component on the PCB. The connected and set information are created in an SPICE net list format. Moreover, the IO cell may take a case of designation with an SPICE subcircuit or a designating method with an input/output buffer information specification (IBIS).

At a "circuit simulation step" S4804, a circuit simulation is carried out by using a circuit simulator such as an HSPICE or an SPECTRE and a signal waveform is measured.

At a "signal quality deciding step" S4805, referring to a waveform on the signal measuring point, a voltage level, a skew between signals, an over/undershoot height, and a ringing width are then calculated and it is decided whether predetermined specifications are satisfied respectively or not. If the specifications are not satisfied, setting for changing a driving capability of the IO cell is added to the net list created in the "integrated net list generating step" S4803 at a "driving capability changing step" S4806, and the processing returns to the "circuit simulation step" S4804 again.

As described above, in case of the PCB driven design, a wiring and a component on the outside of the LSI are determined in the LSI designing stage. Therefore, it is possible to determine a driving capability of the IO cell of the LSI correspondingly. As a result, the quality of a signal of the LSI, the PKG and the PCB can wholly satisfy the specifications in the designing stage. Consequently, it is possible to enhance quality and to reduce a future correction man-hour.

Figure 49:
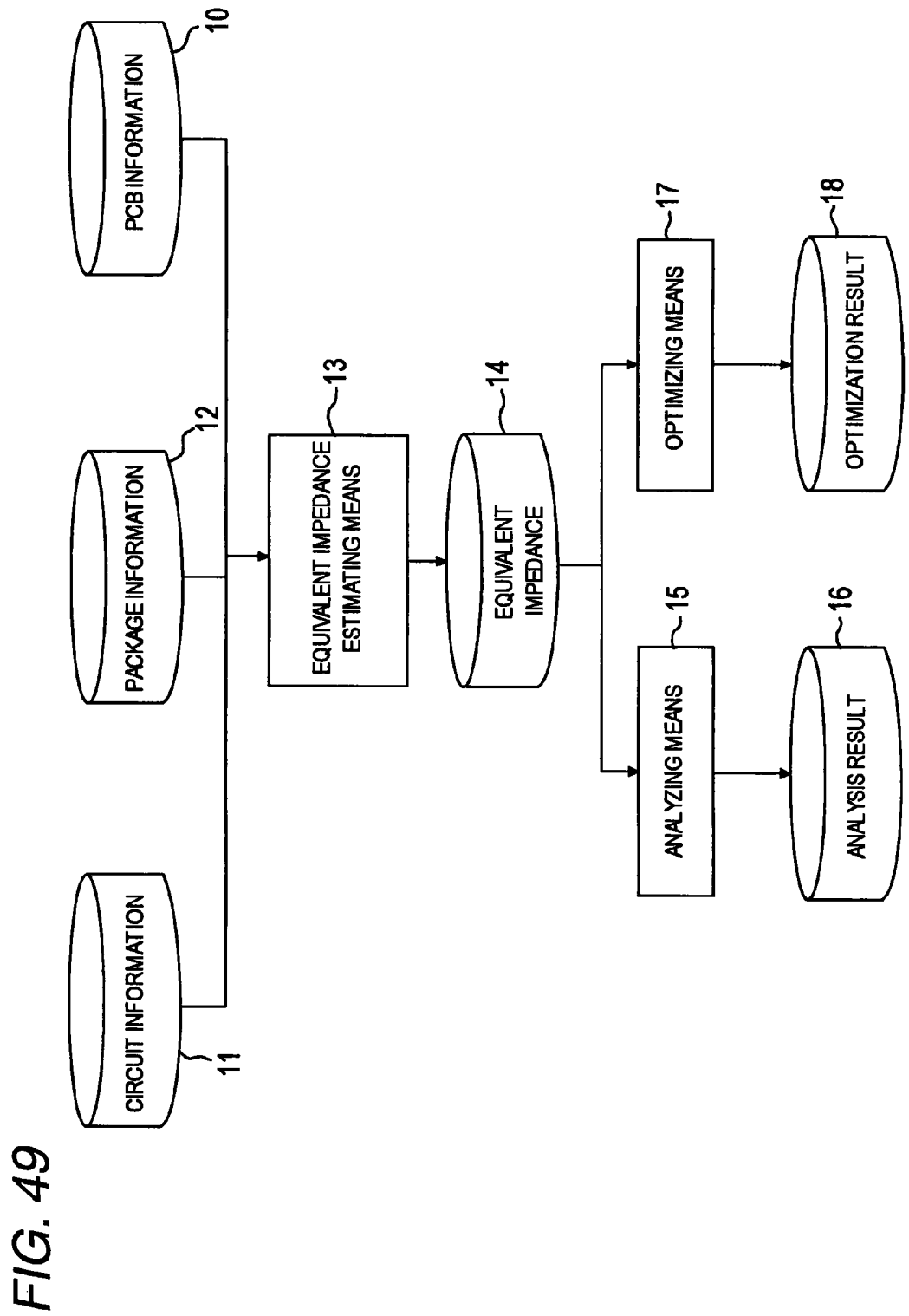
FIG. 49 is a diagram showing an apparatus for designing an LSI according to the fifteenth embodiment of the invention.

The flowchart is executed by using an analyzing apparatus shown in FIG. 49. The analyzing apparatus comprises equivalent impedance information estimating means 13 for calculating and estimating equivalent impedance information based on semiconductor integrated circuit mounting substrate (PCB) information 10, circuit information 11 of the LSI, and package information 12 of the LSI chip, and analyzing means 15 for calculating and analyzing an unnecessary radiant noise and a heat characteristic based on equivalent impedance information 14, and serves to output an analysis result 16. There is provided optimizing means 17 for optimizing an unnecessary radiant noise and a heat characteristic based on the equivalent impedance information 14 obtained by the equivalent impedance information estimating means 13, and an optimization is carried out by the optimizing means 17 and a layout design is carried out based on an optimization result 18 which is obtained.

The equivalent impedance information estimating means 13 is constituted to extract LRCK of a PCB wiring and a component such as a discrete or a memory, and furthermore, to extract a chip area from the circuit information 11 which is extracted, a position of a power pad, a width, a length and a material of a power wiring from power information, and a type of a package from package information. From these information, it is possible to obtain R, L and C information shown in FIG. 50.

The analyzing apparatus can be executed based on the circuit information in a floor plan stage.

Next, description will be given to a method for executing an unnecessary radiation and a thermal analysis by using the analyzing apparatus, thereby generating an integrated net list.

Figure 50:
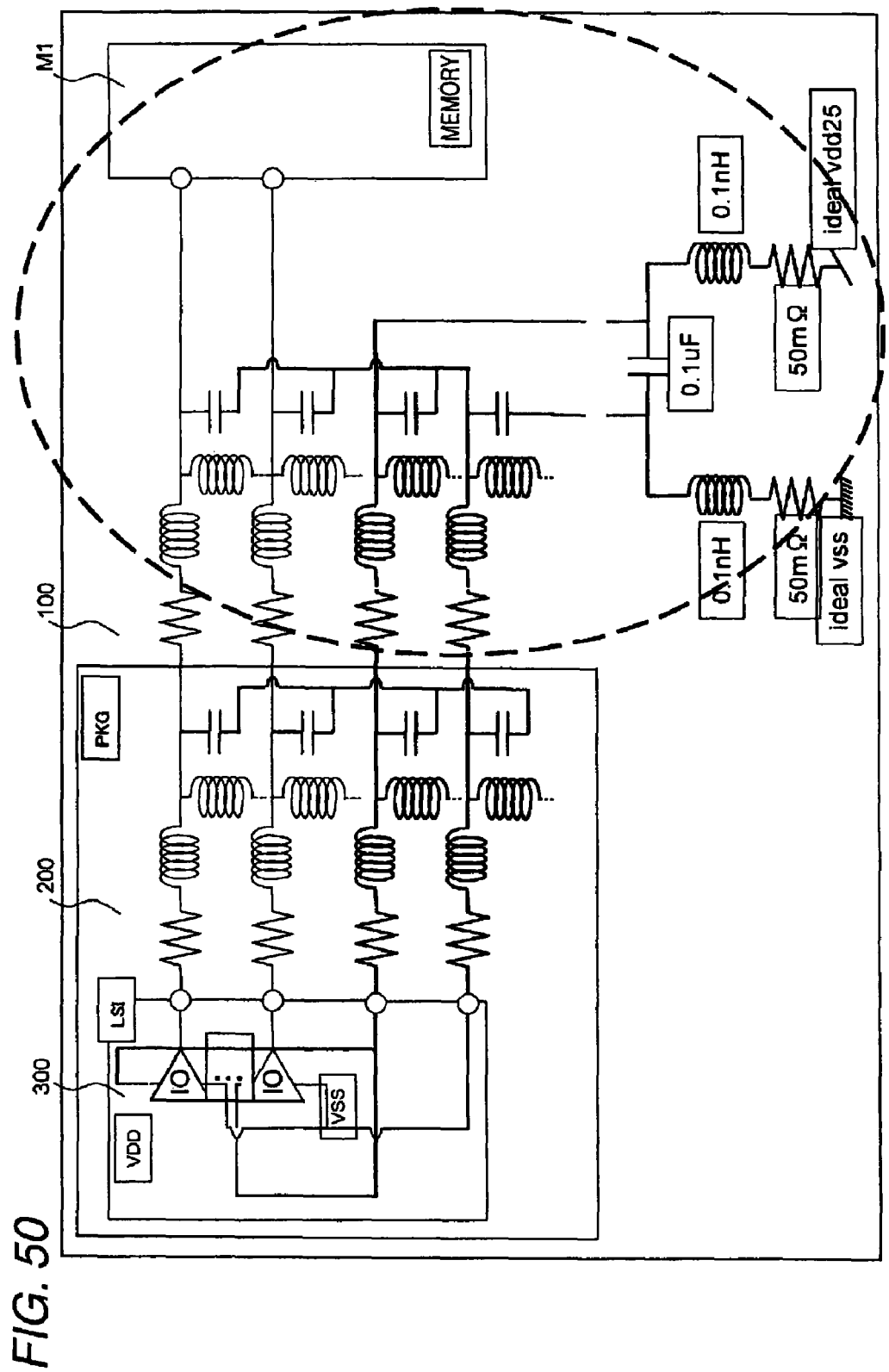
FIG. 50 is an explanatory diagram (a net list) showing a method of designing an LSI according to the fifteenth embodiment of the invention.

First of all, a functional design is carried out and a logical design is then performed in the floorplan stage. In that stage, a chip area is determined and a width, a length and a material of a power wiring are obtained from power information, and furthermore, a position of a power pad is obtained from the package information 12 as shown in FIG. 49, and a resistance R, a capacity C and an inductance L of a connecting portion are estimated to obtain an equivalent impedance from these values in the equivalent impedance estimating means 13 as shown in FIG. 50.

When the chip area is determined, the resistance R is decided. When a component arrangement on the semiconductor integrated circuit mounting substrate, a package and a position of the power pad are determined, a length of a lead is decided so that an inductance is determined. For a method of estimating the resistance or the inductance, various methods have been proposed. By simply multiplying a chip area with a coefficient, however, it is possible to calculate an approximate resistance value.

Since an approximate area of a power supply is determined from the chip area, a capacity between the power supplies is estimated. When the chip area is determined, moreover, the number of transistors is estimated so that a gate capacity is also estimated. When an occupation area of the transistor is estimated from the chip area and the number of the transistors, a wiring capacity is estimated.

Thus, an equivalent impedance is estimated. Therefore, it is possible to reduce an amount of a calculation. Thus, it is possible to execute an analysis at a high speed with a high precision and reliability.

Based on the analysis result 16 thus obtained, an EMI noise and a heat characteristic are optimized by the optimizing means 17. Thus, optimum RCL information is obtained.

Thus, the integrated net list shown in FIG. 50 is generated and the circuit simulation is carried out based thereon (S4804).

Subsequent steps have been described above.

At the "signal quality deciding step" S4805, it is decided whether a predetermined specification is satisfied for a signal waveform thus calculated or not. In the case in which a waveform is obtained on the signal measuring point as shown in FIGS. 51(a) and 51(b), it is decided whether a predetermined specification is satisfied for a voltage level, a skew between signals, an over/undershoot height, and a ringing width or not. As an example of the specification, an overshoot height t1 is set to be equal to or smaller than 50 mV, the ringing width is set to be 0 or be equal to or smaller than 50 mV around VDD, the voltage level is set to be 0.8 VDD to VDD, and a skew t4 is set to be 100 ps. In the case in which these specifications are not satisfied, setting of a change in the driving capability of the IO cell is added to the net list created at the "integrated net list generating step" S4803, and the processing returns to the "circuit simulation step" S4804.

Sixteenth Embodiment

Next, description will be given to a sixteenth embodiment according to the invention.

Figure 52:
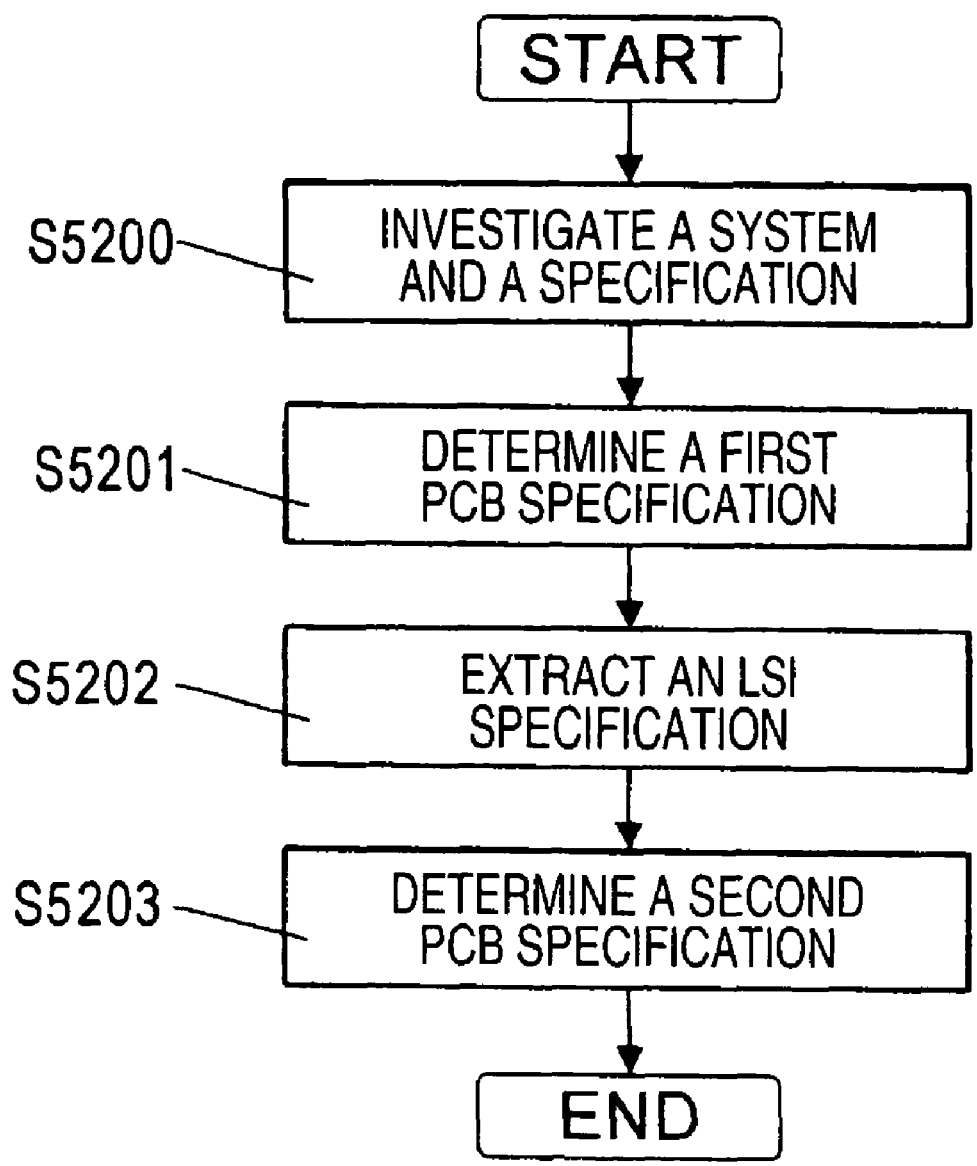
FIG. 52 is a flowchart showing a method of designing an LSI according to a sixteenth embodiment of the invention.

Description will also be given to a design of an LSI. FIG. 52 is a flowchart showing a designing method and FIG. 53 is an explanatory view showing the same.

The embodiment is characterized in that a PKG and the LSI are designed based on an ideal PCB specification and an ideal set (=PCB+PKG+LSI) is completed in total. However, in the case in which a memory IF is actually given as a hard macro in the LSI, for example, there is a restriction that a terminal position of the memory interface (IF) cannot be changed. For this reason, it is necessary to previously take the circumstances of an LSI 300 into consideration in the investigation of the specification of a PCB 100 because it is supposed to meet with great difficulties, for example, a wiring between memories M1/M2 on the memory interface (IF) and the PCB cannot be carried out in the future. Accordingly, the flowchart for the processing shows a flow for determining the PCB specification which can be actually implemented while aiming at the ideal PCB specification.

At a "system and specification investigating step" S5200, specifications of a product, for example, a function and a memory capacity are determined. At a "first PCB specification determining step" S5201, an ideal PCB specification capable of implementing the specification determined at the "system and specification investigating step" S5200 is determined. The ideal PCB specification implies a specification in which a component can be arranged and a wiring can be provided in such a manner that a PCB area and the number of layers can be minimized. In the ideal PCB specification, moreover, a noise sensitive component is not disposed close to a noise generating source in consideration of an electric/noise characteristic.

At an "LSI specification extracting step" S5202, next, a restriction to be observed in an LSI designing stage is extracted.

Figure 53A:
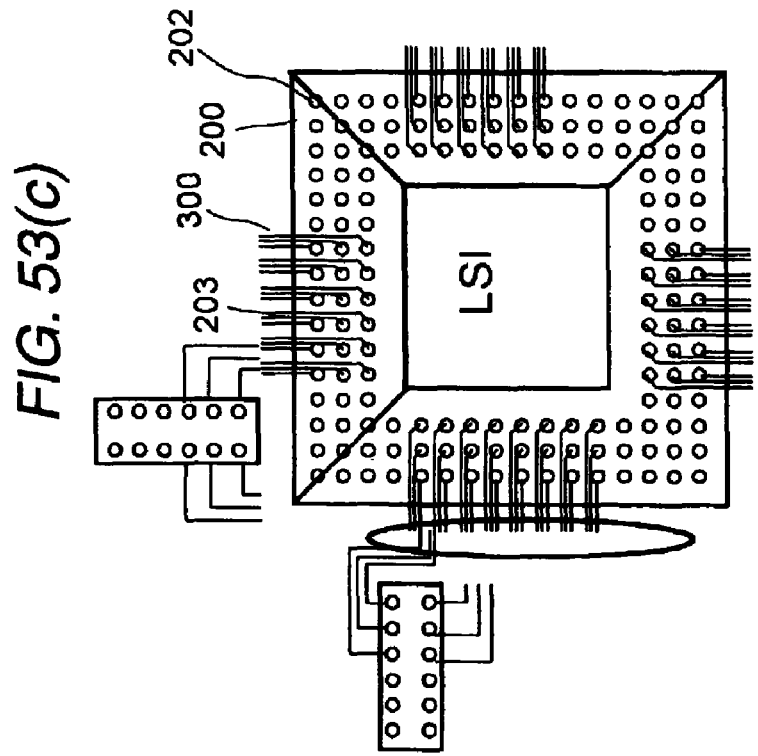
FIG. 53 is an explanatory view showing the method of designing an LSI according to the sixteenth embodiment of the invention.
Figure 53C:
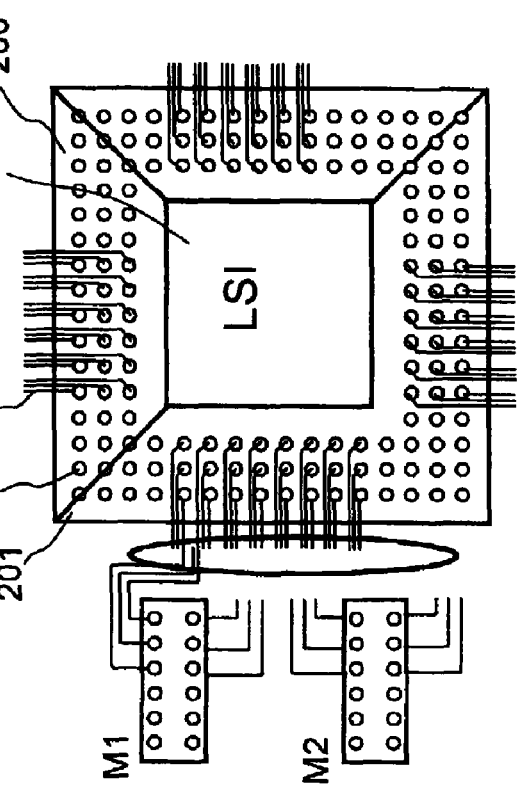
Figure 53B:
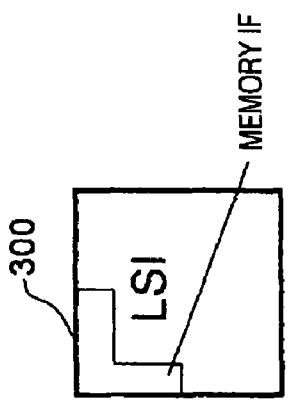

In the case in which there is a memory IF which cannot be included in one side of the LSI, and furthermore, the memory IF is present as a hard macro as shown in FIG. 53(b), a wiring can be provided more easily with an arrangement in a position making a pair with the memory IF as shown in FIG. 53(c) than an arrangement of memories M1/M2 shown in FIG. 53(a) in order to implement the memories M1/M2 on a PCB and a wiring of the memory IF. In case of the arrangement shown in FIG. 53(a), components other than the memory are arranged in the vicinity of an upper side of the LSI 300. Consequently, it is supposed that a wiring for these components is also hard in addition to the wiring of the memory. Accordingly, it is necessary to investigate the PCB specification taking the LSI specification into consideration.

At a "second PCB specification determining step" S5203, a PCB specification output at the "first PCB specification determining step" S5201 is added to a specification extracted at the "LSI specification extracting step" S5202 to carry out a change into an ideal PCB specification as shown in FIG. 53(c). In the PCB specification, the LSI specification is also taken into consideration. By carrying out a design in order of. PCB→PKG→LSI, therefore, it is possible to carry out a design which can satisfy everything.

As described above, in a PCB driven design, there is a high possibility that an impossibility might be generated in the LSI design if the specifications of the PKG and the LSI are disregarded and an ideal PCB specification is pursued. In the PCB specification design, the specification is determined in consideration of a restriction which is to be absolutely observed in the LSI. Consequently, it is possible to implement a design satisfying the respective specifications in order of PCB→PKG→LSI at a time.

Seventeenth Embodiment

Next, description will be given to a seventeenth embodiment according to the invention.

Description will be given to a design of an LSI using package PKG information.

In the embodiment, there are provided a step of determining an input/output pad arrangement by setting package information as input data in the design of the LSI, a step of then carrying out a modification in consideration of an internal condition of the LSI, and a step of correcting the input/output pad arrangement to carry out an optimization by setting, as input data, an output at the step of carrying out a modification.

Figure 54:
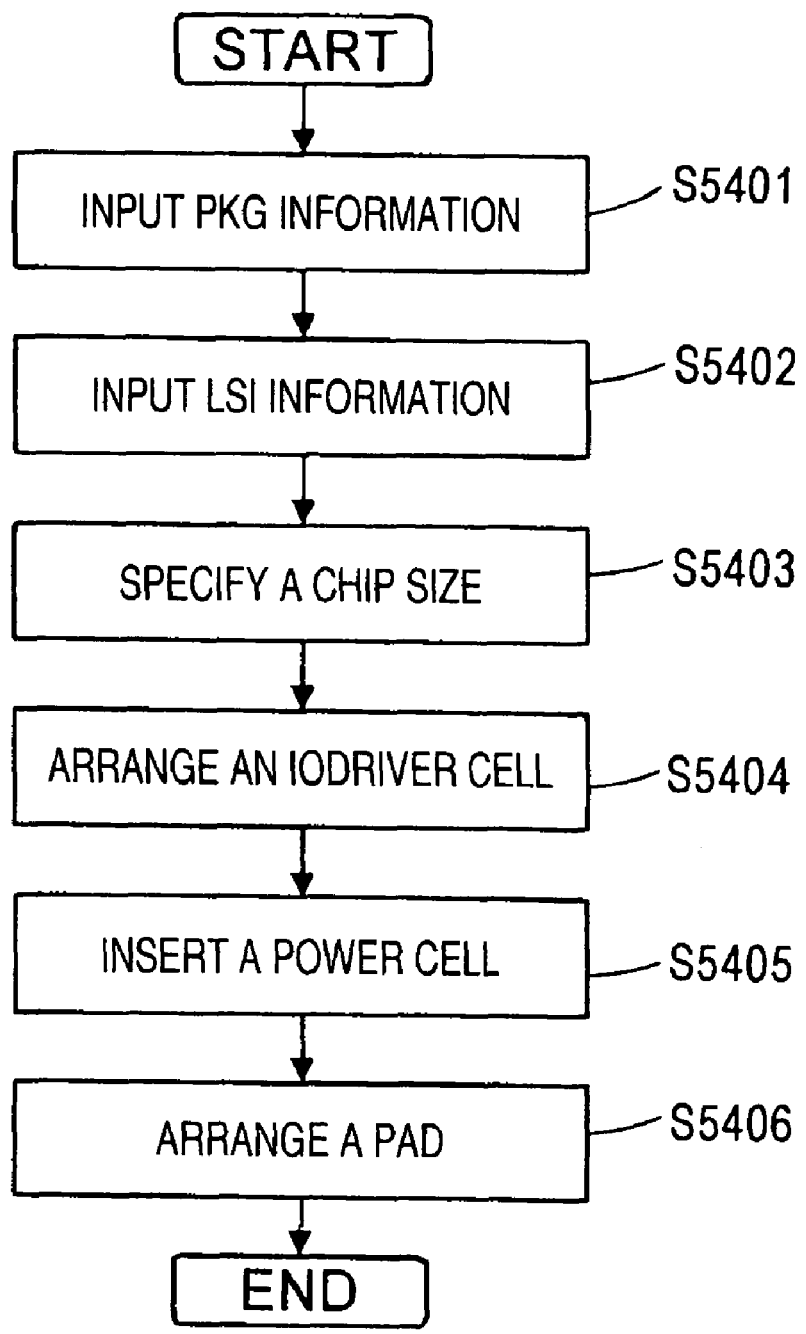
FIG. 54 is a flowchart showing a method of designing an LSI according to a seventeenth embodiment of the invention.
Figure 56:
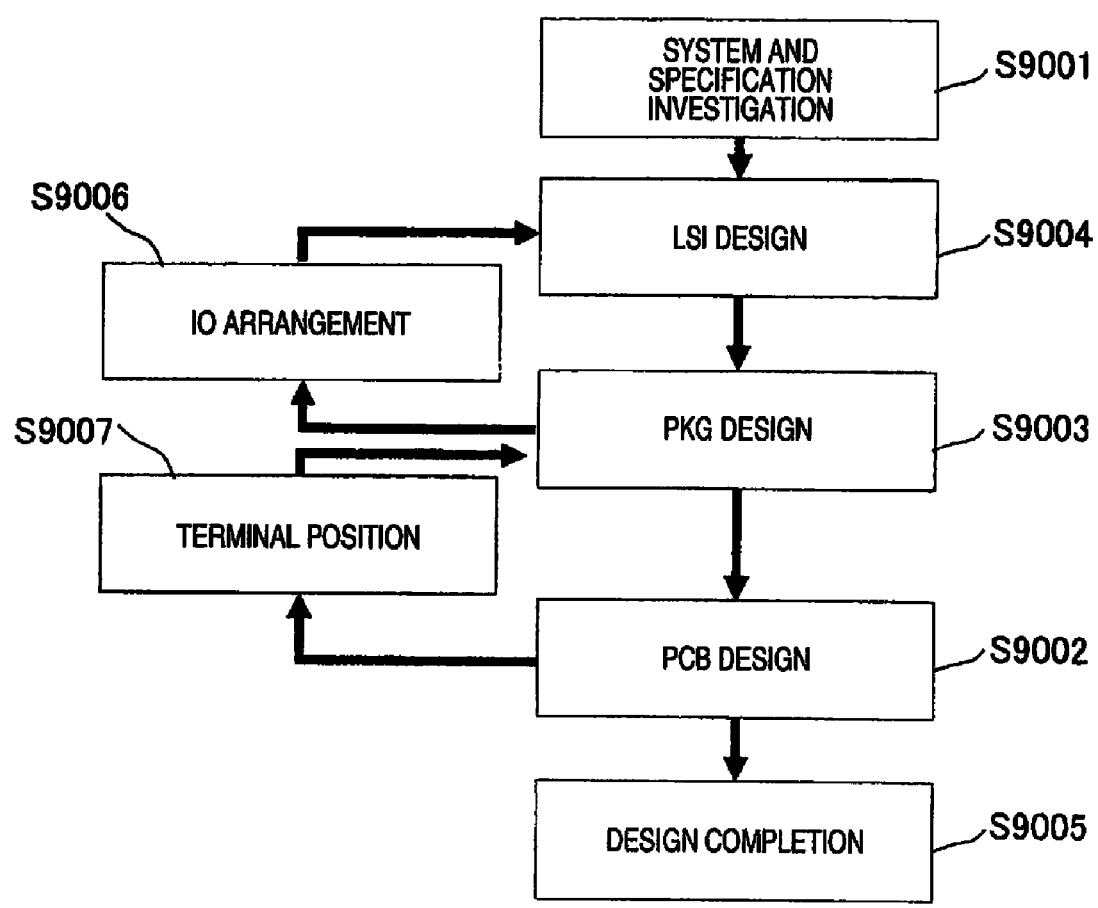
FIG. 56 is a flowchart showing a method of designing a semiconductor integrated circuit system according to a conventional example.

As shown in a flowchart of FIG. 54 and an explanatory view of FIG. 55, in the embodiment, an IO position of an LSI is optimized by using PKG information.

The embodiment is constituted by a step S5401 of inputting package information such as a ball position of a package 200 and a net name assigned to a ball, a step S5402 of inputting a net list and a physical library of a cell, a step S5403 of specifying a chip size of an LSI 300, a step S5404 of arranging an IDriver cell in consideration of a ball position of a package, a step S5405 of inserting a power cell in consideration of a position of an IODriver cell arranged at the step described above, and a step S5406 of arranging a PAD in such a manner that a chip size is reduced after the IODriver cell and the power cell are arranged.

FIG. 55(a) shows package information used in the embodiment. In the drawing, a net has already been assigned to a ball 202 in accordance with a restriction imposed from a PCB 100 side. Next, information on the LSI side (the net list and the physical library) are input and a size of the LSI to be a target is set as shown in FIG. 55(b). At this time, the IODriver is not arranged. However, coupled information on the package 200 side and the LSI 300 side are built as the net list information.

Next, the IODriver cell is arranged in accordance with the net assigned to the ball 202 of the package 200 in FIG. 55(c). As a method of arranging the IODriver, a net length from the ball 202 to the IODriver cell is minimized and the respective nets are prevented from crossing each other.

Next, a necessary power cell for the arranged IODriver is inserted in FIG. 55(d). In FIG. 55(e), then, a PAD cell is given to the IODriver cell and the power cell which are arranged.

By using the method, the arrangement of the IODriver and the PAD cell is obtained in accordance with a restriction imposed on the package side. Therefore, it is possible to obtain a package wiring having an excellent electrical characteristic with a torsion. As described above, moreover, the ball position of the package is determined in accordance with the restriction on the PCB side. By arranging the IODriver and a PAD cell 306 in accordance with the restriction on the package side, therefore, it is possible to carry out an IODriver cell and PAD cell arrangement on the LSI side which is optimum for a PCB component arrangement.

Thus, it is also possible to carry out an optimization.

The package has been described as the package substrate. In some cases, furthermore, this is sealed with a resin. In some cases in which the resin sealing is carried out, however, it is necessary to take a dielectric constant of the resin into consideration in the optimization.

According to the invention, it is possible to carry out a design with a high precision at a high speed by performing a design of a package to a design of an LSI, that is, from a downstream side to an upstream side based on information about a semiconductor integrated circuit mounting substrate. Consequently, the invention can be applied to various products including a communicating apparatus such as a cell phone, general household articles, toys and cars.

What is claimed is:

1. A method of designing a package substrate, comprising steps of:
    inputting, to an apparatus for designing a package substrate, design data of a mounting substrate to which a semiconductor integrated circuit is connected;
    designing, at the apparatus, a package substrate of the semiconductor integrated circuit on the basis of inputted design data of the mounting substrate; and
    outputting design data of the designed package substrate.

2. The method of designing a package substrate according to claim 1, wherein the step of designing a package substrate comprises the step of carrying out a design in such a manner that a wiring constituting a signal group corresponding to a component is arranged in a region divided depending on a position on the semiconductor integrated circuit mounting substrate in which the component is disposed.

3. The method of designing a package substrate according to claim 2, wherein the step of designing a package substrate comprises a step of dividing a power plane into a plurality of regions for each power unit in order to correspond to a power division on the mounting substrate.

4. The method of designing a package substrate according to claim 3, wherein the step of designing a package substrate comprises the step of connecting, to the power plane, any of a plurality of conductor layers which is positioned on a surface layer mounting the semiconductor integrated circuit chip in such a manner that the conductor layer includes a power ring and a wiring in the package substrate does not have an intersecting region through the power ring.

5. The method of designing a package substrate according to claim 3, wherein the step of designing a package substrate comprises the step of carrying out a design in such a manner that a wiring in the package substrate does not have an intersecting region based on a position in which a peripheral component of the semiconductor integrated circuit.

6. The method of designing a package substrate according to claim 2, wherein the step of designing a package substrate comprises the step of carrying out a design in order to divide a plane of the package substrate into N regions and to complete a signal wiring for each of the regions.

7. The method of designing a package substrate according to claim 6, wherein the N is four.

8. The method of designing a package substrate according to claim 6, wherein the N is eight.

9. The method of designing a package substrate according to claim 6, wherein the step of designing a package substrate comprises the step of carrying out a design in such a manner that grouping is performed corresponding to an array of the external connecting terminal of the package substrate and a signal wiring is adjacent every group.

10. The method of designing a package substrate according to claim 9, wherein the step of designing a package substrate comprises the step of carrying out a design in such a manner that a line of the external connecting terminal is connected to an adjacent input/output pad of the semiconductor integrated circuit to be loaded on the package substrate.

11. The method of designing a package substrate according to claim 6, comprising the step of carrying out a design in such a manner that the package substrate includes at least three conductor layers of a surface layer wiring, a power plane layer and a lowermost layer wiring, and the surface layer wiring and the lowermost layer wiring have a formation prohibiting region.

12. The method of designing a package substrate according to claim 11, wherein the formation prohibiting region is a region having a predetermined width from an end in the divided region.

13. The method of designing a package substrate according to claim 2, wherein the step of designing a package substrate comprises the step of carrying out a design in such a manner that an external connecting terminal forming plane, on which an external connecting terminal of the package substrate, which is constituted by a ball grid array, is formed, is divided into N regions, and a signal wiring is completed for each of the regions.

14. The method of designing a package substrate according to claim 13, wherein the step of designing a package substrate comprises the step of carrying out a design in such a manner that the external connecting terminal forming plane is divided into the N regions and the signal wiring is completed for each of the regions corresponding to an arrangement of a component on the semiconductor integrated circuit mounting substrate.

15. An apparatus for designing a package substrate,
wherein design data of a mounting substrate, on which a semiconductor integrated circuit is loaded, is inputted, a package substrate of the semiconductor integrated circuit is designed, on the basis of design data of the mounting substrate, and
design data of the design package substrate is outputted.

16. The apparatus for designing a package substrate according to claim 15, wherein the package substrate of the semiconductor integrated circuit is designed in such a manner that a wiring constituting a signal group corresponding to a component is disposed in a divided region depending on a position on the semiconductor integrated circuit mounting substrate in which the component is arranged.

17. The apparatus for designing a package substrate according to claim 16, wherein the package substrate of the semiconductor integrated circuit is designed, in which the power plane is divided into a plurality of regions every power unit in order to correspond to a power division on the mounting substrate.

18. The apparatus for designing a package substrate according to claim 17, wherein the package substrate of the semiconductor integrated circuit is designed, in which any of a plurality of conductor layers constituting the package substrate which is positioned on a surface layer mounting the semiconductor integrated circuit includes a power ring and a wiring in the package substrate is connected to the power plane through the power ring so as not to have an intersecting region.

19. The apparatus for designing a package substrate according to claim 17, wherein the package substrate of the semiconductor integrated circuit is designed, in such a manner that a wiring in the package substrate does not have an intersecting region based on connecting information from a semiconductor integrated circuit to be a target to a peripheral component of the semiconductor integrated circuit.

20. The apparatus for designing a package substrate according to claim 16, wherein the package substrate of the semiconductor integrated circuit is designed in such a manner that the dividing control portion carries out a design to divide a plane of the package substrate into N regions and to complete a signal wiring for each of the regions.

21. The apparatus for designing a package substrate according to claim 20, wherein the package substrate of the semiconductor integrated circuit is designed in such a manner that an external connecting terminal forming plane, on which an external connecting terminal of the package substrate constituted by a ball grid array, is formed, is divided into N regions and a signal wiring is completed for each of the regions.

22. The apparatus for designing a package substrate according to claim 21, wherein the package substrate of the semiconductor integrated circuit is designed in such a manner the external connecting terminal forming plane is divided into the N regions and to complete the signal wiring is completed for each of the regions corresponding to an arrangement of a component on the semiconductor integrated circuit mounting substrate.

23. The apparatus for designing a package substrate according to claim 21, wherein the package substrate is provided with at least three conductor layers of a surface layer wiring, a power plane layer and a lowermost layer wiring, and
the surface layer wiring and the lowermost layer wiring are provided with a formation prohibiting region.

24. The apparatus for designing a package substrate according to claim 23, wherein the formation prohibiting region is a region having a predetermined width from an end in the divided region.

25. The apparatus for designing a package substrate according to claim 20, wherein the N is four.

26. The apparatus for designing a package substrate according to claim 20, wherein the N is eight.

27. The apparatus for designing a package substrate according to claim 16, wherein the package substrate of the semiconductor is designed in such a manner that grouping is performed corresponding to an array of the external connecting terminal and a signal wiring is adjacent every group.

28. The apparatus for designing a package substrate according to claim 27, wherein the package substrate of the semiconductor is designed in such a manner that a line of the external connecting terminal is connected to an adjacent input/output pad of the semiconductor integrated circuit to be loaded on the package substrate.

29. A package substrate mounting a semiconductor integrated circuit, connected to a semiconductor integrated circuit and constituting a semiconductor integrated circuit system,
wherein the package substrate is provided with a wiring on the package substrate, and the wiring on the package substrate, as a wiring constituting a signal group corresponding to a component is arranged in a region divided depending on a position on the semiconductor integrated circuit mounting substrate in which the component is disposed.

30. The package substrate according to claim 29, wherein the package substrate is provided with at least one power plane, and
the power plane is divided into a plurality of regions for each power unit in order to correspond to a power division on the semiconductor integrated circuit mounting substrate.

31. The package substrate according to claim 29, wherein the package substrate is provided with a plurality of conductor layers, and
a power ring, and
the power ring is arranged on a conductor layer, among the plurality of conductor layers, which is positioned on a surface mounting the semiconductor integrated circuit, and
the package substrate is connected to the power plane through the power ring so as for a wiring in the package substrate not to have an intersection region.

32. The package substrate according to claim 29, wherein the package substrate has such a structure that a wiring in the package substrate does not have an intersecting region based on connecting information from a semiconductor integrated circuit to be a target to a peripheral component of the semiconductor integrated circuit.

33. The package substrate according to claim 29, wherein a plane of the package substrate is divided into N regions and a signal wiring is formed to be completed for each of the regions.

34. The package substrate according to claim 33, wherein the N is four.

35. The package substrate according to claim 33, wherein the N is eight.

36. The package substrate according to claim 29, wherein an external connecting terminal of the package substrate constitutes a ball grid array, and an external connecting terminal forming plane is divided into N regions and a signal wiring is completed for each of the regions.

37. The package substrate according to claim 29, wherein the package substrate is designed in such a manner that grouping is performed corresponding to an array of the external connecting terminal and a signal wiring is adjacent in each of the group.

38. The package substrate according to claim 37, wherein the package substrate is of such a structure that a line of the external connecting terminal is connected to an adjacent input/output pad of the semiconductor integrated circuit to be loaded on the package substrate.

39. The package substrate according to claim 29, wherein the package substrate is provided with at least three conductor layers of a surface layer wiring, a power plane layer and a lowermost layer wiring, and the surface layer wiring and the lowermost layer wiring are formed at regions other than the region having the predetermined width from the end in the divided region.

40. The package substrate according to claim 29, wherein the lowermost layer wiring constitutes a ball to be an external connecting terminal and the surface layer wiring is provided with a bond finger including a bond portion formed like a band along a peripheral edge of the semiconductor integrated circuit and a finger portion extended to a position placed just above the external connecting terminal to be connected from the bond portion, the lowermost layer wiring constitutes a ball as the external connecting terminal, and a tip of the bond finger is connected to the corresponding external connecting terminal through a via.

41. The package substrate according to claim 40, wherein the bond finger is formed in two lines and the external connecting terminal and the semiconductor integrated circuit are connected to each other through a detour using the lowermost layer wiring, and the finger portion is extended in a direction apart from the bond portion.

* * * * *